United States Patent
Derhacobian et al.

(10) Patent No.: US 8,331,128 B1
(45) Date of Patent: Dec. 11, 2012

(54) RECONFIGURABLE MEMORY ARRAYS HAVING PROGRAMMABLE IMPEDANCE ELEMENTS AND CORRESPONDING METHODS

(75) Inventors: Narbeh Derhacobian, Belmont, CA (US); Shane Charles Hollmer, Grass Valley, CA (US)

(73) Assignee: Adesto Technologies Corporation, Sunnyvale, CA (US)

(*) Notice: Subject to any disclaimer, the term of this patent is extended or adjusted under 35 U.S.C. 154(b) by 349 days.

(21) Appl. No.: 12/629,531

(22) Filed: Dec. 2, 2009

Related U.S. Application Data

(60) Provisional application No. 61/200,704, filed on Dec. 2, 2008.

(51) Int. Cl.
  G11C 11/00 (2006.01)
  G11C 17/00 (2006.01)
(52) U.S. Cl. ............... 365/148; 365/100; 365/189.08; 365/189.2; 365/163
(58) Field of Classification Search .............. 365/148
  See application file for complete search history.

(56) References Cited

U.S. PATENT DOCUMENTS

| | | | |
|---|---|---|---|
| 5,761,115 A | 6/1998 | Kozicki et al. | |
| 6,635,914 B2 | 10/2003 | Kozicki et al. | |
| 6,825,489 B2 * | 11/2004 | Kozicki | 257/42 |
| 6,873,540 B2 * | 3/2005 | Krieger et al. | 365/151 |
| 6,985,378 B2 | 1/2006 | Kozicki | |
| 7,106,614 B2 | 9/2006 | Symanczyk | |
| 7,145,791 B2 | 12/2006 | Tsushima et al. | |
| 7,199,394 B2 * | 4/2007 | Mandell et al. | 257/40 |
| 7,215,568 B2 | 5/2007 | Liaw et al. | |
| 7,251,152 B2 | 7/2007 | Roehr | |
| 7,254,052 B2 | 8/2007 | Liaw | |
| 7,276,760 B2 * | 10/2007 | Bhattacharyya | 257/321 |
| 7,292,466 B2 | 11/2007 | Nirschl | |
| 7,332,377 B2 | 2/2008 | Happ et al. | |
| 7,337,282 B2 | 2/2008 | Happ et al. | |
| 7,355,898 B2 | 4/2008 | Roehr | |
| 7,359,236 B2 | 4/2008 | Gilbert | |
| 7,372,716 B2 | 5/2008 | Roehr et al. | |
| 7,391,639 B2 | 6/2008 | Gogl | |
| 7,402,847 B2 | 7/2008 | Kozicki et al. | |
| 7,411,815 B2 | 8/2008 | Gogl | |
| 7,411,854 B2 | 8/2008 | Klosterman et al. | |
| 7,420,841 B2 | 9/2008 | Ruf et al. | |
| 7,423,281 B2 | 9/2008 | Rohr | |
| 7,423,906 B2 | 9/2008 | Symanczyk | |
| 7,426,131 B2 | 9/2008 | Gilbert | |
| 7,428,163 B2 | 9/2008 | Hoenigschmid et al. | |
| 7,440,303 B2 | 10/2008 | Liaw | |
| 7,457,145 B2 | 11/2008 | Kund et al. | |
| 7,471,543 B2 | 12/2008 | Nakashima et al. | |
| 7,499,344 B2 | 3/2009 | Nirschl et al. | |
| 7,514,706 B2 | 4/2009 | Gilbert | |
| 7,518,902 B2 | 4/2009 | Hoenigschmid et al. | |
| 7,561,460 B2 | 7/2009 | Liaw et al. | |

(Continued)

FOREIGN PATENT DOCUMENTS

EP 1763038 A1 3/2007

*Primary Examiner* — Son Mai

(57) ABSTRACT

A memory device may include a plurality of memory cells each having elements with at least one solid ion conductor programmable between at least two different impedance states for at least two different data retention times, the plurality of memory cells being dividable into a plurality of portions, each portion being separately configurable for one of the data retention times.

26 Claims, 32 Drawing Sheets

U.S. PATENT DOCUMENTS

| | | |
|---|---|---|
| 7,738,279 B2 | 6/2010 | Slesazeck et al. |
| 7,746,683 B2 | 6/2010 | Hoffmann et al. |
| 7,830,709 B2 | 11/2010 | Keller |
| 7,916,524 B2 | 3/2011 | Happ et al. |
| 7,961,534 B2 * | 6/2011 | Kang et al. ............... 365/193 |
| 2003/0035315 A1 * | 2/2003 | Kozicki ..................... 365/171 |
| 2004/0124407 A1 | 7/2004 | Kozicki et al. |
| 2007/0008770 A1 | 1/2007 | Nagao et al. |
| 2007/0195580 A1 * | 8/2007 | Hoenigschmid et al. ..... 365/148 |
| 2008/0080226 A1 * | 4/2008 | Mikolajick et al. ........... 365/148 |
| 2009/0003046 A1 | 1/2009 | Nirschl et al. |
| 2009/0103350 A1 | 4/2009 | Kund |
| 2009/0190409 A1 * | 7/2009 | Dittrich et al. ........... 365/185.25 |
| 2009/0237979 A1 | 9/2009 | Mukai et al. |
| 2010/0182820 A1 | 7/2010 | Kitagawa et al. |
| 2010/0259968 A1 | 10/2010 | Tsushima et al. |
| 2010/0265757 A1 | 10/2010 | Otsuka |
| 2011/0026298 A1 | 2/2011 | Shiimoto et al. |

\* cited by examiner

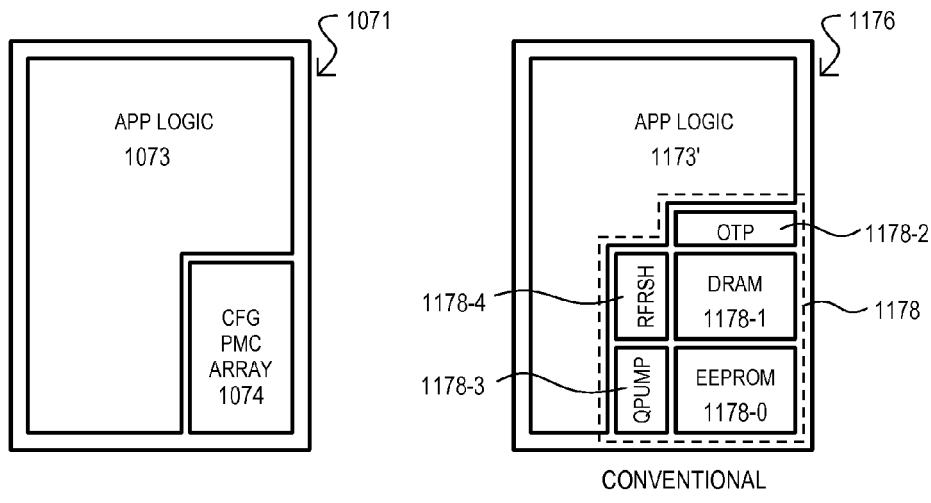
FIG. 10  FIG. 11 CONVENTIONAL

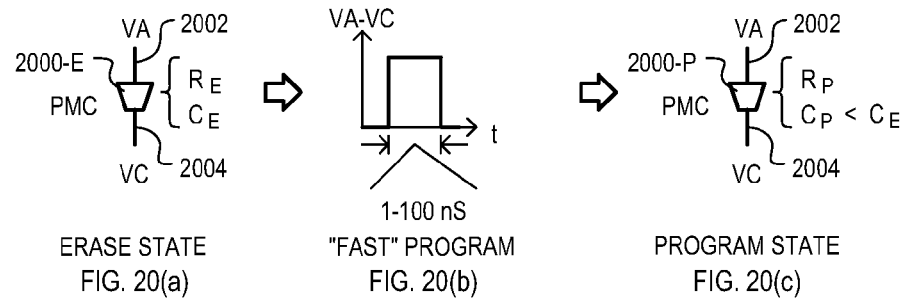
ERASE STATE
FIG. 20(a)
"FAST" PROGRAM
FIG. 20(b)
PROGRAM STATE
FIG. 20(c)
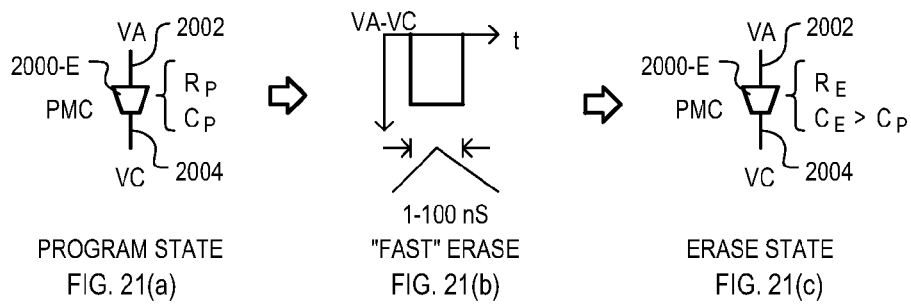
PROGRAM STATE
FIG. 21(a)
"FAST" ERASE
FIG. 21(b)
ERASE STATE
FIG. 21(c)
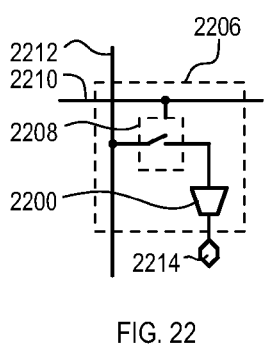
FIG. 22
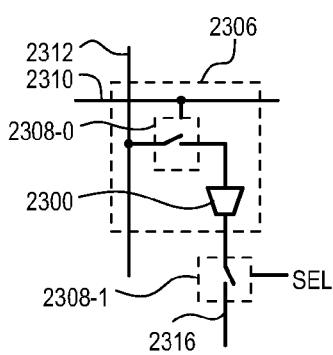
FIG. 23
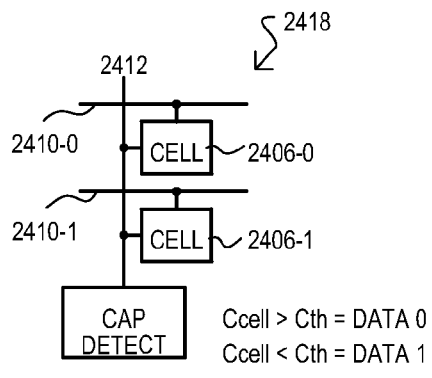
FIG. 24
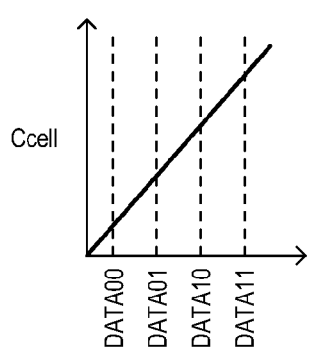
FIG. 25

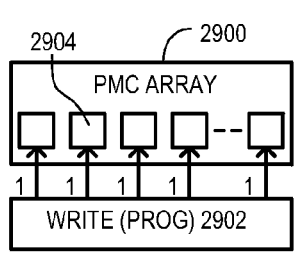
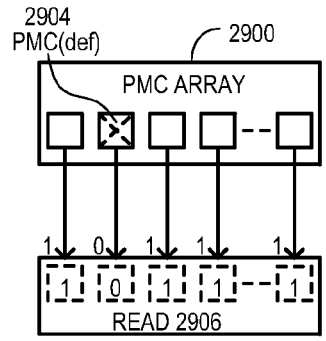
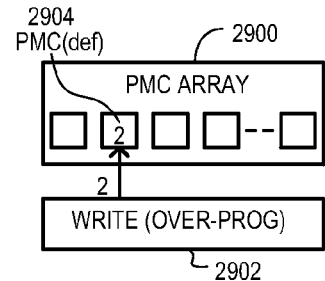
FIG. 29(a)  FIG. 29(b)  FIG. 29(c)
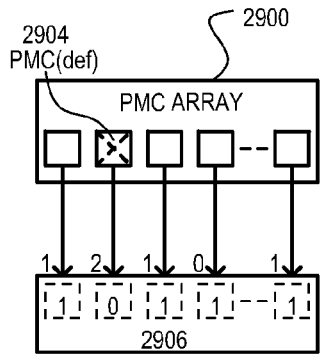
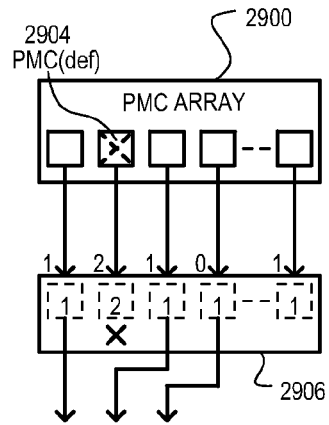
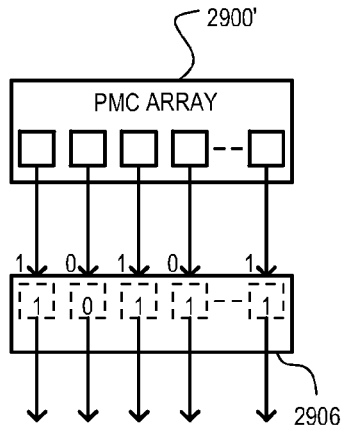
FIG. 30(a)  FIG. 30(b)  FIG. 30(c)
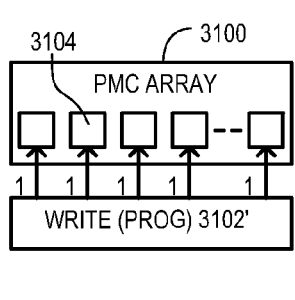
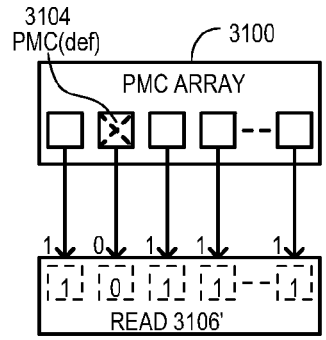
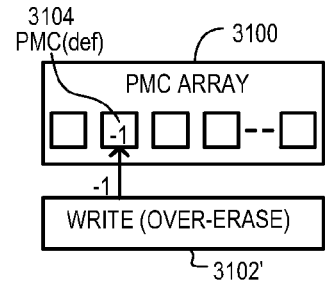
FIG. 31(a)  FIG. 31(b)  FIG. 31(c)

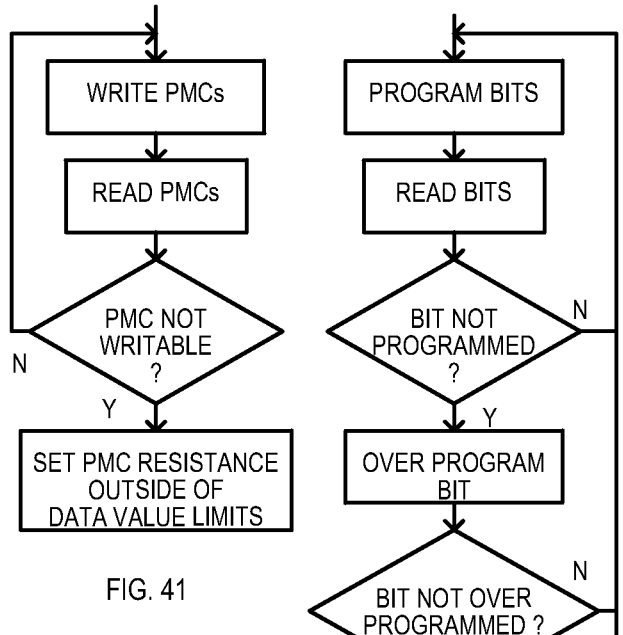
FIG. 41
FIG. 42
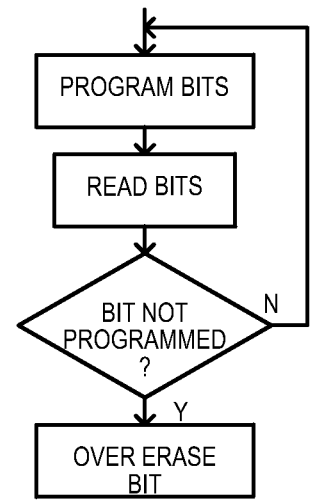
FIG. 43A
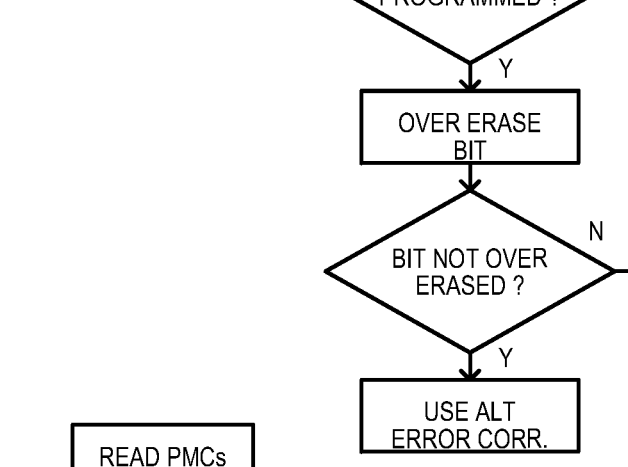
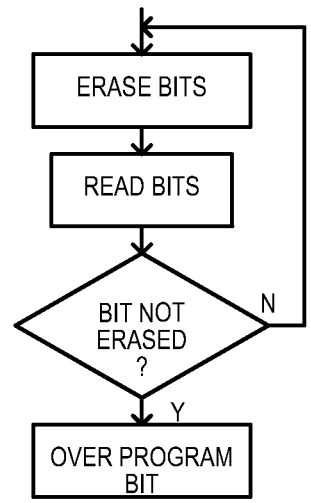
FIG. 43B
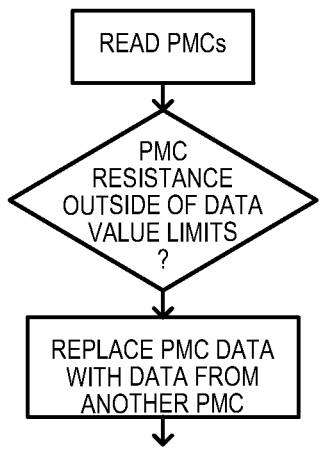
FIG. 44

PROGRAM

READ

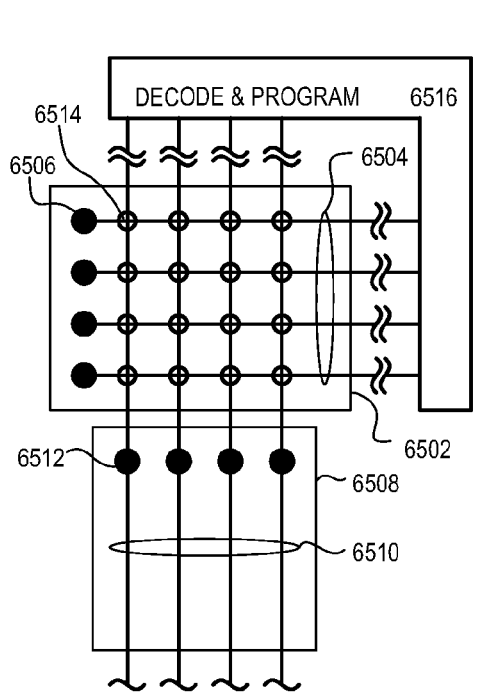
FIG. 65A
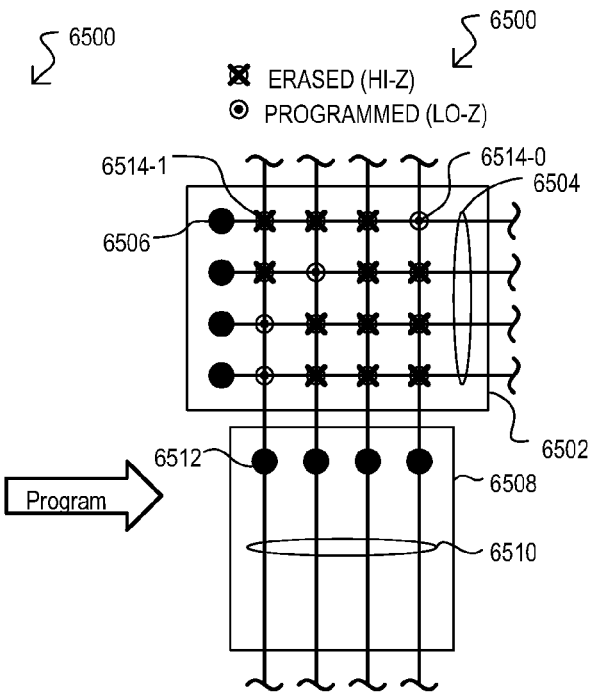
FIG. 65B
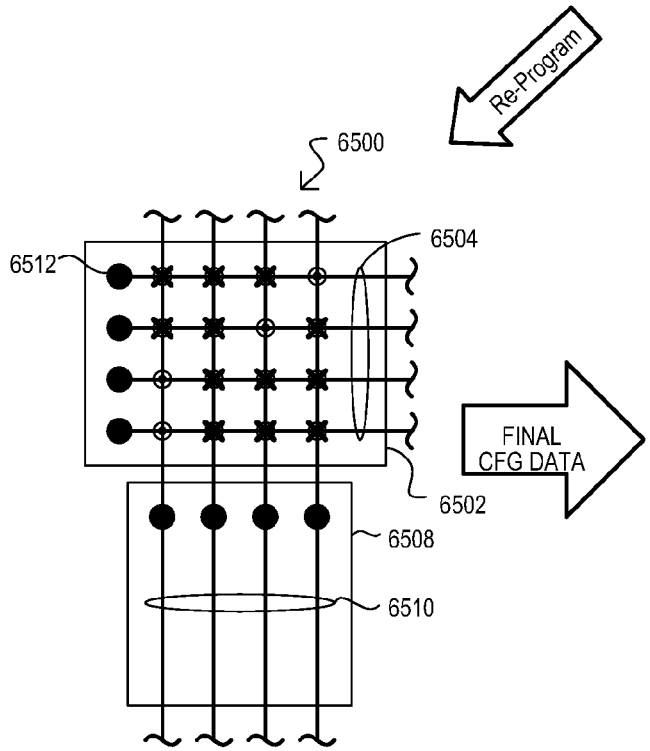
FIG. 65C
| CONFIG DATA | |
|---|---|
| PMC 0000 | Not Programmed |
| PMC 0001 | Programmed |
| ⋮ | ⋮ |
| PMC 0CA0 | Programmed |
| PMC 0CA1 | Not Programmed |
| ⋮ | |
| PMC FFFF | Not Programmed |
FIG. 65D FIG. 68A
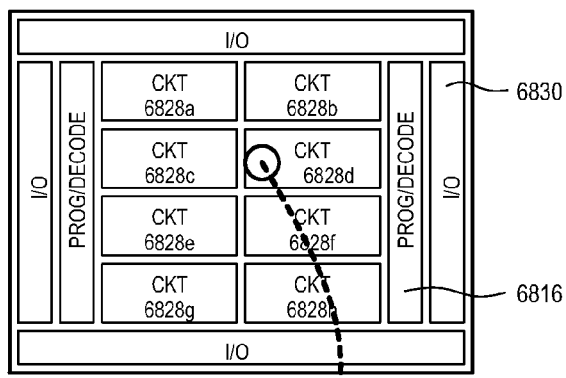
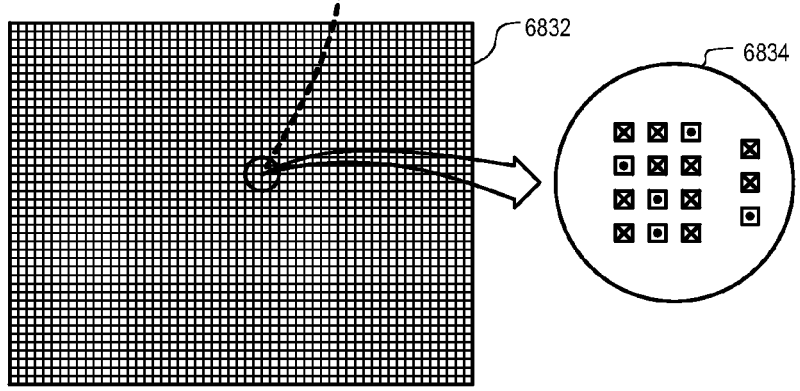
FIG. 68B
FIG. 69A
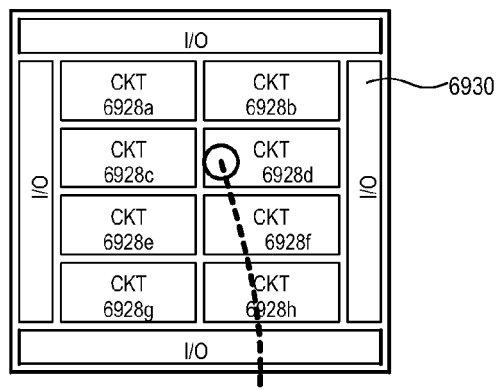
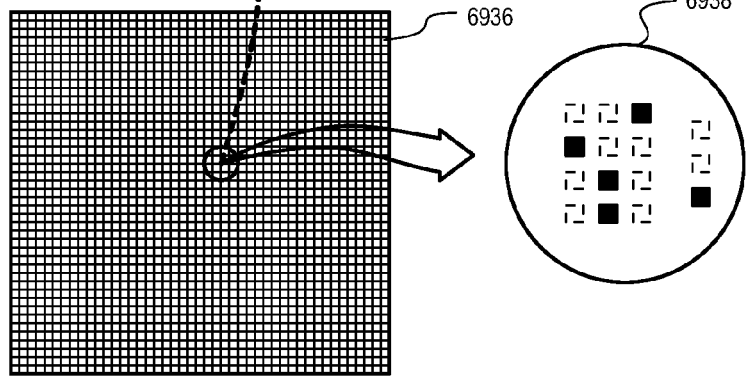
FIG. 69B

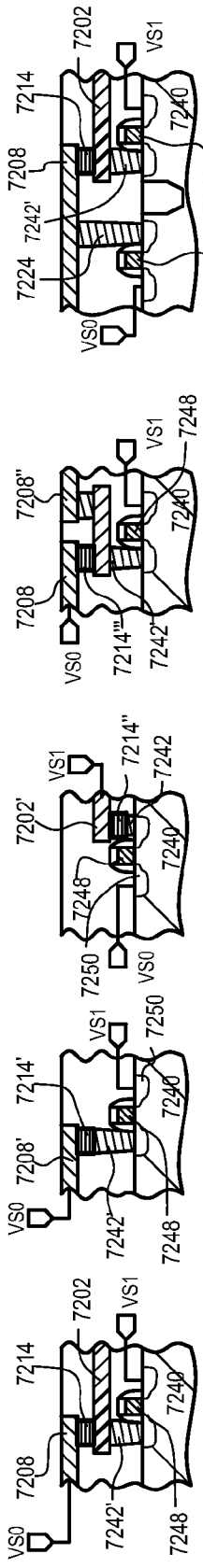
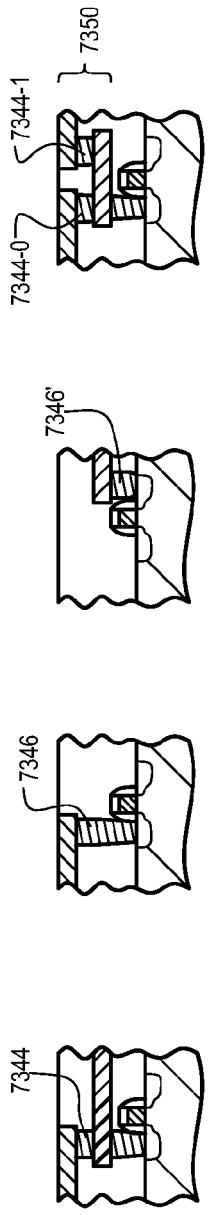
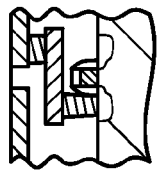
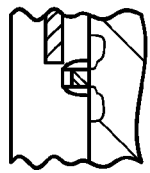
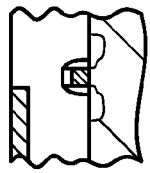
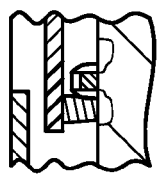

RECONFIGURABLE MEMORY ARRAYS HAVING PROGRAMMABLE IMPEDANCE ELEMENTS AND CORRESPONDING METHODS

This application claims the benefit of U.S. Provisional Patent Application Ser. No. 61/200,704, filed on Dec. 2, 2008, the contents of which are incorporated by reference herein.

TECHNICAL FIELD

The present invention relates generally to memory devices having programmable impedance elements such as programmable metallization cells (PMCs), and more particularly to a memory device having portions programmable for different memory response types.

BRIEF DESCRIPTION OF THE DRAWINGS

FIG. 10 shows a system-on-a-chip type device according to an embodiment.

FIG. 11 shows a conventional system-on-a-chip device for comparison to that of FIG. 10.

FIGS. 20(a) to 20(c) show a "fast" capacitance program operation according to an embodiment.

FIGS. 21(a) to 21(c) show a "fast" capacitance erase operation according to an embodiment.

FIGS. 22 and 23 show memory cells according to embodiments.

FIG. 24 shows a memory device according to an embodiment.

FIG. 25 shows a multi-bit capacitance storage arrangement according to an embodiment.

FIGS. 29(a) to 29(c) are block schematic diagrams showing the marking of defective cells with over-programming according to an embodiment.

FIGS. 30(a) to 30(c) are block schematic diagrams showing the reading of error corrected data according to an embodiment.

FIGS. 31(a) to 31(c) are block schematic diagrams showing the marking of defective cells with over-erasing according to an embodiment.

FIGS. 41 to 44 are flow diagrams showing error marking and error compensation methods according to embodiments.

FIGS. 65A to 65D show a method according to another embodiment.

FIGS. 68A and 68B are top plan views showing a prototype method according to an embodiment.

FIGS. 69A and 69B are top plan views showing a production method according to an embodiment that may correspond to the method of FIGS. 68A and 68B.

FIGS. 72A to 72E are side cross sectional views of PMC structures that may be included in the embodiments.

FIGS. 73A-P to 73D-P are side cross sectional views of production structures corresponding to PMC structures of FIGS. 72A to 72E having a programmed state.

FIGS. 73A-E to 73D-E are side cross sectional views of production structures corresponding to PMC structures of FIGS. 72A to 72E having an erased state.

DETAILED DESCRIPTION

Various embodiments of the present invention will now be described in detail with reference to a number of drawings. The embodiments show circuits and methods related to programmable impedance elements, such as programmable metallization cells (PMCs). Examples of PMCs are shown and described in U.S. Pat. Nos. 6,635,914 and 7,359,236. The contents of these applications are incorporated by reference herein. As described therein, PMCs may include a solid ion conductor In the figures below, it is understood that responses shown in graphs are illustrative and can vary according to implementation. Similarly, unless otherwise indicated views of structures are not necessarily to scale.

As used herein, a programming of a memory element may be the application of electrical conditions that impart an impedance change in the element with respect to a non-programmed or erased state. Similarly, an erasing of a memory element may be the application of electrical conditions to impart an impedance change in the element with respect to a programmed state. In particular embodiments, memory elements may be PMCs that may be programmed to one or more relatively low impedance states, and erased to one or more relatively high impedance states. A write operation may establish an impedance state of one or more elements, and may include a program and/or an erase operation.

Figure 1:
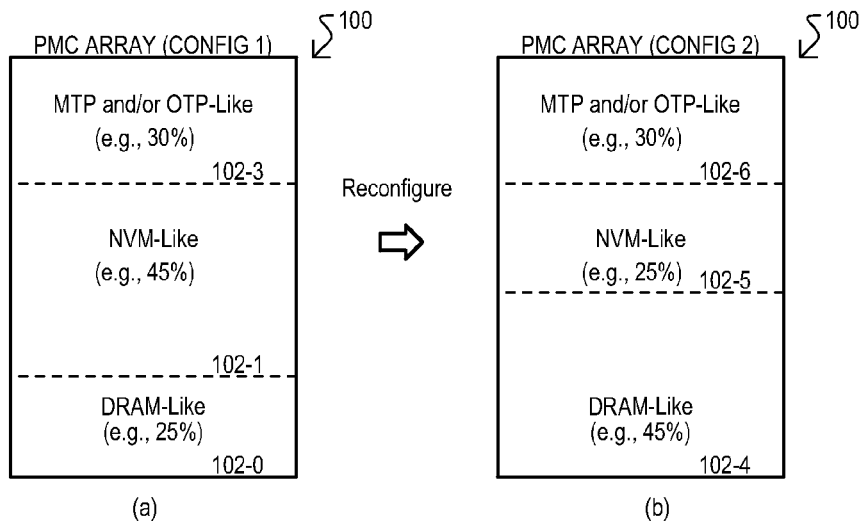
FIG. 1 shows block diagrams of a memory device according to one embodiment.

Referring now to FIG. 1, a memory device according to a first embodiment is shown in a block diagram and designated by the general reference character 100. A memory device 100 may include an array of memory elements that may be programmable between two or more impedance states having different data retention times. In one embodiment, such memory elements may include a solid ion conductor, and in particular embodiments, may include PMCs.

An array of memory elements within a memory device 100 may be configured to provide different memory response types. In the very particular embodiment shown, memory device may include a PMC memory array that may be configured to provide any of three different response types, referred to herein as DRAM-like, NVM-like, and MTP/OTP-like.

Memory elements having a DRAM-like response may respond with faster read accesses as compared to the other response types (i.e., NVM-like or MTP/OTP-like). Further, data retention times for a DRAM-like response may be less than those of other response types. An endurance value (i.e., number of times an element may be written to) may be longer than the other response types. That is, data values may have to be periodically re-written (e.g., re-programmed/erased) into the memory cells. Reading data from DRAM-like response elements may consume less power than the other response types. In some embodiments, a DRAM-like response may be comparable to accesses for a dynamic random access memory (DRAM) device. As but one very particular example, read operations to the array may take about 50 ns and consume about 20 µA for accesses to pages of about 512 bytes.

Memory elements having an NVM-like response may require longer write times than a DRAM-like response, but may be faster than an MTP/OTP-like response. Data retention times may also be longer than a DRAM-like response but shorter than an MTP/OTP-like response. In some embodiments, an NVM-like response may be substantially non-volatile, storing data values over time periods comparable to other nonvolatile memory devices, such as "flash" EEPROM. An endurance value for an NVM-like response may be between that of DRAM-like and MTP/OTP-like responses. Similarly, read operations may consume amounts of power between that of DRAM-like and MTP/OTP-like responses. In one particular example, read operations for NVM-like response memory elements may take about 500 ns and consume about 20 µA for accesses to pages of about 512 bytes. It is noted that an array portion having an NVM-like response need not erase elements in large groups (e.g., sectors), as is the case for conventional flash EEPROMs.

Memory elements having an MTP/OTP-like response may have data retention times for longer than those of other response types, and in some embodiments may be substantially permanent. An endurance value may be substantially limited with respect to those of the other response types. That is, elements written for such a response may be written but few times, or only once.

FIG. 1 shows memory device 100 having a first configuration (a) in which one portion 102-0 includes 25% of the memory elements with a DRAM-like response, while another portion 102-1 includes 45% of the memory elements with an NVM-like response, and a third portion 102-2 includes 30% of the memory elements with an MTP/OTP-like response. However, while a memory device 100 may be placed into the particular configuration (a), it may be reconfigured into various other partitioning arrangements.

Accordingly, FIG. 1 also shows the same memory device 100 after it has been re-configured to a second configuration (b). In the second configuration, memory device 100 may now include one portion 102-4 with 45% of the memory elements having the DRAM-like response, a second portion 102-5 with 25% of the memory elements with an NVM-like response, and a third portion 102-6 with 30% of the memory elements with an MTP/OTP-like response.

It is noted that the percentages shown in FIG. 1 are but examples.

A re-configuration operation can occur as part of a manufacturing process for an integrated circuit device, or can occur after delivery of such a device to customer with a program/configuration operation, or can occur "in system" (after device has been installed into a larger electronic device), and/or can occur "on the fly" (by a controller connected to the memory device).

In some embodiments, portions having an OTP/MTP-like response may not be configurable back to either the NVM-like or DRAM-like response.

In this way, a memory device having an array of the same type of memory elements may be configurable into multiple portions, each portion having a different response type.

Variations in memory element response, like those shown in FIG. 1, may be implemented by varying an energy used to write to a memory element. Particular examples of varying write energy will be described with reference to FIGS. 2A to 2D.

Figure 2A:
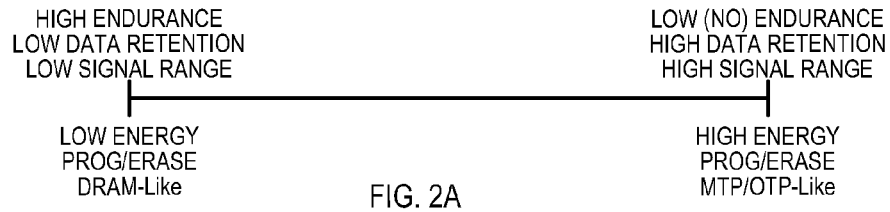
FIGS. 2A to 2D are a series of diagrams showing how different write energies may be used to establish different memory response types.

Referring to FIG. 2A, a response of a same type PMC element to different types of program and/or erase operations according to an embodiment is shown in a diagram. In general, FIG. 2A shows a response in which an extent of non-volatility imparted to a memory element may follow a magnitude of write energy to such an element. In the particular example of FIG. 2A, for a relatively low data retention time (DRAM-like response), a write operation can be low energy. In contrast, for a high (or substantially permanent) data retention time (MTP or OTP-like), a write operation can be of relatively higher energy. A write energy may be considered as a function of write power and/or write time.

Figure 2B:
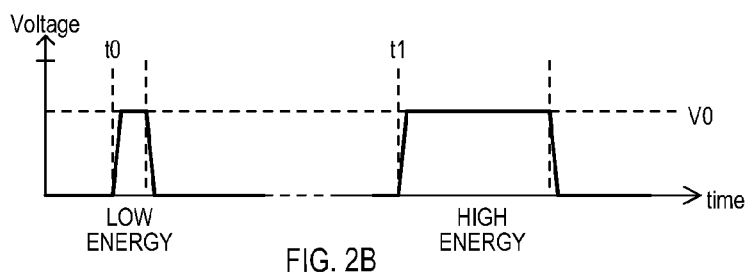
Figure 2C:
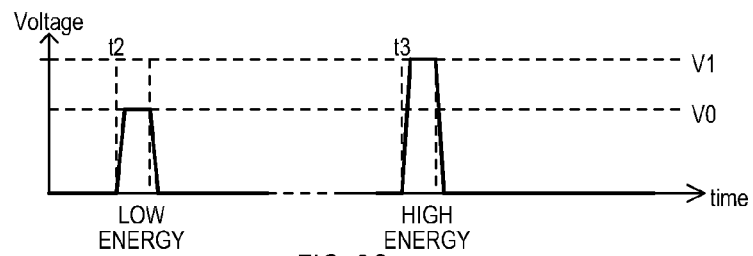
Figure 2D:
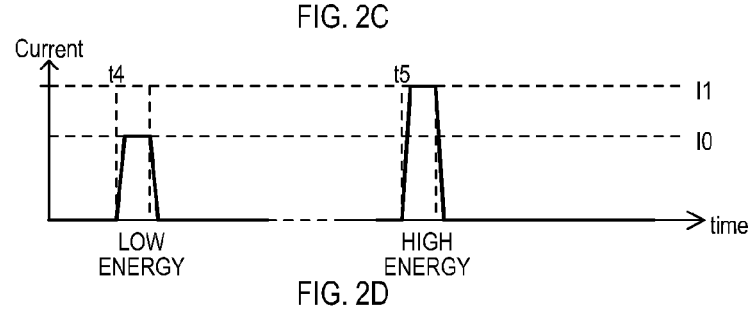

Referring to FIGS. 2B to 2D, various examples of write operations of different energies according to embodiments are shown in a series of timing diagrams.

Referring to FIG. 2B, in one embodiment, a program and/or erase operation pulse duration can be varied to execute a low or high energy write operation. At time t0, a pulse may start that has an amplitude of voltage V0 and a relatively short pulse duration, to provide a low energy write operation. In contrast, at time t1, a pulse may start that has the same amplitude (V0), but a relatively longer pulse duration, to provide a high energy write operation.

Referring to FIG. 2C, in another embodiment, a write pulse voltage amplitude can be varied to execute a low or high energy write operation. At time t2, a pulse may start that has an amplitude of voltage V0, to provide a low energy write operation. In contrast, at time t3, a pulse may start that has a greater amplitude V1, to provide a high energy write operation.

Referring to FIG. 2D, in another embodiment, a write operation pulse current amplitude can be varied to execute a low or high energy write operation. Accordingly, FIG. 2D shows a response like that of FIG. 2C, but with variations in current amplitude (I0,I1).

It is understood that combinations of approaches like those shown in FIGS. 2B to 2D can be utilized to provide a low or high energy write operation.

For low energy program/erases, PMCs may have lower data retention, but increased endurance. Further, differences in a PMC state (e.g., its impedance) may be relatively small. In contrast, for higher energy program/erases, PMCs can have a relatively longer data retention, but considerably less endurance. Under such high-stress program or erase operations, PMC state changes can be relatively large, giving a high signal range for detection.

In this way, a write energy used to write data into memory elements may be varied to program such memory elements for different response types.

Figure 3:
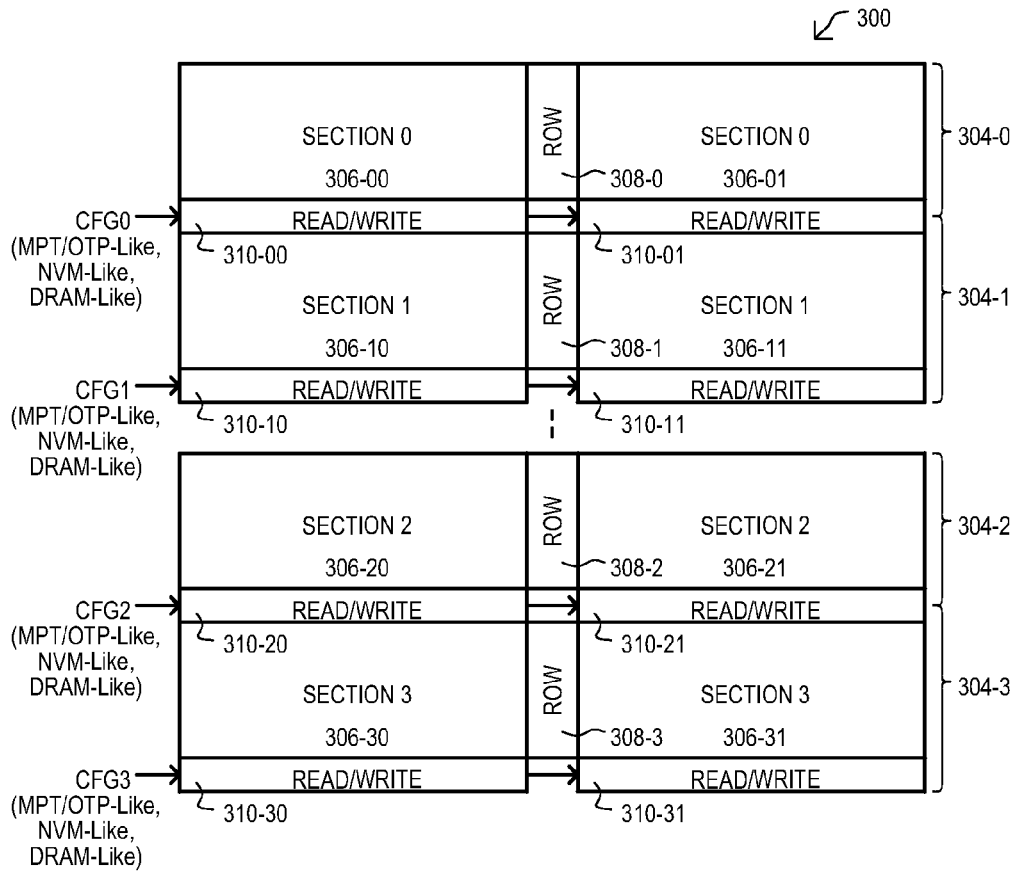
FIG. 3 is a block schematic diagram showing a memory device according to a further embodiment.

Referring now to FIG. 3, an example of a memory device according to another embodiment is shown in a block diagram and designated by the general reference character 300. A memory device may be one version of a PMC array 300. PMC elements within PMC array 300 may be accessed via access circuits, which in the particular embodiment shown, may include row access circuits and read/write sections.

A PMC array 300 may include a number of sections 304-0 to 304-3. Each section (304-0 to 304-3) may include PMC areas 306-00 to 306-31, a row access circuit 308-0 to 308-3, and read/write sections 310-00 to 310-31.

PMC areas (306-00 to 306-31) may include PMC elements accessed by a corresponding row access circuit (308-0 to 308-3) and read/write sections 310-00 to 310-31 to enable data values to be written (e.g., programmed or erased) into such elements, and/or allow data values to be read from such elements.

Read/write sections (310-00 to 310-31) may be configured to operate according to a predetermined response type. In the embodiment shown, each read/write section (310-00 to 310-31) may be configured for a particular response type by corresponding configuration information CFG0-CFG-3. For example, information CFG0 may establish the operation of read/write sections 310-00/01, while information CFG1 may establish the operation of read/write sections 310-10/11, etc.

Each read/write section (310-00 to 310-31) may include both read circuits for reading data values stored by PMCs as well as write circuits for establishing values stored by such PMCs.

Read circuits included in read/write sections (310-00 to 310-31) may have detection levels that can be varied according to configuration information (CFG0-3). For example, if PMC areas (306-00 to 306-31) are configured for an OTP/MTP-like response, a threshold current/voltage for determining the value of stored data can be relatively high versus other configurations (e.g., DRAM-like or NVM-like). If configured for an NVM-like response, a threshold current/voltage can be less than that for the OTP/MTP-like case, but greater than that for a DRAM type response.

Write circuits included in read/write sections (310-00 to 310-31) may vary program/erase pulses according to configuration information. For example, the number of pulses, pulse amplitude, pulse duration, or any combination thereof, can be varied based on configuration information. Thus, when a write circuit is configured for an OTP/MTP-like response, pulse number and/or amplitude and/or duration can be higher than the other cases (e.g., DRAM-like or NVM-like). For an NVM-like response, such pulse values can be less than the OTP/MTP case, but greater than a DRAM-like response configuration.

While FIG. 3 shows read/write sections (310-00 to 310-31) that may be configured with values (CGF0-3), in other embodiments, differences in memory response type can be established in a design stage. In some embodiments, a same type of PMC element array can always be included in different designs, however differences in operation (i.e., partitions between OTP/MTP-, NVM-, and DRAM-like partitions) may be established by the read/write circuit blocks included for the appropriate sections. That is, the difference in read/write circuitry can be hardwired in some embodiments, while in other embodiments such differences may be established by stored or received configuration values.

Row access circuits (308-0 to 308-3) may access rows of PMC elements to allow data to be written into or read from such elements. In the embodiment shown, each row access circuit (308-0 to 308-3) may access a row in the two PMC areas (306-00 to 306-31) of the corresponding section (304-0-3). In such an access operation, a row access may enable PMC cells to be electrically connected to corresponding read/write sections (310-00 to 310-31).

In some embodiments, row access circuits (308-0 to 308-3) may also vary in operation according to a response type of their corresponding PMC elements. For example, in some cases a write (i.e., program or erase) pulse generated by a read/write circuit may be different depending upon PMC response type. For some pulse values, it may be desirable to boost a row access voltage (e.g., word line voltage) to overcome threshold voltage limitations in an access device to a PMC element in order to apply a sufficiently high pulse to the PMC element.

In this way, a memory device may include sections of programmable impedance elements that may be separately configured for different response types.

Figure 4:
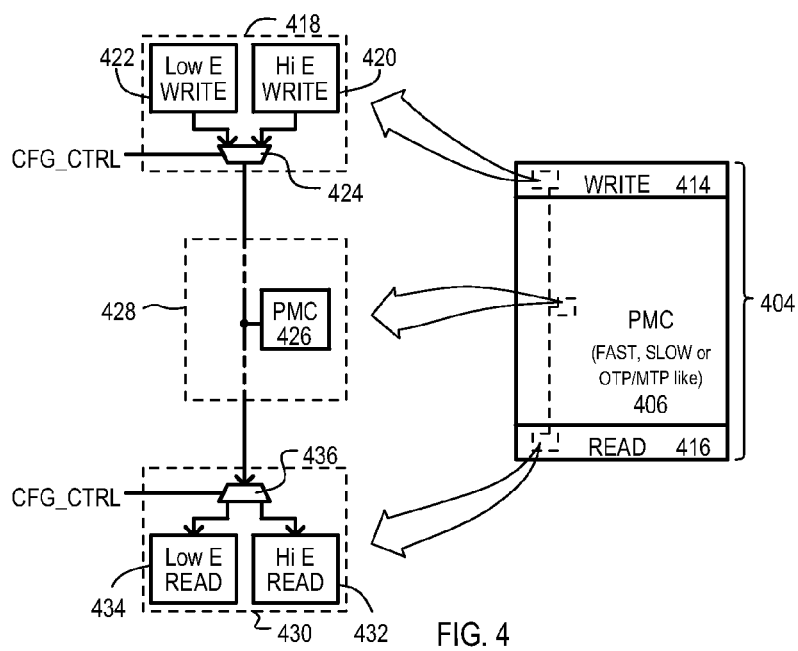
FIG. 4 is a block schematic diagram showing a memory device section according to an embodiment.

Referring to FIG. 4 one example of a section 404, that may be included in a memory device like that of FIG. 3, is shown in a block schematic diagram. Section 404 may include a PMC area 406, a write section 414 and a read section 416. In the particular embodiment shown, a PMC area 406 may be considered to include a group of PMC elements accessible by a corresponding write section 414 and read section 416.

A write section 414 may include a number of write sets (one shown as 418), each of which may provide write signals of varying energies for programming PMCs for different response types. In the particular embodiment shown, write set 418 may include a high energy (HE) write circuit 420, a low energy (LE) write circuit 422, and a write selection circuit 424. A Hi E write circuit 420 may apply higher energy write signals to an accessed PMC element than a Low E write circuit 422. Such variations in write energy may be according to the various embodiments shown herein, and equivalents (e.g., pulse number, duration, amplitude). Based on configuration information CFG_CTRL, one of the write circuits (424 or 424) within a write set 418 may be connected to a PMC memory cell (e.g., 426) of an array 428 of such cells within PMC area 406. While FIG. 4 shows two types of write circuits (i.e., HE and LE), more than two types of write circuits may be included in a write section.

A read section 416 may include a number of read sets (one shown as 430), each of which may sense data values for different response types. In the particular embodiment shown, read set 430 may include an HE read circuit 432, an LE read circuit 434, and a read selection circuit 436. An HE read circuit 432 may detect signals having a relatively high signal range. An LE read circuit 434 may detect signals having a relatively low signal range. Based on configuration information CFG_CTRL, a signal path from one or more PMC memory cells (e.g., 426) of an array (428) may be connected to an HE or LE read circuit (432 or 434). As in the case of write section 418, while FIG. 4 shows two types of read circuits (i.e., HE and LE), more than two types of read circuits may be included in a read section.

In the embodiment of FIG. 4, an entire section 404 can be configured to operate to give a "FAST" (e.g., DRAM-like) response, or a slow (e.g., NVM or MTP/OTP-like) response.

In this way, sections of a memory device may be configured to provide different response types based on write and read operations.

While the embodiments of FIGS. 3 and 4 show memory devices that may be programmable in sections for particular responses, other embodiments may include memory devices programmable along substantially arbitrary divisions of a section, or other sub-part of an array. Examples of such embodiments are shown in FIGS. 5 to 7.

Figure 5:
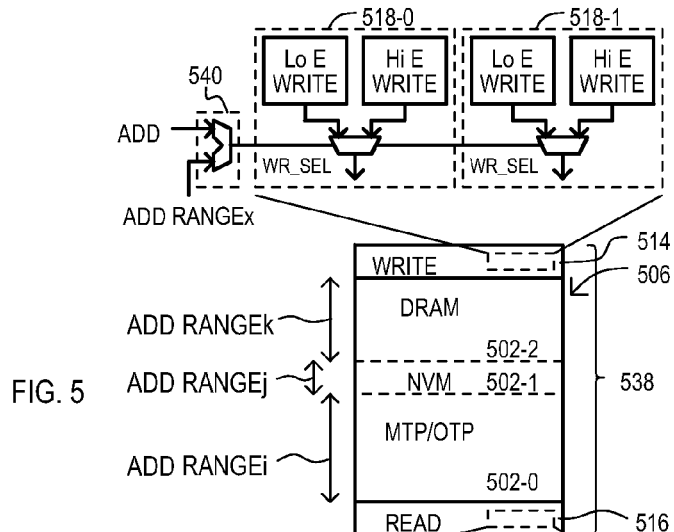
FIG. 5 is a block schematic diagram showing a memory device section according to another embodiment.
Figure 6:
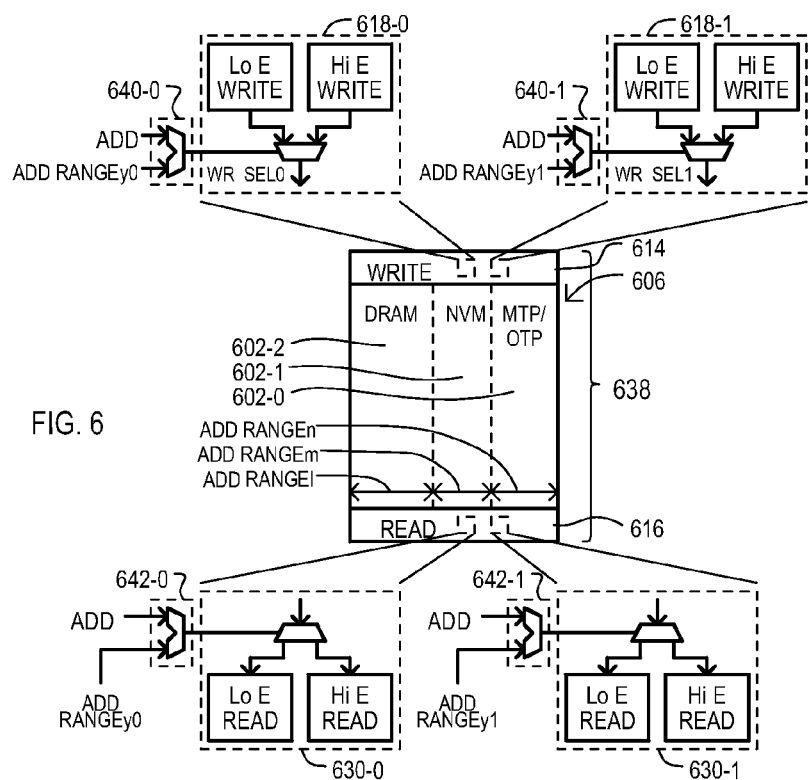
FIG. 6 is a block schematic diagram showing a memory device section according to a further embodiment.
Figure 7:
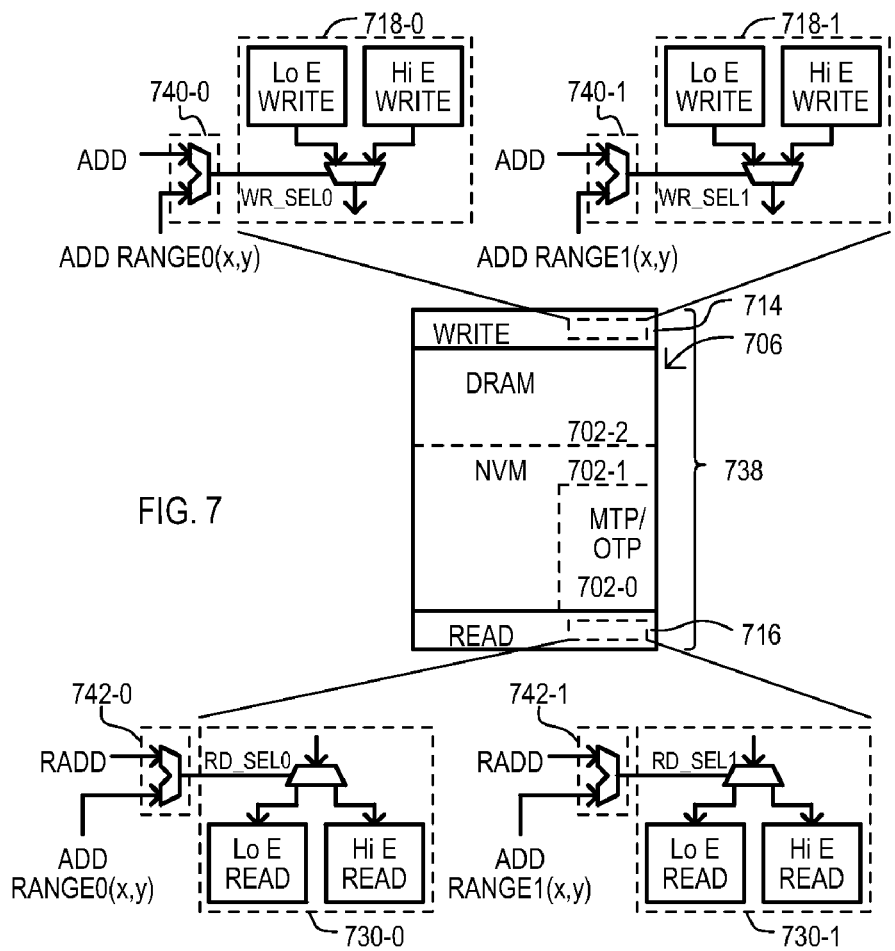
FIG. 7 is a block schematic diagram showing a memory device section according to yet another embodiment.

In FIGS. 5 to 7, a memory cell array accessed by a write section and/or read sections may be divisible along row and/or column boundaries according to address values for the array.

Referring now to FIG. 5, a configurable section according to an embodiment that may be included in a memory device is shown in a block schematic diagram, and designated by the general reference character 538. Configurable section 538 may include a PMC area 506, a write section 514, and a read section 516. As in the case of FIG. 4, a PMC area 506 may include a group of PMC elements accessible by a corresponding write section 514 and read section 516. However, unlike FIG. 4, portions of PMC area 506 may programmable for different kinds of responses.

In FIG. 5, a PMC area 506 is shown divided into a first portion 502-0 configured for an MTP/OTP-like response, a second portion 502-1 configured for an NVM-like response, and a third portion 502-2 configured for a DRAM-like response. Portions 502-0 to 502-2 may correspond to address ranges i, j, k, respectively. In a particular embodiment, address ranges i, j, k may be row addresses.

A write section 514 may include a number of write sets (two shown as 518-0/1), as well as a write address comparator 540. Write sets (e.g., 518-0/1) may have a structure like that shown in FIG. 4. However, write sets (e.g., 518-0/1) may differ from that of FIG. 4 in that a selection of a write energy for write sets may occur according to an address dependent value WR_SEL. In the embodiment shown, address dependent value WR_SEL may be generated by write address comparator 540. A write address comparator 540 may compare a received write address ADD (i.e., an address indicating where data is to be written) to one or more address range values (ADD RANGEx). According to such a comparison, a comparator 540 may generate write select value WR_SEL.

Referring still to FIG. 5, examples of write operation corresponding to the illustrated configuration will now be described. If a write address (ADD) is within address range (ADD RANGEi), a write select value WR_SEL may enable HE write circuits to program PMC elements to have an MTP/OTP-like response. If a write address (ADD) is within another address range (ADD RANGEj), a write select value WR_SEL may enable HE write circuits to program PMC elements to have an NVM-like response. If a write address (ADD) is within a third address range (ADD RANGEk), a write select value WR_SEL may enable LE write circuits to program PMC elements to have a DRAM-like response.

A read section 516 may include a number of read sets (two shown as 530-0/1), as well as a read address comparator 542. Read sets (e.g., 530-0/1) may have a structure like that shown in FIG. 4. Selection of a type of read performed (i.e., high energy/low energy configuration) may be address dependent. In the embodiment shown, address dependent value RD_SEL may be generated by read address comparator 542 by comparing a received read address RADD (i.e., an address indicating where data is to be read from) to one or more address range values (RANGEx). Accordingly, in the example of FIG. 5, read operations from addresses within ranges ADD RANGEi and ADD RANGEj may provide read data signals to HE read circuits, while read operation from addresses within ADD RANGEk may provide read data signals to LE read circuits.

It is understood that portions (e.g., 502-0 to 502-3) of a section 538 programmed for different response types may be contiguous addresses or may be addresses ranges grouped according to other criteria. In addition, an address range values ADD RANGEx may be configuration values (e.g., CFG), or may be generated in response to configuration values.

In this way, a write and/or read operation to a PMC based memory array may be divisible according to a write address value.

Referring now to FIG. 6, another configurable section according to another embodiment is shown in a block schematic diagram, and designated by the general reference character 638. Configurable section 638 may include many sections like that shown in FIG. 5, accordingly like sections are referred to by the same reference character but with the first digit being a "6" instead of a "5".

Configurable section 638 may differ from that of FIG. 5 in that a PMC area 606 may be divided into portions having different responses along a column direction. In the particular example shown, a first portion 602-0 may be configured for an MTP/OTP-like response, a second portion 602-1 configured for an NVM-like response, and a third portion 602-2 configured for a DRAM-like response. Portions 602-0 to 602-2 may correspond to address ranges n, m, l, respectively. Address ranges l, m, n may be column addresses.

In the embodiment of FIG. 6, write section 614 may include write sets (two shown as 618-0/1) that may be separately controlled by different write address comparators (two shown as 640-0 and 640-1). It is understood that one write address comparator (e.g., 640-0 or 640-1) may control one or more write sets.

In a similar fashion, read section 616 may include read sets (two shown as 630-0/1) that may be separately controlled by different read address comparators (two shown as 642-0 and 642-1), which may control one or more read sets.

It is understood that address range values ADD RANGEy may be configuration values, or may be generated in response to configuration values.

In this way, a write and/or read operations to a PMC based memory array may be divisible into different response types along a column-wise direction.

Referring now to FIG. 7, another configurable section according to another embodiment is shown in a block schematic diagram, and designated by the general reference character 738. Configurable section 738 may include many sections like that shown in FIG. 6, accordingly like sections are referred to by the same reference character but with the first digit being a "7" instead of a "6".

Configurable section 738 may differ from that of FIG. 6 in that a PMC area 706 may be divided into portions having different responses along both column and row directions. In the particular example shown, a first portion 702-0 may be configured for an MTP/OTP-like response and may represent a sub-set of available column and row addresses. A second portion 702-1 may be configured for an NVM-like response, and may include locations having the same row address but not the same column address as first portion 702-0, locations having the same column address but not the same row address as first portion 702-0, and locations having both different column and row addresses than first portion 702-0. A third portion 702-2 may be configured for a DRAM-like response, and may have addresses with the same column address of portions 702-0 or 702-1 but not a same row address as portions 702-0 or 702-1. Of course, various other divisions in PMC area 706 are possible.

In the example of FIG. 7, write address comparators (740-0/1) may compare a received write address to both row and column address values, while read address comparators (742-0/1) may compare a received address to both row and column address values.

It is understood that address range values ADD RANGE (x,y) may be configuration values, or may be generated in response to configuration values.

In this way, a write and/or read operations to a PMC based memory array may be divisible according to both row-wise and column-wise directions.

While embodiments above have shown separate read and write sets, other embodiments may include combined read/write sets. An example of such a read/write circuit is shown in FIG. 8.

Figure 8:
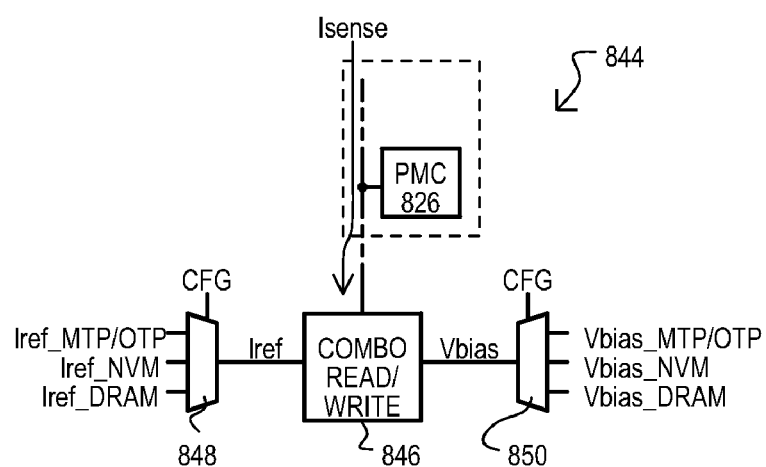
FIG. 8 is a block schematic diagram of a combination read/write circuit according to an embodiment.

Referring to FIG. 8, a combination read/write circuit according to an embodiment is shown in a block schematic and designated by the general reference character 844. A read/write set 844 may include a read/write circuit 846, a reference current (Iref) selection circuit 848, and a bias voltage (Vbias) selection circuit 850. A read/write circuit 846 may compare a sense current (Isense) that flows due to an impedance of a PMC element in a memory cell 826 to a reference current Iref, to thereby determine a value stored by the memory cell. A read/write circuit 846 may also apply a bias voltage (Vbias) to an element of memory cell 826 to thereby write a data value to the memory cell.

An Iref selection circuit 848 may select from various generated reference currents suitable for response type. A particular generated reference current (Iref_MTP/OTP, Iref_NVM, Iref_DRAM) may be provided as current Iref in response to a configuration value CFG.

A Vref selection circuit 850 may select from various generated bias voltages suitable to program a memory cell for a particular response type. A particular generated bias voltage (Vbias_MTP/OTP, Vbias_NVM, Vbias_DRAM) may be provided as current Iref in response to a configuration value CFG.

In this way different reference currents and/or bias voltages may be provided to a read/write circuit to vary its operation according to response type.

Figures 9A, 9B, 9C:
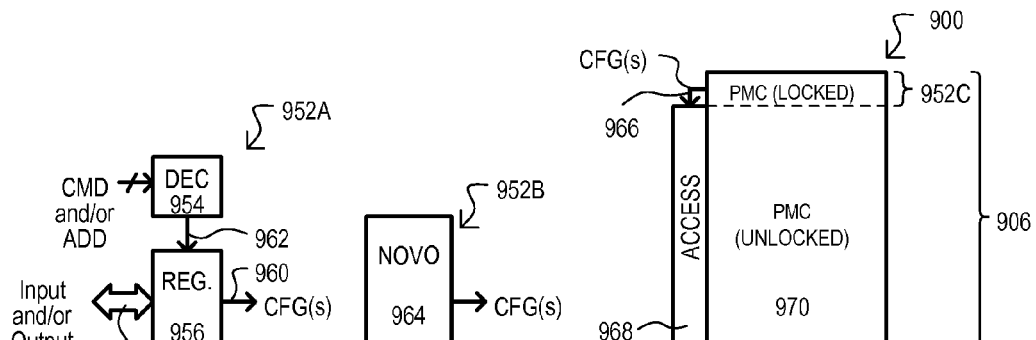
FIGS. 9A to 9C are block schematic diagrams showing configuration value circuits according to various embodiments.

Having described various embodiments that may divide a memory device into different response types according to configuration values, various examples of how such configuration values may be provided is shown in FIGS. 9A to 9C.

Referring to FIG. 9A, a configuration value circuit according to one embodiment is shown in a block schematic diagram and designated by the general reference character 952A. A configuration value circuit 952A may include configuration registers 956 and decoder 954. A configuration value circuit 952A may be provided on an integrated circuit containing a configurable array according to any of the embodiments shown herein, or equivalents.

Configuration registers 956 may store configuration values for establishing a response type for given portion of a memory device. Configuration registers 956 may have a register data input 958, register data output 960, and a register control input 962. A register data input 958 may receive configuration values for storage in registers 956. Optionally, a register input 958 may also be a data output path to enable stored configuration values to be read out from registers 956. A register data output 960 may provide one or more configuration values (CFG(s)) for application to memory arrays, to thereby enable such arrays to have portions separately programmable to different response types. Such configuration values (CFG(s)) may be applied directly, or indirectly, to circuits of a memory device (e.g., write and/or read circuits) to thereby establish how memory cell arrays are divided into differently responding portions. A register control input 962 may provide control signals to registers 954 to enable configuration values to be written, and optionally, to be read as output data.

A decoder 954 may generate signals on register control input 962 that control the storing of configuration values in registers 956. A decoder 954 may decode address and/or control values to access particular locations within registers 956.

A writing of configuration values to registers 956 may occur in various manners, including but not limited to: by a user, upon startup (upon boot-up), and/or by an application program.

In this way, configuration values may be stored in registers of a device.

Referring to FIG. 9B, a configuration value circuit according to another embodiment is shown in a block schematic diagram and designated by the general reference character 952B. A configuration value circuit 952B may include a number of nonvolatile circuit structures 964. Configuration values CFG(s) may be output from nonvolatile circuit structures 964 to thereby enable arrays to have portions separately programmable to different response types. As in the case of FIG. 9A, such configuration values (CFG(s)) may be applied directly, or indirectly, to circuits of a memory device. Nonvolatile circuit structures may include, without limitation, fusible links, anti-fuses, metal options, other mask layer options, or various types of nonvolatile memory cells.

In this way, configuration values may be stored in nonvolatile circuit structures of a device.

Referring to FIG. 9C, a memory device having a configuration value according to another embodiment is shown in a block schematic diagram and designated by the general reference character 900. A memory device 900 may include PMC area 906 and access circuits 968. A PMC area 906 may include a standard region 970 and a locked region 952C, which may serve as a configuration value circuit. A standard region 970 may be accessible with a first (e.g., standard) set of access commands. A standard set of access commands may include read, program and erase commands, such as those noted above, and equivalents. Further, such a standard set of access commands, in combination with configuration values CFG(s) may enable standard region 970 to be divided into different response portions (e.g., DRAM-like, NVM-like, MTP/OTP-like).

A locked region 952C may be accessed under more limited conditions than standard region 970. As but a few examples, a locked region 952C may be accessed based on: a command, or sequence of commands different than standard access commands; a particular signal sequence that includes or does not include signals used in standard commands; and/or a power-up sequence executed in response to power being first applied to a device, or interrupted to the device. Still further, access to a locked region 952C may be established by one or more predetermined fabrication step (e.g., manufacturing steps prior to final packaging).

In the particular embodiment of FIG. 9C, configuration values CFG(s) may be provided to access circuits 968. Access circuits 968 may control read and write operations to standard region 970 based on such configuration values CFG(s). In some embodiments, access circuits 968 may include read and/or write circuits as described herein that vary operation in response to configuration values. While FIG. 9 shows configuration values applied directly to access circuits 968, in other embodiments, such values may be applied indirectly to such access circuits.

In this way, configuration values stored in a locked section of a memory array may be used to establish a response type for the array, or establish response types for different portions of the memory array.

While memory devices according to the above embodiments may include "standalone" memory devices (i.e., devices show main function is the storage of data), alternate embodiments may include "embedded" memories having the same programmable features. An embedded memory may be a memory circuit formed in a larger integrated circuit have functions in addition to storing data. One example of such an embodiment is shown in FIG. 10.

Referring to FIG. 10, a "system-on-a-chip" (SoC) integrated circuit is shown in a top plan view, and designated by the general reference character 1071. SoC 1071 may include a logic section 1073 and a programmable memory array 1074. A logic section 1073 may include circuits that provide predetermined functions that may utilize memory array 1074. Such functions may need multiple memory response types, including DRAM-like, NVM-like and MTP/OTP-like, as described for the embodiments herein.

A programmable memory array 1074 may be, or include, a memory device like those described herein, and equivalents, that may be programmed to provide various memory response types.

In this way, an embedded memory may have an array of the same type of memory elements configurable into multiple portions of different response types.

In contrast to the embodiment of FIG. 10, a conventional SoC integrated device is shown in FIG. 11, and designated by the general reference character 1176. Like the embodiment of FIG. 10, conventional SoC device 1176 may include a logic portion 1173'. Unlike FIG. 10, conventional SoC device 1176 may include a compound memory section 1178 that having multiple different memory types, including an electrically erasable read-only-memory (EEPROM) 1178-0, a DRAM 1178-1, and a one-time programmable (OTP) memory 1178-2.

An EEPROM 1178-0 may have a corresponding charge pump QPUMP 1178-3 that consumes both area and may include specialized high voltage transistors which my increase manufacturing complexity. DRAM 1178-1 may have a corresponding refresh circuitry 1178-4 for refreshing data values stored within some minimum refresh (e.g., pause) time period.

Referring to FIGS. 10 and 11, in particular embodiments, configurable memory array 1074' of SoC device 1071 may provide substantially equivalent memory functions as compound memory section 1178 of conventional SoC device 1176 while dispensing with ancillary circuits, such as charge pumps (e.g., 1178-3), refresh circuits (e.g., 1178-4), etc. In addition, an SoC device 1071 may have shared overhead between different memory sections, as different responding memory elements may be of the same type and/or with a same array. In addition, memory performance may be increased due to reduced bussing, as bussing for different memory types may not be included.

Figure 12:
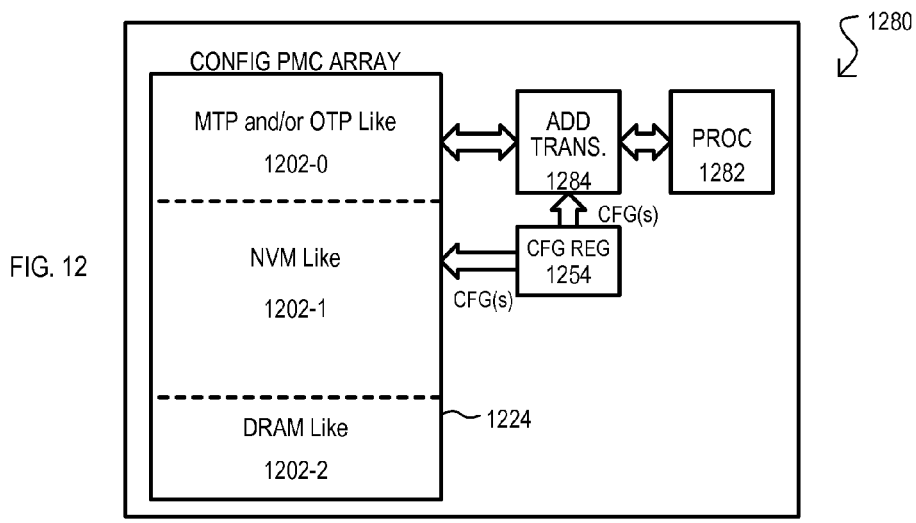
FIG. 12 is a block schematic diagram of a microcontroller device according to an embodiment.

Referring now to FIG. 12, a device according to another embodiment is shown in a block schematic diagram and designated by the general reference character 1280. A device 1280 may be a microcontroller that includes a processor 1282, a configurable memory array 1224, an address translator 1284, and a configuration register 1254. A processor 1282 may access memories of different response types. As but one example, a processor 1282 may access memory types in a separate fashion. As but one example, a processor 1282 may access instruction memory data, which may be stored in a nonvolatile fashion, as well as data memory (e.g., working memory, or system RAM), which may be stored in a volatile fashion.

A configurable memory array 1224 may be a memory device like those described herein, and equivalents, that may be programmed to provide various memory response types. As but one example, one portion may be programmed to an MTP/OTP-like or NVM-like response to store instruction data (e.g., firmware, etc.), while another portion may be programmed to a DRAM-like response to function as data memory.

An address translator 1284 may translate an address space accessed by a processor, into addresses of configurable memory array 1224. Address translator 1284 may perform such a translation based on configuration values stored in configuration registers 1254. Accordingly, a translation operation performed by address translator may be configurable. This may allow sizes, ranges or other features of different memory type address spaces accessed by a processor 1282 to be changed as needed depending upon device application.

A configuration register 1254 may store configuration values (CFG(s)) that may divide a PMC memory array 1228 into different portions having different response types. In the embodiment shown, configuration values CFG(s) may be provided to both address translator 1284 and PMC array 1224. In the particular configuration show in FIG. 12, PMC memory array 1224 is shown divided into an MTP/OTP-like portion 1202-0, NVM-like portion 1202-1, and a DRAM-like portion 1202-2.

In this way, a same programmable impedance memory array may provide different memory response types for a processor.

Figure 13:
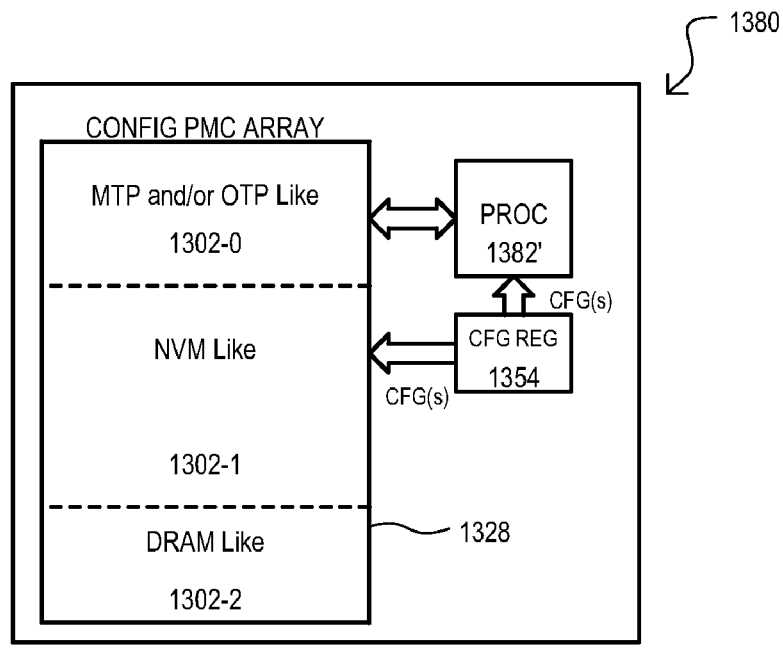
FIG. 13 is a block schematic diagram of a microcontroller device according to another embodiment.

Referring now to FIG. 13, a device according to another embodiment is shown in a block schematic diagram and designated by the general reference character 1380. A device 1380 may be a microcontroller like that of FIG. 12. Microcontroller 1380 may include some of the sections like those of FIG. 12, thus like sections are referred to by the same reference character but with the leading digits being "13" instead of "12".

The embodiment of FIG. 13 may differ from that of FIG. 12 in that a processor 1382' may have a configurable memory access based on configuration values from configuration register 1354. Accordingly, a processor 1382' may base memory accesses, and hence accesses to different memory response types, on configuration values CFG(s).

In this way, a microcontroller may include a processor that accesses an array of the same type of memory elements for different data storage types.

Figure 14:
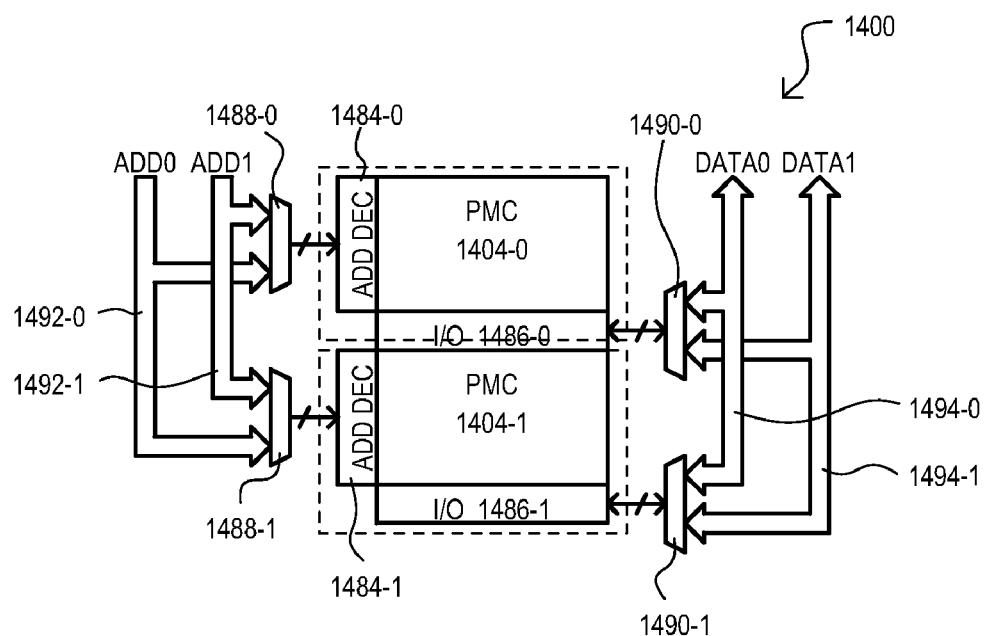
FIG. 14 is a block schematic diagram of a multi-port memory device according to an embodiment.

Referring now to FIG. 14, a memory device according to a further embodiment is shown in a block schematic diagram and designated by the general reference character 1400. FIG. 14 shows an embodiment in which a PMC array can be configured for more than one access path (i.e., can be multi-port). A memory device 1400 may include PMC array sections 1404-0/1, address decoders 1484-0/1, input/output (I/O) circuits 1486-0/1, configurable address ports 1488-0/1, and configurable I/O ports 1490-0/1. In addition, memory device 1400 may include address buses 1492-0/1 and data buses 1494-0/1.

PMC array sections 1404-0/1 may include structures described in other embodiments herein, or equivalents. In particular, such sections may be programmable to a particular response type (e.g., MTP/OTP-like, NVM-like, DRAM-like), while at the same time include PMC memory cells of the same type.

Address decoders 1484-0/1 may decode addresses to thereby enable access to PMC elements within sections 1404-0/1, based on received address values. I/O circuits 1486-0/1 may enable data paths from and to sections 1404-0/1.

Configurable address ports 1488-0/1 may connect one of address buses (1492-0/1) to a corresponding section 1404-0/1 based on configuration information CFGPORT. In a similar fashion, configurable I/O ports 1490-0/1 may connect one of data buses 1494-0/1 to a corresponding section 1404-0/1 also based on configuration information CFGPORT.

In this way, one section (e.g., 1404-0) of a PMC array configured for one type response (e.g., an OTP/MTP-type) may be accessed via one port, while another section (e.g., 1404-1) of the same PMC array configured for another response type (e.g., DRAM-like) can be accessed via a different port.

In this way, a device may have programmable ports to connect to sections of a same memory array programmed for different response types.

The above embodiments have described memory devices with elements programmable to different response types. Some embodiments may include read circuits having different sensing architectures to response type. Examples of such read circuits are shown in FIGS. 15 to 17.

Figure 15:
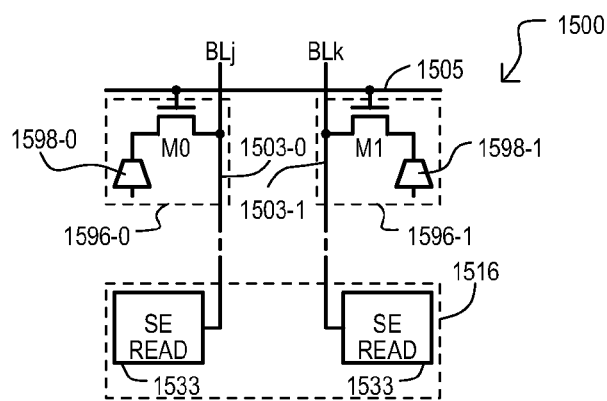
FIG. 15 is a block schematic diagram of a read architecture that may be included in embodiments.

Referring to FIG. 15, a read circuit architecture that may be included in embodiments is shown in block schematic diagram and designated by the general reference character 1500. A read circuit architecture 1500 may include a read section 1516, memory cells 1596-0/1, and bit lines 1503-0/1. Read section 1516 may include single-ended (SE) read circuits 1533-0/1 that may detect a data value based on sensing a current flowing through a corresponding bit line 1503-0/1, or a voltage present on such a bit line.

While memory cells may have different configurations, in the particular embodiment of FIG. 15, each memory cell 1596-0/1 may include one access device M0/M1 and one programmable impedance element 1598-0/1. Access devices M0/M1 may connect corresponding elements 1598-0/1 to bit lines 1503-0/1 according to a select signal on a word line 1505. In the particular embodiment shown, access devices M0/M1 may be n-channel insulated gate field effect transistors (e.g., MOS transistors) and elements 1598-0/1 may be PMCs.

In this way, memory cell elements can be accessed as two separate 1-transistor, 1-element memory cells by reading data from bit lines BLj, BLk separately.

In very particular embodiments, single-ended sensing, like that shown in FIG. 15 may be suitable for response types having a relatively high signal range (i.e., MTP/OTP-like and/or NVM-like).

Figure 16A:
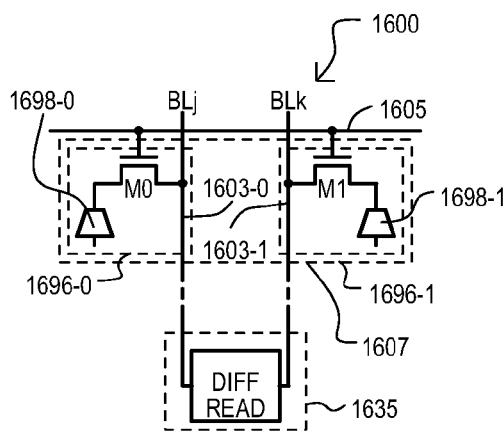
FIGS. 16A and B are block schematic diagrams of other read architectures that may be included in embodiments.
Figure 17:
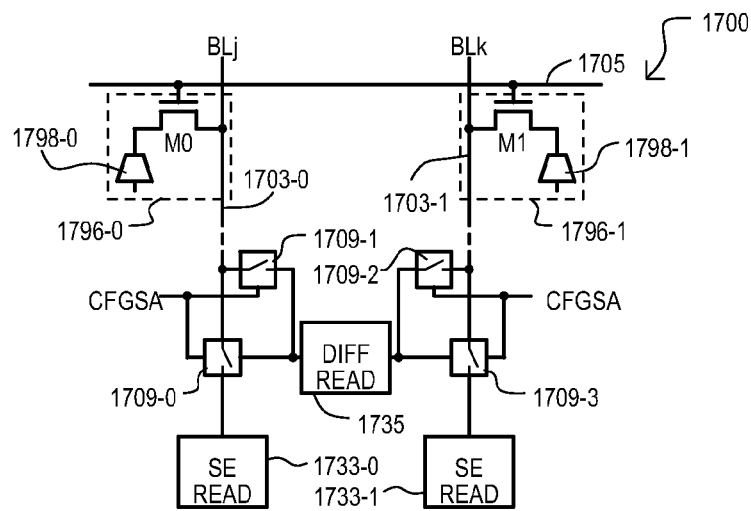
FIG. 17 is a block schematic diagram of a configurable read architecture that may be included in embodiments.

Referring to FIG. 16A, another read circuit architecture that may be included in embodiments is shown in block schematic diagram and designated by the general reference character 1600. A read circuit architecture 1600 may include a differential red circuit 1635, differential memory cell 1607, and bit lines 1603-0/1. A differential read circuit 1635 may detect a data value based on differences between a current flowing through bit lines 1603-0/1, and/or a voltage differential present on such bit lines.

In the embodiment of FIG. 16A, differential memory cell 1607 may include two access devices M0/M1 and two programmable impedance elements 1698-0/1. Like the embodiment of FIG. 15, access devices M0/M1 may be n-channel insulated gate field effect transistors and elements 1698-0/1 may be PMCs. However, elements 1698-0/1 may be intentionally written with different data values. Accordingly, when word line 1605 is activated, signals (e.g., currents, voltages)

of different types may be generated on bit lines 1603-0/1. Such an arrangement may be conceptualized as an SRAM-like sensing arrangement.

In this way, memory cell elements programmed to opposing states can be accessed to generate differential signals for sensing by a read circuit.

In very particular embodiments, differential sensing, like that shown in FIG. 16 may be suitable for response types having a relatively low signal range (i.e., DRAM-like response as described herein).

Figure 16B:
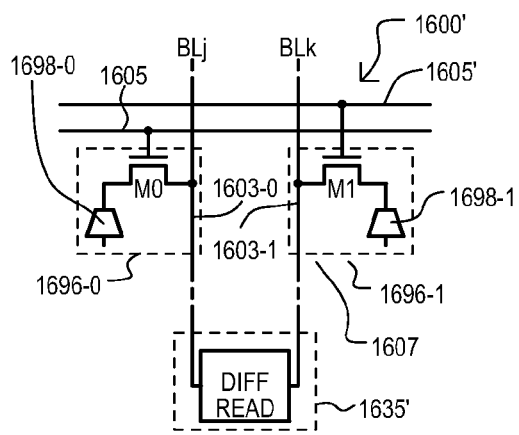

FIG. 16B shows another read architecture that may be included in embodiments. The read architecture is shown in a block schematic diagram, and designated by the general reference character 1600'. An architecture 1600' may include items like those shown in FIG. 16A, and like items are referred to by the same reference character.

Architecture 1600' may differ from that of FIG. 16A in that bit lines may not be connected to different PMC elements in a read operation. Instead, one or more PMC elements may be connected to one bit line (a target bit line), while the other bit line serves as a reference bit line, which can offer same or similar "parasitics" as the target bit line (e.g., inherent capacitance, resistance, etc.).

In the particular embodiment of FIG. 16B, one word line 1605 may be connected to one memory cell 1696-0, while another word line 1605' may be connected to another memory cell 1696-1. In addition, a differential read circuit 1635' may be a more sensitive differential sensing circuit than that of FIG. 16A.

Referring to FIG. 17, another read circuit architecture that may be included in embodiments is shown in block schematic diagram and designated by the general reference character 1700. A read circuit architecture 1700 may be configurable between single-ended and differential type sensing. Read circuit 1700 may include sections like those shown in FIGS. 15 and 16, thus like sections are referred to by the same reference character but with the first two digits being "17" instead of "15" or "16".

Read circuit architecture 1700 may differ from FIGS. 15 and 16 in that it may include switches 1709-0 to 3. Switches 1709-0 to 3 may enable paths from bit lines 1703-0/1 to either differential sense circuit 1735 or single-ended read circuits 1733-0/1 according a configuration data value CFGSA.

In this way, a sensing type (e.g., single-ended or differential) may be selected according to a response type of corresponding programmable impedance elements.

While embodiments may include devices and circuits as shown above, other embodiments may include methods of manufacturing and methods of operating a memory device. Examples of such methods will now be described.

Figure 18:
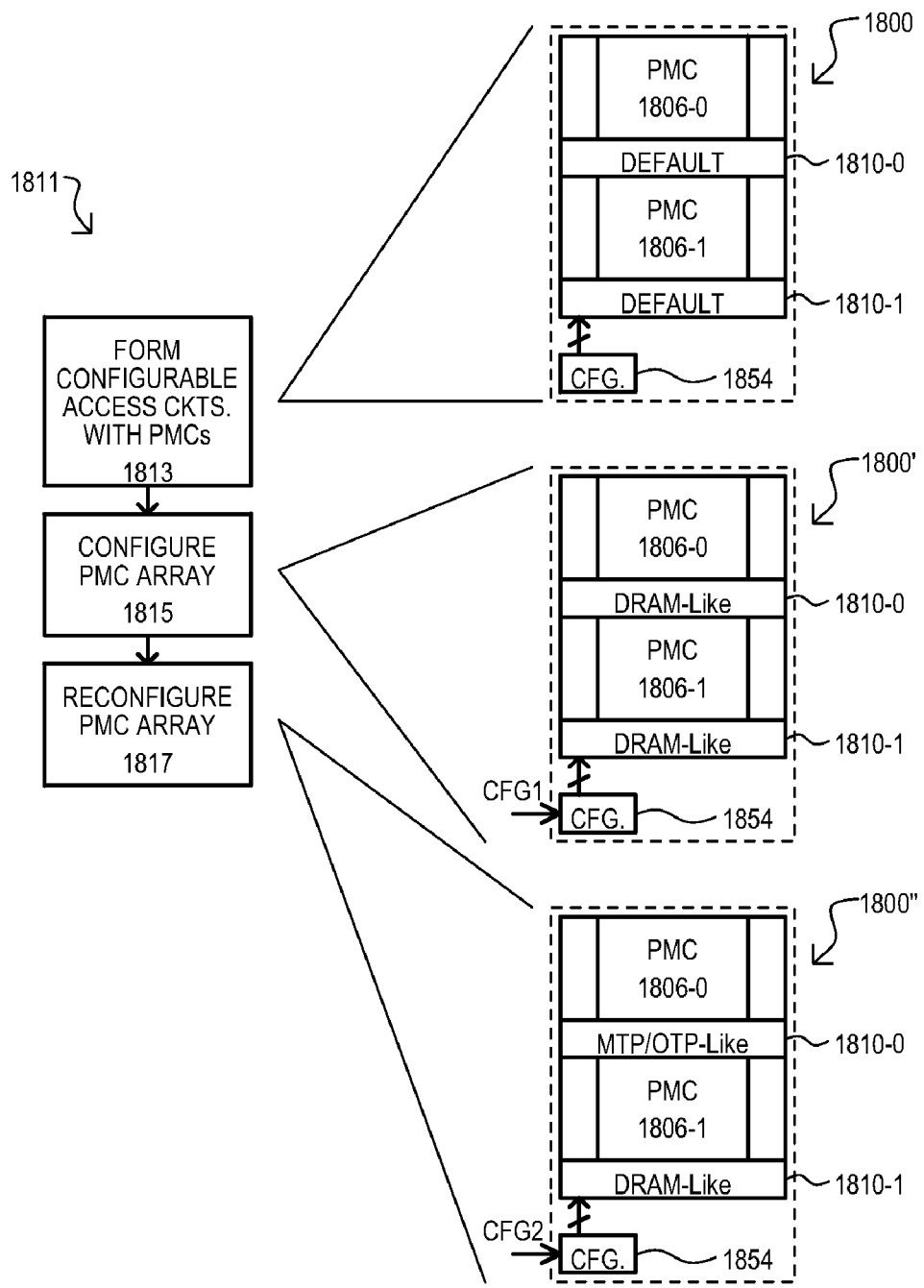
FIG. 18 shows a method according to an embodiment.

Referring to FIG. 18, a method according to one embodiment is shown in a diagram. FIG. 18 includes a flow diagram 1811 along with block diagrams of a memory device (1800, 1800', 1800") following actions described in the flow diagram 1811.

A method may include forming a memory device having configurable access circuits and programmable impedance elements, such as PMCs (step 1813). A memory device following such an action is shown as 1800. Memory device 1800 may include PMC areas 1806-0/1, access circuits 1810-0/1, and configuration registers 1854. PMC areas 1806-0/1 may include PMC elements that can be programmed for different response types (e.g., MTP/OTP-like, NVM-like, DRAM-like).

Access circuits 1810-0/1 may be configurable for the various response types, and may take the form of circuits described herein, and equivalents. Accordingly, configurable access circuits 1810-0/1 may include any of: read circuits, write circuits, address circuits, and/or I/O circuits. In the embodiment of FIG. 18, access circuits 1810-0/1 may be configured according to configuration values provided from configuration registers 1854. In the figure shown, it is assumed that memory device 1800 does not yet stored configuration values, accordingly, access circuits 1810-0/1 may have default configuration (DEFAULT).

A method may also include configuring a PMC array (step 1815). Such a step may include providing configuration information to a memory device that may configure different PMC sections/portions for different response types. Such a step may result in a PMC array being partitioned (or not partitioned) into different portions of different response types. One particular example of a memory device following such an action is shown as 1800'.

Memory device 1800' shows configuration values CFG1 being stored into configuration registers 1854. In response to such configuration values, access circuits 1810-0/1 may both be programmed for DRAM-like responses.

A method may also include re-configuring a PMC array (step 1817). Such a step may include providing configuration information to a memory device that changes one or more PMC sections from one response type to another. One particular example of a memory device following such an action is shown as 1800".

Memory device 1800" shows second configuration values CFG2 being stored into configuration registers 1854. In response to such configuration values, access circuits 1810-0 may be changed to operate with an MTP/OTP-like response, while access circuits 1810-1 may continue to operate with a DRAM-like response.

In particular embodiments, configuration and re-configuration steps may be performed after a memory device has been manufactured.

In this way, a memory device having an array of programmable impedance elements may be configured and re-configured to provide array portions with different memory response types.

Figure 19:
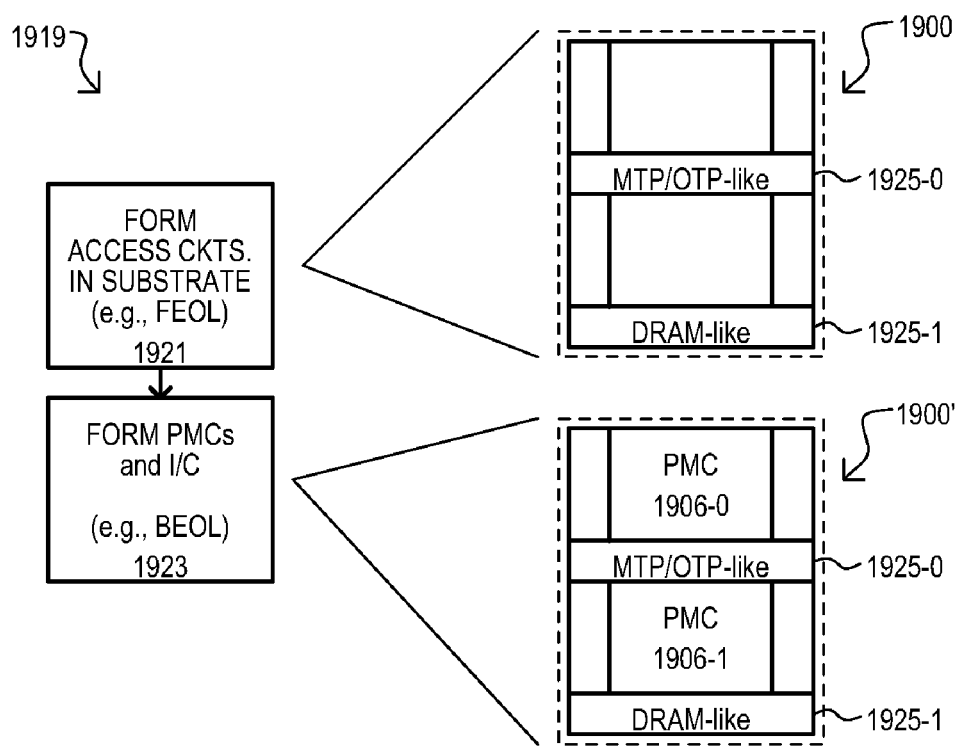
FIG. 19 shows a method according to another embodiment.

Referring to FIG. 19, a method according to another embodiment is shown in a diagram. FIG. 19 includes a flow diagram 1919 along with block diagrams of a memory device (1900, 1900') following actions described in the flow diagram.

A method may include forming access circuits in a substrate (step 1921). Such a step may include establishing differently responding PMC portions based on design information. In some embodiments, a PMC array configuration may be established in a design stage of an integrated circuit. As but one example, intellectual property (IP) blocks may be incorporated into an integrated circuit that may establish a desired response for different portions of a memory array, where such different portions include the same type of storage elements (e.g., PMCs). In such embodiments, it is not anticipated that the various section will be re-configured for another response type.

One particular example of a memory device following a step 1921 is shown as 1900. Memory device 1900 may include access circuits 1925-0/1 formed in a substrate. Such circuits may have little or no re-configurability with respect to memory response type. In one particular embodiment, a step 1921 may be executed at the "front end of line" (FEOL) in an IC manufacturing process. Accordingly, in such an arrangement, circuit manufacturing steps may establish different memory response types. In FIG. 19, access circuits 1925-0 may be manufactured to provide an MTP/OTP-like response, while access circuits 1925-1 may be manufactured to provide a DRAM-like response type.

A method may also include forming programmable impedance elements (e.g., PMCs) as well as interconnect structures (step 1923). Such a step may form memory elements and interconnection structures (e.g., conductive connections between circuit sections) over circuits formed in step 1921.

One particular example of a memory device following a step 1923 is shown as 1900'. Memory device 1900' may now include PMC portions 1906-0/1 formed with access circuits 1925-0/1. In some embodiments, PMC elements may be formed in a same way from device to device, with devices of different configurations being established by previously formed access circuits. In one particular embodiment, a step 1923 may be executed at the "back end of line" (BEOL) in an IC manufacturing process.

In this way, a memory device may establish different response types for different array portions by forming access circuits, while manufacturing memory elements in the substantially the same way in all such portions.

While PMC elements may be programmable between different resistance states, and such resistance values may be detected in read operations, according to other embodiments, PMC elements may be programmed for capacitance changes, and such capacitance values are detected to thereby determine stored data values.

Referring to FIGS. 20(*a*) to 20(*b*), a "fast" program operation is shown that may alter a capacitance of a PMC. Such an operation may or may not alter the resistance of the PMC. A fast program may be faster (i.e., occur in a shorter time period) than a programming operation that ensures a change in PMC resistance.

FIG. 20(*a*) shows a PMC 2000-E in an erased state. A PMC 2000-E may have a resistance RE as well as a capacitance CE with respect to a first terminal 2002 (anode) and a second terminal 2004 (cathode). In a fast program operation, voltage at terminal 2002 (VA) and terminal 2004 (VC) may be varied to accomplish a "fast" program.

FIG. 20(*b*) shows the application of a voltage (VA-VC) across terminals of a PMC in a fast program operation. A pulse, having a positive potential with respect to voltage VA and voltage VC, can be applied to a PMC. A pulse may have a shorter duration than a conventional pulse used to alter a resistance of a PMC. In one very particular embodiment, a pulse may have a duration of about 1 to 100 nanoseconds.

FIG. 20(*c*) shows a PMC 2000-P after a "fast program" operation. PMC 2000-P may now have a capacitance CP that can be different than that in the erased state (CE). For example, in one particular embodiment, a capacitance of the fast programmed state may be greater than that of the erased state (CP>CE). However, in other cases such a capacitance change may be different. A resulting resistance following a fast programming operation RP can be less than or essentially the same as the erased state RE.

Just as a PMC may be fast programmed for a variation in capacitance, such a capacitance change may be reversed or otherwise changed from the fast program state with a fast erase operation.

Referring to FIGS. 21(*a*) to 21(*c*), a "fast erase" operation is shown that may alter a capacitance of a PMC. Such an operation may or may not alter the resistance of the PMC. The operation may be essentially the reverse of that that shown in FIGS. 20(*a*) to 20(*c*), using a negative pulse.

In this way, a PMC may be fast programmed or erased to induce capacitance changes in a PMC, and not necessarily resistance changes, to thereby store a data value.

While embodiments may include PMCs programmed and/or erased for capacitance changes, along with corresponding methods, other embodiments may include memory cells having such PMCs utilized in such a fashion.

Referring to FIG. 22 a memory cell according to an embodiment is shown in a schematic diagram, and designated by the general reference character 2206. A memory cell 2206 may include a PMC 2200, an access device 2208, a word line 2210, a bit line 2212, and a node 2214. A PMC 2200 may be fast programmed and/or fast erased according to the methods described herein and equivalents.

In one particular embodiment, in a fast program operation, a pulse may be applied across terminals of PMC 2200 by maintaining node 2214 at a predetermined voltage, driving bit line 2208 to a positive voltage with respect to node 2214, and enabling (placing into a low impedance) access device 2208 by application of an enable signal on word line 2210. Similarly, in a fast erase operation, a pulse may be applied across terminals of PMC 2200 by maintaining node 2214 at a predetermined voltage, driving bit line 2208 to a negative voltage with respect to node 2214, and enabling access device 2208 by application of an enable signal on word line 2210.

In very particular embodiments, node 2214 may be maintained at a same potential in both a fast program and fast erase operation.

In a read operation, access device 2208 may be enabled by application of a read signal to word line 2210, to connect PMC 2200 to bit line 2212 and thereby place a capacitance on the bit line reflective of the state of the PMC 2200 (e.g., fast programmed or fast erased).

In one very particular embodiment, an access device 2208 may be an n-channel metal-oxide-semiconductor (NMOS) type transistor. Thus, a memory cell 2206 may be a one-transistor (1-T) type cell.

In this way, a memory cell may have an access device to program and/or erase a PMC between different capacitance states, but not necessarily different resistance states.

Referring to FIG. 23, another example of a memory cell according to an embodiment is shown in a schematic diagram, and designated by the general reference character 2306. A memory cell 2306 may include some items like those of FIG. 22, thus like items are referred to by the same reference character but with the first digits being "23" instead of "22".

A memory cell 2306 may differ from that of FIG. 22 in that it may include both a first access device 2308-0 and a second access device 2308-1. First access device 2308-0 may connect bit line 2312 to PMC 2300 according to a signal on word line 2310. Second access device 2308-1 may connect a cathode of PMC 2300 to a cell output 2316 according to a select signal SEL.

A PMC 2300 may be fast programmed and/or erased in the fashion described above. However, in some embodiments a voltage applied at cell output 2316 may be different in fast program and erase operations.

In a read operation, access devices 2308-0/1 may both be enabled to thereby connect PMC 2300 to sensing circuits by both an anode terminal and a cathode terminal. This may enable a capacitance of PMC 2300 to be measured and hence its stored data value to be determined.

In one very particular embodiment, access devices 2308-0/1 may both be NMOS type transistors.

In this way, a memory cell having a PMC programmed to different capacitance states may be accessed via both an anode and cathode terminal to determine a capacitance value.

While embodiments may include memory cells and methods having PMCs programmed and/or erased for capacitance changes, other embodiments may include memory devices composed of such cells.

Referring to FIG. 24, an example of a memory device according to an embodiment is shown in a block schematic diagram and designated by the general reference character 2418. A memory device 2418 may include a number of memory cells (two shown as 2406-0/1) connected to word lines (two shown as 2410-0/1) and bit lines (one shown as 2412), as well as a capacitance sense circuit 2420.

Memory cells 2406-0/1 may have structures like those shown in the embodiments described herein, or equivalents.

A capacitance sense circuit 2420 may be connected, directly or indirectly, to a selected memory cell (e.g., 2406-0/1) by a corresponding bit line (e.g., 2412) to sense a capacitance of a PMC within such a selected cell. In some embodiments, a capacitance sense circuit 2420 may compare a capacitance of an accessed cell (Ccell) to a predetermined threshold capacitance value (Cth) to determine a stored data value. In one particular embodiment, if a cell capacitance Ccell is determined to be greater than a threshold value Cth, the memory cell can be determined to store one data value DATA 0. If a cell capacitance Ccell is determined to be less than a threshold value Cth, the memory cell can be determined to store another data value DATA 1.

It is noted that such capacitance sensing is in contrast to resistance sensing.

In this way, a memory device may include a capacitance sense circuit that senses capacitance changes in PMC elements of selected memory cells.

While a capacitance value of a PMC may be sensed for binary data, other embodiments may include multiple bit data states. FIG. 25 is a graph showing one particular example of how a cell capacitance (Ccell) may store more than two data states (in this case four data states).

In this way, a PMC device may be programmed or erased to more than two different capacitance values to store more than two data states.

While embodiments above have shown configurations in which a capacitance of a single PMC may be sensed to determine a stored data value, in other embodiments, a capacitance of multiple PMCs may be sensed. One particular embodiment of such an arrangement is shown in FIG. 26.

Figure 26:
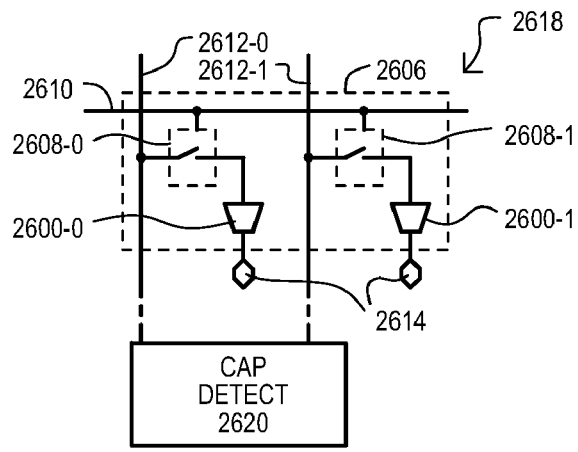
FIG. 26 shows a memory device according to another embodiment.

Referring to FIG. 26, a memory device according to an embodiment is shown in a schematic diagram, and designated by the general reference character 2618. A memory device 2618 may include a number of memory cells (one shown as 2606) connected directly or indirectly to a capacitance sense circuit 2620. A memory cell 2606 may include PMCs 2600-0/1, access devices 2608-0/1, a word line 2610, bit line pair 2612-0/1, and a node 2614.

Within memory cell 2606, PMCs 2600-0/1 may be programmed to different values (e.g., one fast programmed, one fast erased, both fast programmed, or both fast erased). Such multiple states may be detected by capacitance sense circuit 2620 to provide a single data output value.

In this way, a memory device may include memory cells with multiple PMCs, and may detect stored data values for the memory cell by sensing capacitance values of such multiple PMCs.

Embodiments herein have described sensing a capacitance of one or more PMCs. A capacitance may be determined by any number of suitable techniques. Two possible capacitance sensing arrangements that may be included in embodiments are shown in FIGS. 27A and 27B.

Figure 27A:
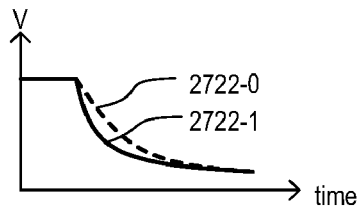
FIGS. 27A and 27B are graphs showing capacitance detect methods that may be included in embodiments.

Referring to FIG. 27A, one way of determining a capacitance of a PMC according to an embodiment is shown in a graph. In the sensing of FIG. 27A, a voltage (V) can be presented across the PMC and then removed. How fast the voltage discharges can vary according to PMC capacitance. FIG. 27A shows two responses 2722-0/1 representing different responses of a PMC according to state (e.g., fast programmed or fast erased).

Figure 27B:
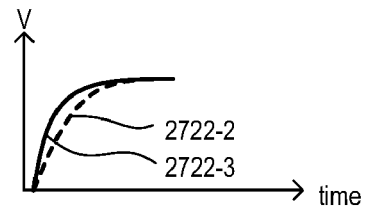

Referring to FIG. 27B, another way of determining a capacitance of a PMC according an embodiment is shown in graph. A voltage can be presented across the PMC. How fast the PMC charges can vary according to the capacitance of the PMC. FIG. 27B shows two responses 2722-2/3 representing different responses of a PMC according to state (e.g., fast programmed or fast erased).

In this way, a capacitance of a fast programmed and/or erased PMC may be sensed by a difference in a charge and/or discharge rate of the PMC.

Figure 28:
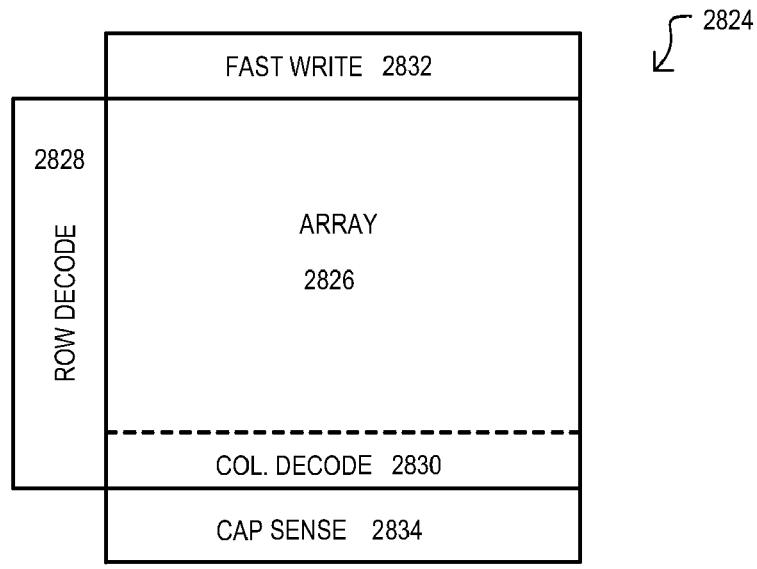
FIG. 28 shows a memory device according to an embodiment.

Referring now to FIG. 28, a memory device architecture according to an embodiment is shown in a block and designated by the general reference character 2824. A memory device 2824 may include an array 2826, a row decoder 2828, a column decoder 2830, "fast" write circuits 2832, and a capacitance sense section 2834.

An array 2826 may include memory cells having PMCs that may be fast programmed and/or fast erased as described herein, or equivalents. Memory cells of array 2826 may be accessed by a row decoder 2828 and column decoder 2830. In one embodiment, row and column decoders (2828 and 2830) may access memory cells by decoding received address values, and thereby connect such memory cells to fast write circuits 2832 or capacitance sense section 2834.

A fast write circuit 2832 may write data values into PMCs by altering their capacitance, and not necessarily their resistance. In one embodiment, a fast write circuit 2934 may apply fast program and/or fast erase pulses to PMCs to establish data states in such PMCs as described herein, or equivalents.

A capacitance sense circuit 2834 may be a read circuit that determines capacitances of accessed PMCs to thereby determine a stored value. A capacitance sense circuit 2834 may include sensing approaches described herein, as well as any conventional sensing approaches suitable for distinguishing between the different capacitances of PMCs.

Embodiments of FIGS. 21(a) to 28 show arrangements in which changes may be made in a PMC's inherent capacitance without necessarily relying or inducing a change in resistance of the PMC. This is in contrast to approaches that rely on altering a PMC resistance to thereby establish a data state.

Sensing and storing data values according to PMC changes in capacitance may provide devices with increased PMC endurance. Embodiments having fast erase and program operations may reduce stress on the PMC and so may deliver better endurance than devices that force large resistance changes.

Because fast program and/or erase pulses may be shorter than resistance changing pulses, write speeds according to the embodiments may be faster than approaches relying on resistance changes.

While conventional capacitor based DRAMs may utilize capacitors to store (or not store) charge, such devices to not vary a capacitance of their storage elements. In contrast, embodiments described herein may change the capacitance of the storage element (e.g., PMC). Approaches like this, that may change an actual capacitance of the element, may not require refresh that repeatedly charges a storage capacitor to ensure a data value is not lost. Capacitance may be retained by a PMC in an essentially nonvolatile fashion for a period of time. Alternatively, in some embodiments, it may be desirable to periodically re-establish the capacitance state of the PMC with periodic re-writing. However, the frequency of such re-writing may be considerably less (e.g., orders of magnitude) than that of a DRAM refresh time.

While PMC elements may be programmable for different response types, including changes in capacitance and/or changes in resistance, in other embodiments such differences may be utilized for error marking of defective elements.

Referring now to FIGS. 29(a) to 29(c) a method of error marking according to an embodiment is shown in a series of block diagrams.

FIG. 29(a) shows a programming of one data value into elements of a PMC array 2900. In the example shown, a programmed state will represent a data "1". A write circuit 2902 can program PMCs (one shown as 2904) in PMC array 2900. Programming can change an impedance of a PMC (e.g., 2904) from one impedance state (i.e., high impedance) to another impedance state (i.e., relatively lower impedance)

FIG. 29(b) shows a reading of data from PMC array 2900 to determine if a programming operation has been successful. In the example shown, one PMC (2904) is defective, and so does not retain a programmed state. Accordingly, a read operation by a read circuit 2906 yields a "0" for the defective PMC 2904.

FIG. 29(c) shows how a defective PMC 2904 may be marked as defective according to an embodiment. Write circuit 2902 may "over-program" the defective PMC 2904. An over-programming operation can change an impedance of a defective PMC 2904 outside of a range of those utilized for standard data values. In particular, over-programming can put a PMC into an impedance substantially lower than a normally programmed PMC. Further, an over-programmed PMC may be permanently placed into a particular impedance state (i.e., it may not be erased back to a high impedance state).

In this way, a PMC may be marked as defective by writing to the PMC to force its impedance outside a range of those impedances used to store data values in functional PMCs.

Marking a defective PMC with an over-programming operation may allow error corrections to occur when reading a data group that includes such a marked PMC. One example of such an arrangement is shown in FIGS. 30(a) to 30(c).

FIG. 30(a) shows a read operation from a PMC array 2900 following an over-program operation directed to defective a PMC (2904). Reading from over-programmed PMC 2904 by a read circuit 2906 may yield a result outside of normal data value levels (e.g., impedance is too low or too high to be a valid data value).

FIG. 30(b) shows a read data output operation. A read circuit 2906, having detected the over-programmed cell, may not output data from the defective over-programmed PMC (or otherwise discard such data).

FIG. 30(c) shows a read data output operation example for comparison to that of FIG. 30(b). In FIG. 30(c), no PMCs have been marked by an over-program operation. Accordingly, a read circuit 2906 may not prevent or otherwise discard data values from any of the PMCs from PMC array 2900'.

While embodiments have shown marking a defective PMC with an over-programming operation, other embodiments may utilize over-erasing to mark a defective PMC. One example of such an arrangement is shown in FIGS. 31(a) to 31(c).

An over-erase operation can change an impedance of a PMC outside of those utilized for normal data values. In particular, over-erasing can put the PMC into an impedance state substantially higher than a normally erased PMC. Over-erasure may permanently place a PMC into such a high impedance state.

FIG. 31(a) shows a programming of one data value into elements of a PMC array 3100. In the example shown, a programmed state will represent a data "1". A write circuit 3102' can program PMCs (one shown as 3104) in PMC array 3100. In one embodiment, programming can occur as described for FIG. 29(a).

FIG. 31(b) shows a reading of data from PMC array 3100 to determine if a programming operation has been successful. In the example shown, a read operation may occur as described for FIG. 29(b). Such read operation determines the PMC 3104 is defective.

FIG. 31(c) shows how a defective PMC 3104 may be marked as defective according to an embodiment. Write circuit 3102' may over-erase the defective PMC 3104. An over-erase operation may change an impedance of a defective PMC 3104 outside of a range of those utilized for standard data values.

Figure 32:
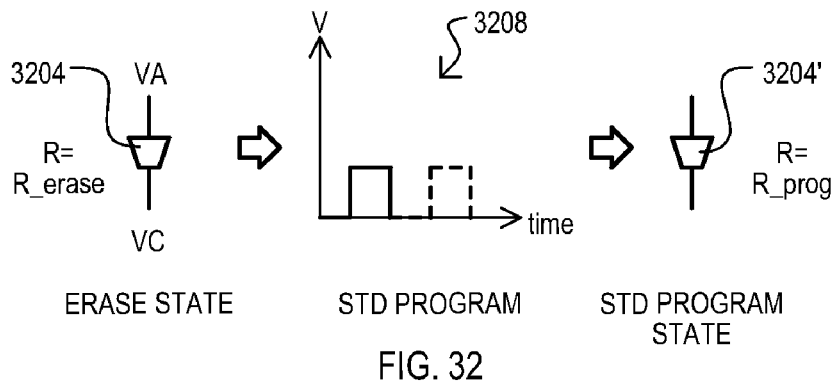
FIG. 32 shows a standard programming operation that may be included in the embodiments.

Referring to FIG. 32, a standard programming operation that may occur in embodiments is shown in a series of diagrams. An erased PMC 3204 may have an erase resistance R_erase. In particular embodiments, such a resistance may be about 1 MΩ. A standard programming operation, represented by a graph 3208, may apply a positive voltage with respect to an anode voltage VA and cathode voltage VC. A standard program operation may have pulses with a predetermined amplitude. One or more pulses can be applied. Following a standard programming operation 3208, an erased PMC may become a programmed PMC 3204'. A programmed PMC 3204' may have a programmed resistance R_prog that is less than an erase resistance R_erase. In one very particular embodiment, a programmed resistance R_prog may be about 10-50 kΩ.

Figure 33:
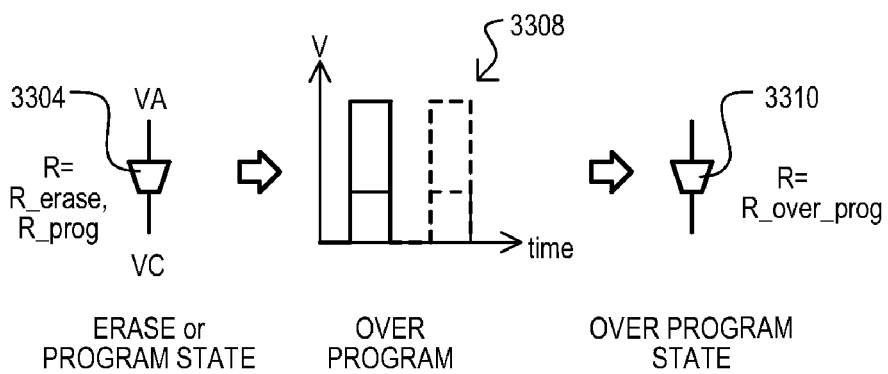
FIG. 33 shows an over-programming operation that may be included in the embodiments.

Referring to FIG. 33, an over-programming operation that may occur in embodiments is shown in a series of diagrams. A standard state PMC 3304 may have a programmed or erased state, as described above in FIG. 32. An over-programming operation, represented by graph 3308, may apply a positive voltage with respect to an anode voltage VA and cathode voltage VC to a standard state PMC 3304. An over-programming pulse may have an amplitude that is larger than that used in standard programming. One or more such high amplitude pulses can be applied. An over-programming operation 3308 may form an over-programmed PMC 3312 having an over-programmed resistance R_over_prog that is less than a programmed resistance R_prog. In one embodiment, an over-programmed resistance R_over_prog may be about 300Ω, substantially less than that of a programmed PMC (e.g., 3204').

Figure 34:
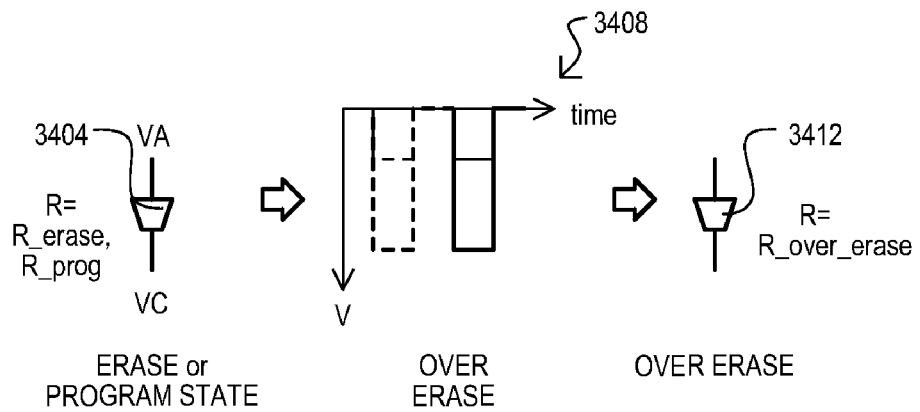
FIG. 34 shows an over-erasing operation that may be included in the embodiments.

Referring to FIG. 34, an over-erasing operation that may occur in embodiments is shown in a series of diagrams. A standard state PMC 3404 may have a programmed or erased state, as described above in FIG. 32. An over-erasing operation, represented by graph 3408, may apply a negative voltage with respect to an anode voltage VA and cathode voltage VC to a standard state PMC 3404. An over-erasing pulse may have an amplitude that is larger than that used in a standard erase operation. One or more such high amplitude pulses can be applied. An over-erasing operation 3408 may form an over-erased PMC 3412 having a resistance R_over_erase that is greater than a standard erase resistance R_erase. In one embodiment, a over-erase resistance R_over_erase may be about a few mega-ohms to a few hundred mega-ohms.

While in one embodiment an over-program operation may be used to mark a PMC as failed, in other embodiments it may be desirable to mark a failed PMC with an over-erase operation. In yet other embodiments it may be desirable to mark some failed PMCs with over-programming, and mark other failed PMCs with over-erasing according to the type of failure of PMC (i.e., failure to program or failure to erase).

Figure 35:
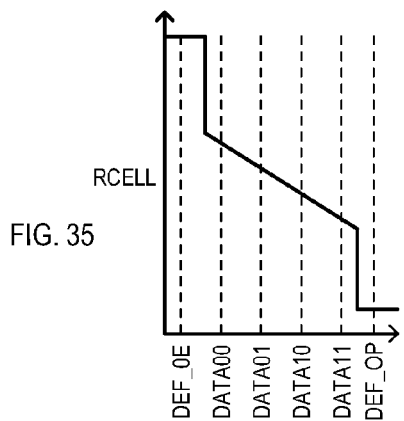
FIG. 35 shows multi-level memory cell programming and defective marking according to an embodiment.

Referring to FIG. 35, a graph is shown that represents how over-erase and over-program levels may be used in conjunction with multi-level PMC devices. A PMC uresistance RCELL can have a range that represents more than two stored data values. In the example shown, such data values include four data values: DATA00, DATA01, DATA10 and DATA11, each corresponding to increasingly lower resistance states. Along with such data states, PMCs may also be over-erased to an over-erase level (DEF_OE), which may have a substantially higher resistance than a data state DATA00. In addition or alternatively, PMCs may also be over-programmed to an over-programmed level (DEF_OP), which may have a substantially lower resistance than a data state DATA11.

Figure 36:
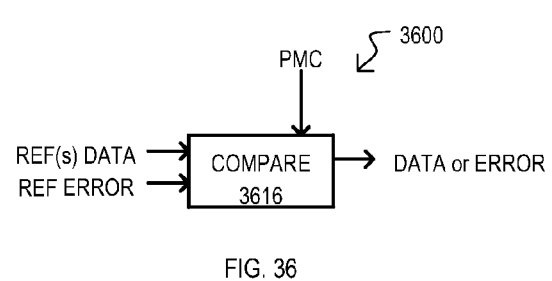
FIG. 36 shows a read circuit that may be included in an embodiment.

Referring to FIG. 36, a read circuit according to one embodiment is shown in a block diagram 3600. A read circuit 3600 can have a compare circuit 3616 that may compare an impedance of an accessed PMC to determine if the PMC has one value, or has value outside of normal levels (i.e., is marked as defective). A compare circuit 3616 may compare a PMC value (e.g., voltage or current) to at least one data reference level REF(s) DATA to determine a stored data value. In addition, a compare circuit can compare a PMC value to one or more error levels REF ERROR to determine if a PMC has been marked as defective. According to such a comparison, a compare circuit 3616 may output a data value DATA, or an error indication ERROR.

Figure 37A:
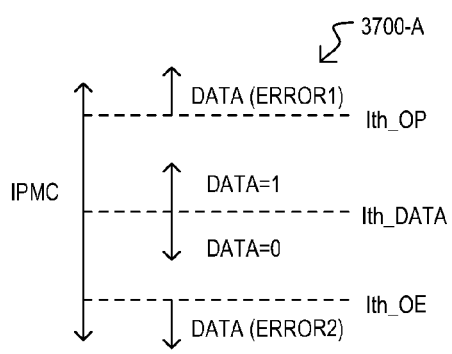
FIGS. 37A and 37B show data measurement methods that may be included in embodiments.

Referring to FIG. 37A, one example of a current measurement method for a read circuit of according to one embodiment is shown in a graph 3700-A. Graph 3700-A shows a current IPMC that may be generated through a PMC. In the very particular example shown, a current IPMC may be compared against three different current thresholds: Ith_OP, Ith_DATA and Ith_OE.

Between a first current threshold (Ith_DATA) and a high current threshold (Ith_OP), a measurement may be a valid data value of "1". Between the first current threshold (Ith_DATA) and a low current threshold (Ith_OE), a measurement may be a valid data value of "0".

Above a high threshold (Ith_OP) an accessed PMC can be considered defective. In addition or alternatively, below a low threshold (Ith_OE) an accessed PMC can be considered defective. Detection of such a substantially high impedance value of a PMC may utilize circuits for suitable for sensing such a high impedance values.

Figure 37B:
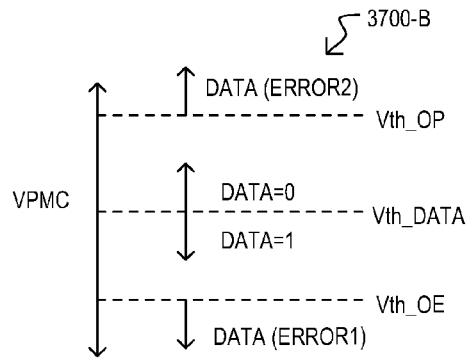

FIG. 37B, one example of a voltage measurement for a read circuit according to another embodiment is shown in a graph 3700-B. Graph 3700-A shows a voltage VPMC that may be generated across a PMC. In the very particular example shown, a voltage VPMC may be compared against three different voltage thresholds: Vth_OP, Vth_DATA and Vth_OE.

Measurement of FIG. 37B, may follow the same general approach as FIG. 37A, however a voltage across a PMC (VPMC) can be measured by a compare circuit instead of a current.

Figure 38:
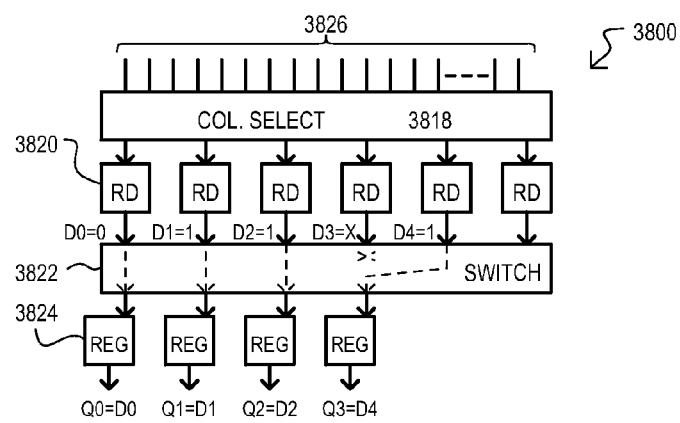
FIG. 38 shows a memory device data read operation with data correction according to an embodiment.

Referring to FIG. 38, an example of a memory device that may include automatic error correction is shown in a block diagram and designated by the general reference character 3800. A memory device 3800 may include bit lines 3826, a column select circuit 3818, a number of read circuits (one shown as 3820), a switch circuit 3822, and a number of output registers (one shown as 3824).

Bit lines 3826 may be form part of a PMC array, and may connect to PMCs to thereby allow data values to be read from such PMCs. A column select circuit 3818 may connect bit lines 3826 to read circuits (e.g., 3820). Read circuits (e.g., 3820) may detect output data values based on detect current and/or voltages of an accessed PMC. If a reading is outside of a normal limit (i.e., the PMC is marked as defective), the read circuit can output a special value. In the very particular example of FIG. 38, data value D3=X has such a special value, and so is to be considered defective. A read circuit (e.g., 3820) may output a special value as a data value, or as a separate signal. In embodiments that may be marked with both over-erase and over-program, there may be one special value corresponding to both over-programmed and over-erased PMCs. Alternatively, other embodiments may include one special value for an over-programmed PMC, and another special value for an over-erased PMC.

In response to a special value (e.g., D3=X), a switch circuit 3822 may prevent data value D3 from being output to an output register (e.g., 3824).

Figure 39A:
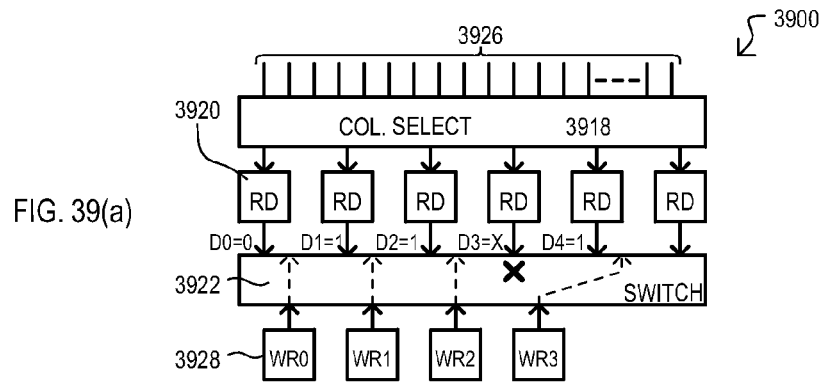
FIGS. 39(a) and 39(b) show a memory device write operation that may avoid defective locations according to an embodiment.
Figure 39B:
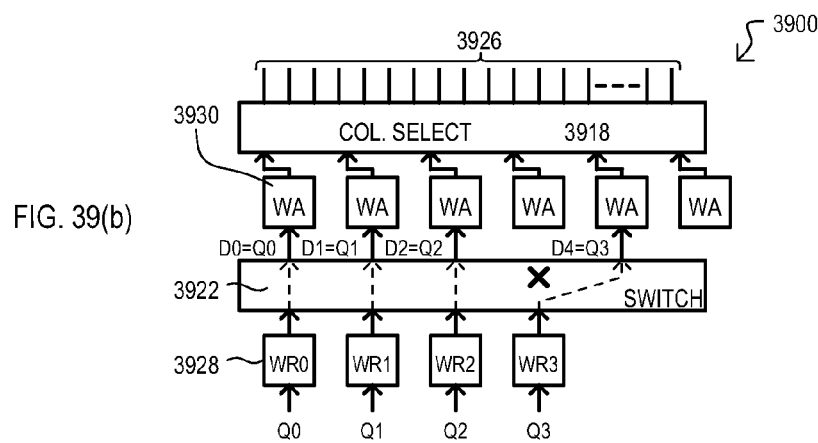

Referring to FIGS. 39(a) and 39(b), an example of a memory device that may automatically ignore defective locations in a write operation is shown in a block diagram and designated by the general reference character 3900. A memory device 3900 may include sections like those shown in FIG. 38. Like section are referred to by the same reference character but with the first two digits being "39" instead of "38". FIGS. 39(a) and 39(b) differ from FIG. 38 in that a memory device 3900 may include write registers (one shown as 3928) and write amplifiers (one shown as 3930).

FIG. 39(a) shows a read operation as described above in FIG. 38 that can precede the writing of data. In response to a detection of defective data value (e.g., D3=X), a switch circuit 3922 may enable switch paths through write registers (e.g., 3928) that may bypass a path to a defective PMC location. In the particular example shown, a write path between from write register WR3 to data input D4 may be enabled, thereby bypassing a write path to a data input D3 (which corresponds to the defective PMC location).

FIG. 39(b) shows the application of write data to bit lines 3926 of a memory array. Unlike FIG. 39(a), FIG. 39(b) shows write amplifiers (one as 3930) that may drive bit lines 3926 to write data values according to received data values Q1 to Q3. Due to configuration of switch circuit 3922 described above for FIG. 39(a), data value Q3 may be written to input D4 in lieu of D3, thus avoiding a defective location. In the example shown, such data writing progresses by skipping one bit to the right.

Figure 40A:
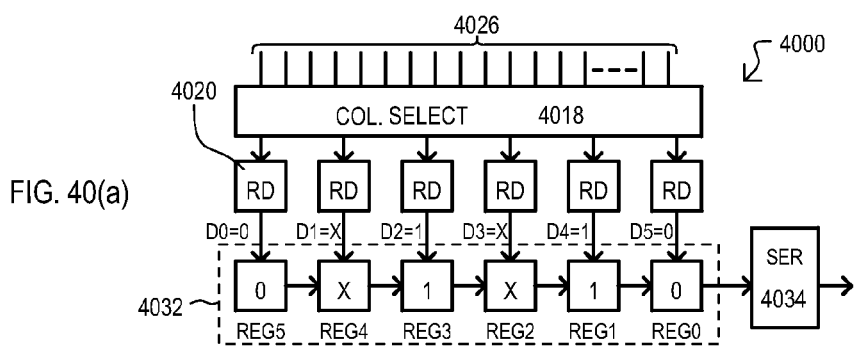
FIGS. 40(a) and 40(b) show a memory device data read operation with error correction according to another embodiment.
Figure 40B:
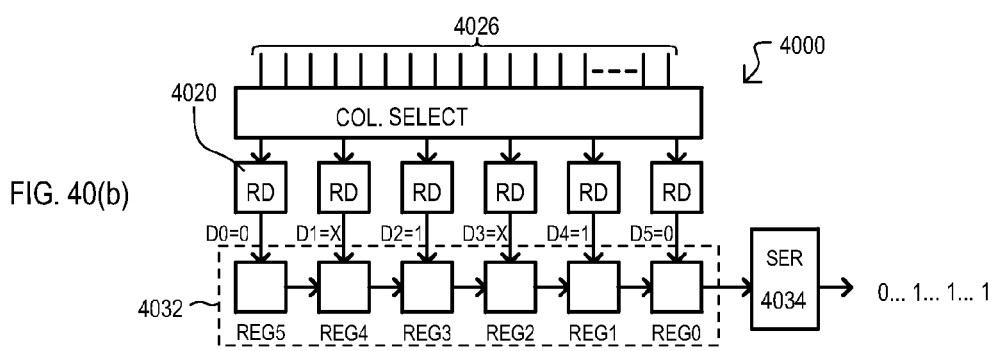

Referring to FIGS. 40(a) and 40(b), another example of a memory device that may automatically ignore defective locations is shown in a block diagram and designated by the general reference character 4000. A memory device 4000 may include sections like those shown in FIG. 38. Like section are referred to by the same reference character but with the first two digits being "40" instead of "38". FIGS. 40(a) and 40(b) differ from FIG. 38, in that a memory device 4000 may include serial registers 4032 and a serializer circuit 4034.

FIG. 40(a) shows the reading of data into output registers. However, unlike the embodiment of FIG. 38, output registers may be serial registers 4032. Serial registers 4032 may be registers connected in a serial manner. However, as in the case of FIG. 38, a data value may be detected as being defective if it is over-programmed or over-erased. In the particular example of FIG. 40(a), data values D1=X and D3=X are both indicated as defective. However, value indicating such bad locations are still loaded into output registers, unlike the arrangement of FIG. 38.

FIG. 40(b) shows a serializer circuit 4034 that may output data in serial registers 4032 in a serial fashion. However, serializer circuit 4034 may not output defective values (e.g., values "X"). Thus, while data values may be in serial registers 4032 as 0, X, 1, X, 1, 0, such values may be output from serializer circuit 4034 as 0, 1, 1, 0, ignoring the defective bits.

Referring to FIG. 41, a method according to an embodiment is shown in a flow diagram. FIG. 41 shows a method in which, if a write operation cannot be completed, or a PMC is not writable, a resistance of the un-writable PMC may be set outside of normal data value limits.

Referring to FIG. 42, a method according to another embodiment is shown in a flow diagram. In FIG. 42, if a PMC is not programmable, it is subject to an over-program operation to mark it as defective. If the over-program operation does not work (i.e., the defective PMC may not be over-programmed), the same defective PMC may be subject to an over-erase operation. If that operation does not work, an alternate error correction technique can be used to address the defect (e.g., column redundancy, row redundancy, ECC code accessed with data, sector replacement, etc.).

Referring to FIGS. 43A and 43B, additional methods are shown in flow diagrams. In these methods, a PMC may be overstressed (i.e., over-programmed or over-erased) in the opposite direction of its failed write state. Referring to FIG. 43A, in the method shown, if a PMC is not programmable (its resistance cannot be lowered enough), it may be over-erased (its resistance is set permanently or semi-permanently to a very high value).

Referring to FIG. 43B, in the method shown, if a PMC is not erasable (its resistance cannot be raised high enough), it may be over-programmed (its resistance is set permanently or semi-permanently too a very low value).

Referring to FIG. 44, a read method according to one embodiment is shown in a flow diagram. In the method of FIG. 44, if a PMC resistance is outside of a predetermined range, its data is replaced with that of another PMC. For example, if a PMC resistance is too low (e.g., it is over-programmed), or too high (e.g., it is over-erased) its data value is ignored. In such away, defective data locations may be bypassed in a read operation.

In the embodiment shown in FIGS. 29-44, defective PMC memory cells may be addressed without necessarily having to disable an entire column and/or row containing the defective memory cell. In many conventional repair approaches, such as conventional DRAMs and SRAMs, if a memory cell is defective, and entire row or column containing such a memory cell may be replaced. Accordingly, increasing redundancy capabilities can have a substantial impact on device size. The embodiments shown need not disable an entire row or column, as a single cell may be identified as defective in a read operation. Accordingly, such embodiments may provide redundancy without adversely impacting device size.

In a similar fashion, embodiments described above need not disable an entire sector to address defective cells. In some conventional NAND flash device, entire sectors are disabled to address defective cells. Again, the embodiment above may replacement defective cells without substantial cost in usable memory that would occur in a conventional "by-sector" replacement approach.

In some conventional memory approaches, memories may include error correction codes (ECC) for defective words/data. Such ECC codes may be stored with actual data, and then utilized to account for errors stored data. Such approaches may rely on error code generation circuits. While some embodiments described herein may include ECC codes, other embodiments may address defects without such codes, avoiding the substantial circuit area/processes to generate and store error correction codes.

The embodiments described above may utilize states that may be avoided in conventional PMC devices. Conventional PMC approaches may seek to avoid over-program and/or over-erase conditions. Embodiments described herein may leverage undesirable states for useful application.

Embodiments described herein may provide for automatic error detection and correction without specialized repair processes. Some conventional error correction approaches may require fusible links or other post fabrication steps to enable redundancy. Approaches shown in embodiment above may include circuits that automatically detect and then avoid defective PMCs, without post fabrication steps.

In embodiments described herein, error detection and correction may be done "on the fly" (i.e., dynamically during the operation of the device). For example, a PMC cell may appear fully function during testing but then fail while in the field (i.e., used in an application). Using the above methods and circuits of embodiments, a defective bad PMC cell may be marked during program and thus eliminated from future use.

As noted above, some embodiments may include suitable ECC circuits and/or methods. The above methods and circuits according to the embodiments may be used in combination with such existing ECC circuits/methods, thus reducing the use of such circuits or size of such circuits.

Referring now to FIGS. 45 to 48D, additional methods and circuits for writing data values to PMCs according to embodiments will be described.

Figure 45:
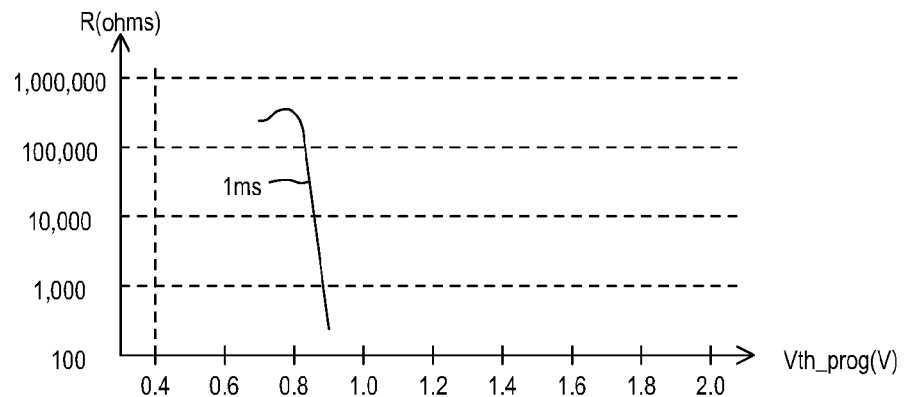
FIG. 45 shows a "slow" program operation.

Referring to FIG. 45, a graph shows a relationship between write pulse width, program threshold voltage Vth_prog, and programmed resistance (R). A write pulse can be a voltage or current pulse applied across terminals of a PMC element. A program voltage (Vth_prog) can be a voltage at which a PMC element transitions from one impedance (i.e., relatively high) to another impedance (i.e., relatively low) in response to a write pulse. It is understood that a reverse polarity pulse can be an erase pulse that can cause a change to an erase state at, or about, an erase voltage (Vth_erase).

At DC or close to DC levels (relatively long slow pulse widths), a program threshold voltage (Vth_prog) of a PMC element can be relatively low with respect to many conventional signal voltages. For the purposes of this disclosure, DC levels can be pulse widths having a duration of about 1 ms or longer. As shown in FIG. 45, at DC levels a program threshold voltage can be about 0.8 volts. Such a low program voltage can be undesirable as it may require a relatively low read voltage level (e.g., 0.1 volts). A read voltage is typically a low voltage, because if a read voltage is too high, it may unintentionally program a PMC element (a phenomenon sometimes referred to read "disturb").

At low read voltage levels (i.e., 0.1 volts), it may be difficult to reliably detect a PMC state, as such low voltage levels signals may be more susceptible to noise, or other voltage altering effects within an integrated circuit.

Figure 46:
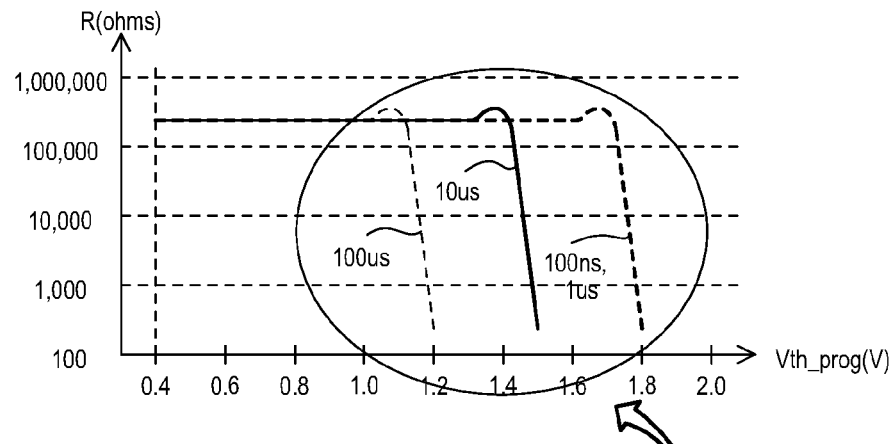
FIG. 46 shows a "fast" program operation according to an embodiment.

Referring to FIG. 46, another graph shows a relationship between write pulse width and a program voltage Vth_prog according to an embodiment. In FIG. 46, write pulses may be at "AC" speeds (as opposed to a DC speed, like that of FIG. 45).

As shown in FIG. 46, at AC levels a program threshold voltage (Vth_prog) may be higher than a DC approach. For example, at program pulses of 100 microseconds (us), 10 us, 1 us and 0.1 us, a program voltage (Vth_prog) may be about 1.1 volts, 1.4 volts, 1.7 volts and 1.7 volts, respectively.

Accordingly, by using such programming voltages, greater margins can be created for read operations, as higher read voltages can be applied in a read operation.

Figure 47:
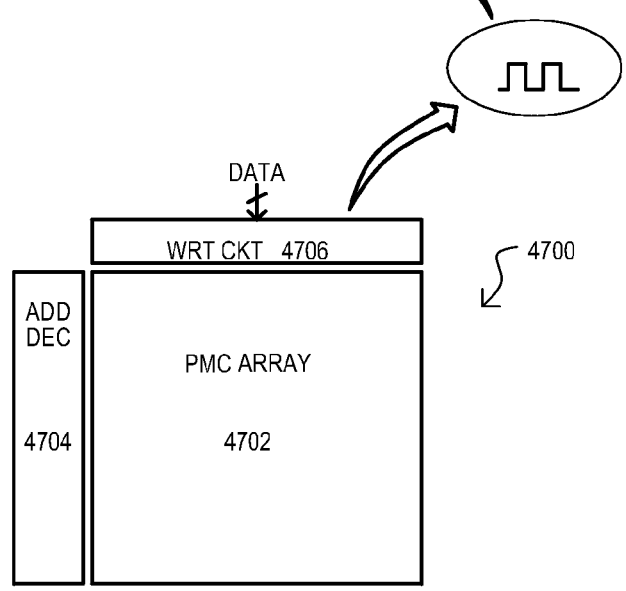
FIG. 47 shows a memory device that may fast program according to an embodiment.

Referring to FIG. 47, a memory device according an embodiment is shown in a block schematic diagram, and designated by the general reference character 4700. A memory device 4700 may include a PMC array 4702, an address decoder 4704, and a write circuit 4706. A PMC array 4702 may include PMC memory cells that each include one or more PMC elements.

An address decoder 4704 may access PMC memory cells in response to a received address. Such accesses can apply program voltage or current pulses across PMC elements in a program operation.

A write circuit 4706 may apply program pulses in a data program (or write) operation, to thereby change an impedance of an accessed PMC element depending upon received write address data (DATA). As shown by arrows in FIG. 47, a write circuit 4706 may apply pulses according to the AC conventions noted above in FIG. 46, or equivalents. Thus, it is understood that a write circuit 4706 may apply write pulses having durations noted in FIG. 46.

Figure 48A:
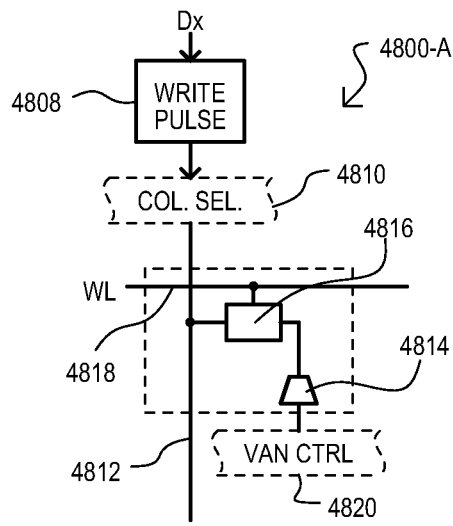
FIGS. 48A to 48D are block schematic diagrams showing circuits that may perform fast write operations according to embodiments.

Referring to FIG. 48A, one very particular example of a circuit for generating a write pulse across a PMC element according to an embodiment is shown in a block schematic diagram. A circuit 4800-A may include a write pulse circuit 4808 that may generate a pulse having a duration noted in above embodiments (i.e., AC speeds). Such a pulse may be applied by way of a column select circuit 4810 to a bit line 4812. A bit line 4812 may be connected to a cathode of a PMC element 4814 by an access device 4816. Access device 4816 may be enabled by a word line WL 4818. An anode control circuit 4820 can apply a voltage to an anode of PMC element 4814, to thereby create a write pulse across the PMC element 4814. An anode voltage can be a constant voltage, or may be a voltage that varies over time.

Figure 48B:
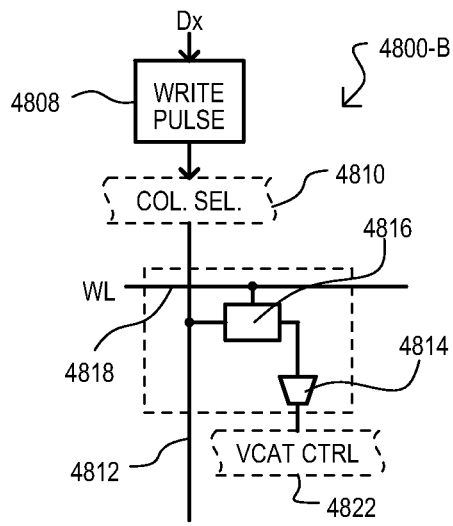

Referring to FIG. 48B, another example of a circuit for generating a write pulse across a PMC element according to an embodiment is shown in a block schematic diagram. A circuit 4800-B may include sections like those of FIG. 48A, thus like sections are referred to by the same reference character. The embodiment of FIG. 48B can differ from that of FIG. 48A in that a bit line 4812 can be connected to an anode of PMC element 4814 by an access device 4816. Accordingly, unlike FIG. 48A, the embodiment of FIG. 48A may include a cathode control circuit 4822 for generating a voltage at the cathode of PMC element 4814.

Figure 48C:
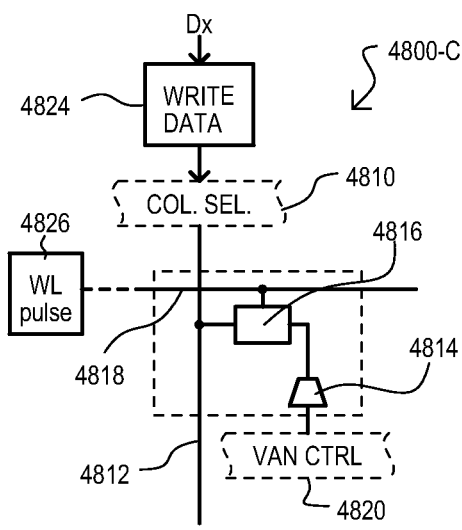

Referring to FIG. 48C, still another example of a circuit for generating a write pulse across a PMC element according to an embodiment is shown in a block schematic diagram. A circuit 4800-C may include sections like those of FIG. 48A, thus like sections are referred to by the same reference character. The embodiment of FIG. 48C can differ from that of FIG. 48A in that a write control circuit 4824 may establish a write voltage for application to a cathode of PMC element 4814 via a bit line 4812. A word line pulse circuit 4826 may drive a word line 4818 to selectively apply a bit line voltage to a cathode of PMC element 4814.

Figure 48D:
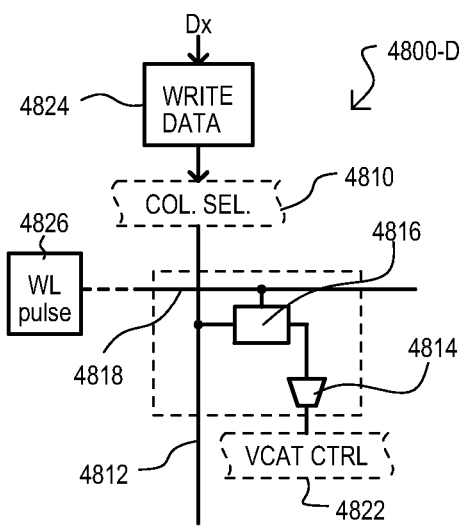

Referring to FIG. 48D, still another example of a circuit for generating a write pulse across a PMC element according to an embodiment is shown in a block schematic diagram. A circuit 4800-D may include sections like those of FIG. 48C, thus like sections are referred to by the same reference character. The embodiment of FIG. 48D can differ from that of FIG. 48C in that a bit line 4812 can be connected to an anode of PMC element 4814 by an access device 4816. Accordingly, unlike FIG. 48C, the embodiment of FIG. 48D may include a cathode control circuit 4822 for generating a voltage at the cathode of PMC element 4814.

Embodiment shown in FIGS. 45 and 48 may result in higher threshold voltages (i.e., voltages at which a PMC element may change an impedance state) by writing at AC speeds. Such higher threshold voltages may allow for sensing at higher voltages, for greater margin sensing (sense levels less susceptible to noise) that approaches that program and DC levels.

Embodiments of the invention may also include read methods from PMCs that may reduce unwanted "read disturb" effects. Examples of such embodiments will now be described with reference to FIGS. 49A to 56C.

In FIGS. 49A to 56C, it is understood that responses shown in graphs are illustrative and can vary according to implementation. In addition, while the embodiments show one particular type of access device (an n-channel MOS transistor) alternate embodiments could include different types of access device, such as p-channel MOS transistors.

Examples of operations that may result in read disturb will first be described.

FIGS. 49A to 49D show examples of how read disturb may occur in a PMC.

Figure 49A:
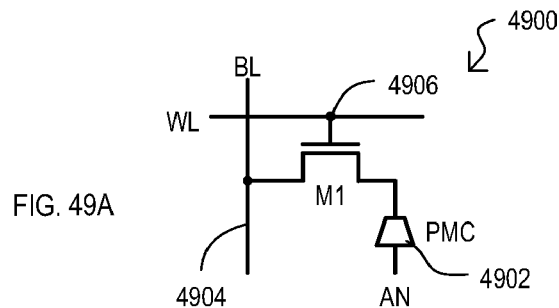
FIGS. 49A to 49D show read operations that may cause "disturb" in a PMC.

Referring to FIG. 49A, a PMC memory cell is shown in a schematic diagram. A PMC memory cell 4900 may include a PMC 4902 and an access metal-oxide-semiconductor (MOS) transistor M1. PMC 4902 may have an anode (AN), as well as cathode. In FIG. 49A, a cathode of PMC 4902 is connected to a bit line 4904 through M1. M1 may be enabled by a word line 4906.

Figure 49B:
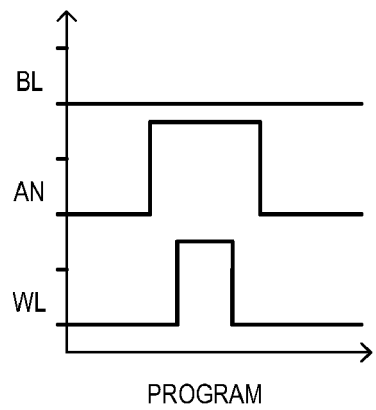

Referring to FIG. 49B, a graph of a programming operation is shown. Graph 49B shows waveforms BL, AN, WL, corresponding to voltages on bit line 4904, anode (AN), and word line 4906, respectively. A positive pulse, taken from the anode to cathode, may be applied across the PMC. This can reduce the resistance of the PMC (i.e., change it from an erased state to a programmed state).

Figure 49C:
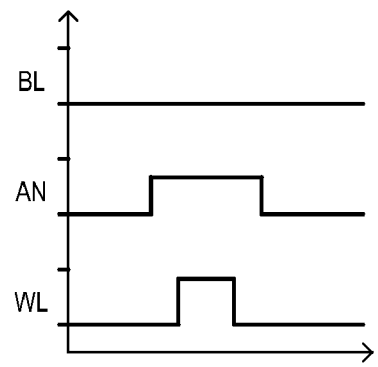

Referring to FIG. 49C, a graph of a read operation is shown, that includes the same waveforms as FIG. 49B. In a read operation, a pulse that is smaller than that of a program operation, may be applied across the PMC having the same polarity as the programming operation. Such read pulses can, in some circumstances, inadvertently program the PMC. Thus, if a PMC is an erased state, read operations may accidentally program the PMC, causing "read disturb".

Figure 49D:
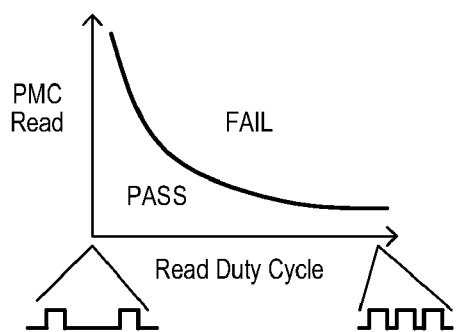

Referring to FIG. 49D, a graph is shown illustrating how read disturbs can depend upon read pulse duty cycle. If read pulses are sufficiently spaced in time, read disturb may be less prevalent. However, if reads are executed closer together in time, read disturb can be more likely to happen.

In general, read disturb can occur on PMCs that are in an off state or erased state (high resistance). A read operation can apply a bias across the PMCs in a program polarity direction.

In embodiments shown below, to prevent or mitigate read disturb, a read pulse across a PMC (in the program direction) may be followed by a read pulse in the opposite direction, to "relax" a cell.

Figure 50A:
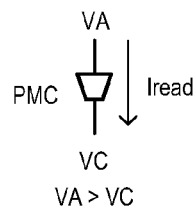
FIGS. 50(a) and 50(b) show reduced disturb read operations according to an embodiment.
Figure 50B:
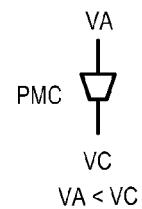

Referring to FIGS. 50(*a*) and 50(*b*) a read operation according to an embodiment is shown in diagrams. A read operations may have two phases, (1) a sense phase in which a read voltage is applied across the PMC to determine its impedance, and (2) a "relax" phase in which an opposite polarity pulse is applied to the same PMC.

FIG. 50(*a*) shows conditions for the sense phase. In the example shown, a voltage pulse from anode to cathode can be positive (VA>VC), resulting in a read current Iread being generated.

FIG. 50(*b*) shows conditions for the relax phase. In the example shown, a voltage pulse from anode to cathode can be negative (VA<VC).

The above two phase read operation may reduce read disturb. Further, it may increase endurance (amount of times program/erase can occur) of a PMC.

Referring to FIGS. 51A to 51D, various examples of read operations according to embodiments will be described.

Figure 51A:
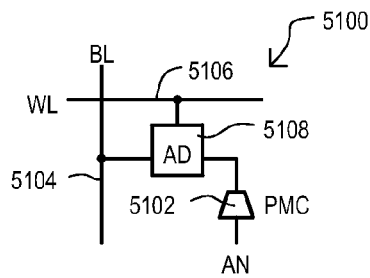
FIGS. 51A to 51D show memory cell and various corresponding reduced disturb read operations according embodiments.

FIG. 51A shows one example of a PMC memory cell 5100. PMC memory cell 5100 may include PMC 5102 having a cathode connected to a bit line 5104 by an access device 5108. Access device 5108 may be enabled by a word line WL 5106.

Figure 51B:
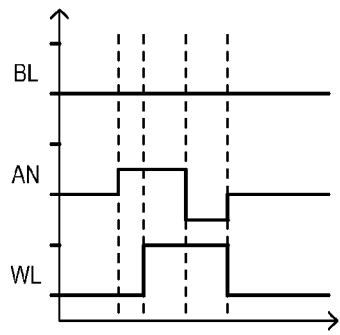

FIG. 51B shows a first read operation for memory cell 5100 of FIG. 51A, in a timing diagram according to one embodiment. A bit line (BL) can be maintained at a low voltage. An anode (AN) can be driven to a read voltage higher than the bit line voltage. Word line (WL) can enable access device 5108 (by going high in this example). A positive anode-to-cathode voltage can be created allowing the PMC data to be sensed. Subsequently, the anode can be driven to a lower voltage than the read voltage and the bit line voltage. At this time, the word line may still enable the access device. The word line can then turn off the access device 5108.

Figure 51C:
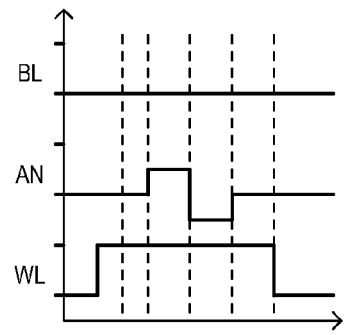

FIG. 51C shows a read operation for memory cell 5100 according to another embodiment. A word line (WL) may be activated, enabling an access device 5108. While the word line is active, the anode voltage of a PMC 5102 is driven positive with respect to the bit line voltage to allow sensing of data. Subsequently, the anode voltage is driven negative with respect to the bit line 5104.

Figure 51D:
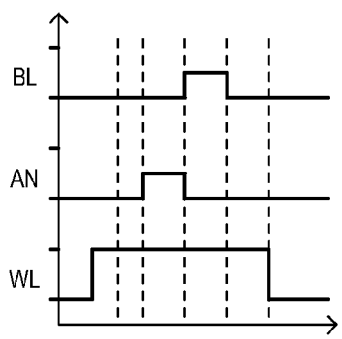

FIG. 51D shows a further read operation for memory cell 5100 according to an embodiment. A word line (WL) may be first activated, enabling access device 5108. While the word line is active, the anode voltage of a PMC 5102 is driven positive with respect to the bit line voltage (BL) to allow sensing of data. Subsequently, the bit line is driven to a more positive voltage than the anode.

In alternate embodiments, bias conditions can differ. For example, if an access device is accessed by a low potential (e.g., a p-channel transistor), a word line may transition low. Further, if an access device is connected to an anode of a PMC, a read operation may include driving a cathode low (to read the data), and then pulsing the cathode high ("relax" the PMC) to mitigate/eliminate read disturb.

Figure 52:
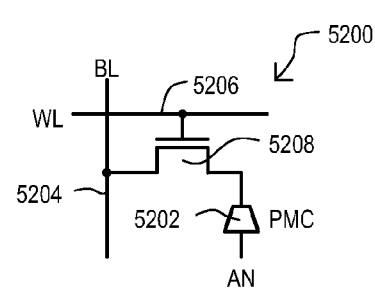
FIG. 52 shows a memory cell according to another embodiment.

Referring to FIG. 52, another example of a PMC memory cell 5200 that can be included in the embodiments. PMC memory cell 5200 includes items like of FIG. 51, and like items are referred to by the same reference character but with the first two digits being "52" instead of "51". An access device 5208 can be a transistor, preferably a MOS transistor, even more preferably an NMOS transistor.

Figure 53:
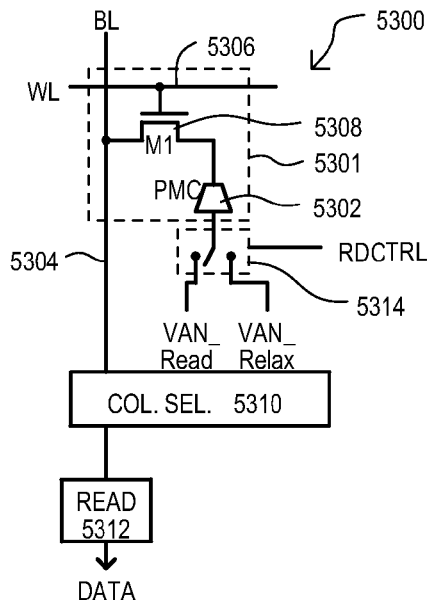
FIGS. 53-55 show memory devices according to various embodiments.

Referring to FIG. 53, a memory device 5300 according to an embodiment is shown in a block schematic diagram. A memory device 5300 may include a number of memory cells, one shown as 5301. A bit line 5304 may be connected to a read circuit 5312 through a column select circuit 5310. A read circuit 5312 may read data of an accessed PMC 5302 by sensing a current through a PMC 5302 during a sense phase.

An anode switch circuit 5314 can connect an anode of PMC 5302 to a read voltage VAN_Read in a sense phase, and to a relax voltage VAN_Relax in a relax phase, based on a control signal RDCTRL. As understood from the examples herein, a voltage VAN_Relax can result in an opposite polarity voltage being applied across the PMC to that created by application of voltage VAN_Read.

Figure 54:
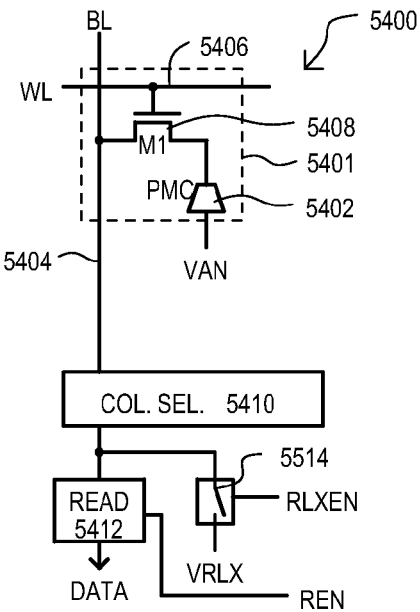

Referring to FIG. 54, another example of a memory device 5400 is shown. Memory device 5400 may include items like those of FIG. 53. Like items are referred to with the same reference character, but with the first two digits being "54" instead of "53". The memory device of FIG. 54 may differ from that of FIG. 53 in that an anode of PMC 5402 may be connected to an anode voltage VAN. Such an anode voltage may have one potential in a sense phase and another potential in a relax phase.

A read path switch circuit 5414 may connect a selected bit line 5404 to a relax voltage VRLX in a relax phase, based on a control signal RLXEN. As understood from the examples herein, a voltage VRLX can result in an opposite polarity voltage being applied across the PMC 5402 than that created in a sense phase.

Figure 55:
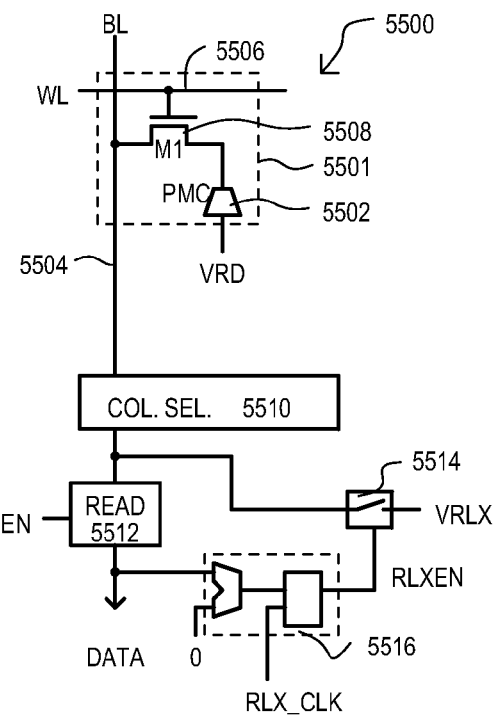

Referring to FIG. 55, another example of a memory device 5500 according to an embodiment is shown in a block schematic diagram. Memory device 5400 may include items like those of FIG. 54, and like items are referred to with the same reference character, but with the first two digits being "55" instead of "54". The memory device of FIG. 54 may differ from that of FIG. 54 in that an application of a relax pulse may be dependent upon a value of the read data.

A logic circuit 5516 may compare a read data value (DATA) to a predetermined value (in this particular example "0"). Based on such a comparison, a clock pulse RLX_CLK may, or may not, be provided to read path switch circuit 5414 and thereby apply a relax pulse. In such an arrangement, if DATA read from the PMC 5502 indicates one state (e.g., erased), then the relax pulse can be enabled. If DATA indicates another state (e.g., programmed), then the relax pulse can be disabled.

While embodiments have shown one or more relax pulses that are applied subsequent to a read pulse, other embodiments may have relax pulses that may precede a read pulse. Examples of such embodiments are shown in FIGS. 56A to 56C.

Figure 56A:
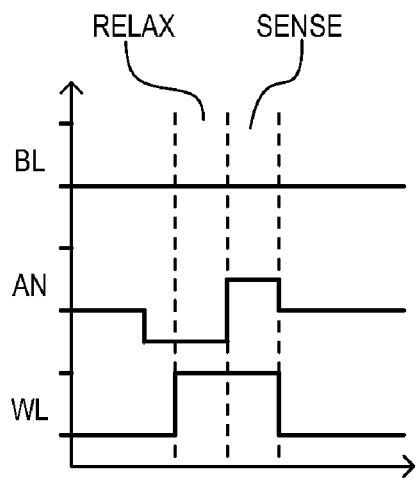
FIGS. 56A to 56C show examples of read operations according to other embodiments.
Figure 56B:
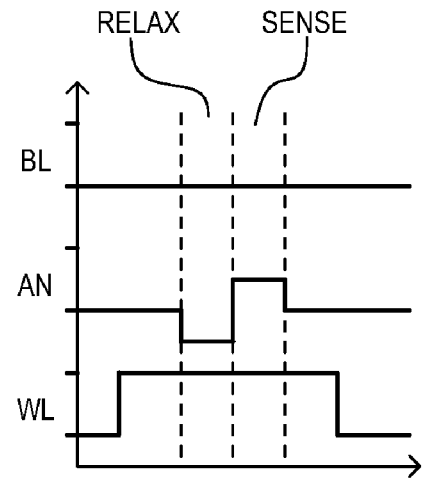
Figure 56C:
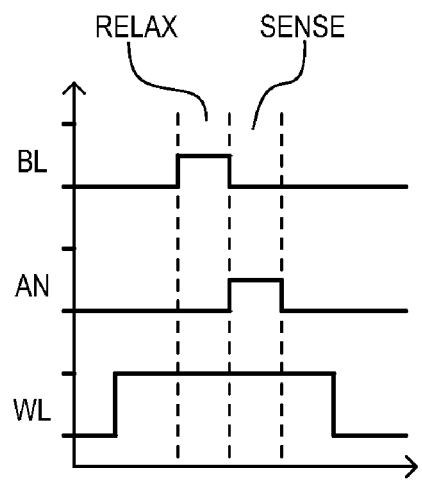

FIGS. 56A to 56C are timing diagrams that show operations similar to that shown in FIGS. 51B to 51D, except that the relax phase can precede the sense phase in time.

Embodiments shown herein may include read operations having one or more relax phases. A relax phase can counteract potential disturb effects of read pulse. This may lead to (1) less read disturb failures and/or (2) greater endurance.

Embodiments may have faster read duty cycles. While read operations according to embodiments may take longer than approaches that include only a read pulse, by adding the relax phase, reads operations may be executed at a faster rate as disturb effects can be lessened or eliminated. As understood from FIG. 49D, conventionally, read pulse duty cycles could be spaced apart in time due to read disturb concerns. A relax phase may enable read pulses to be applied more rapidly, as disturb concerns are addressed.

According to embodiments, memory devices may include "relax" circuits. Relax circuit may enable a relax phase to impart pulses across the PMCs having an opposite in polarity to the read pulse.

Embodiments may also include utilizing PMC elements to enable or disable blocks of an integrated circuit device. Before describing such embodiments, examples of conventional integrated circuits will be described.

FIGS. 57(*a*) and 57(*b*) show how conventional integrated circuits (ICs) can include individual blocks that can be disabled from operating.

Figure 57A:
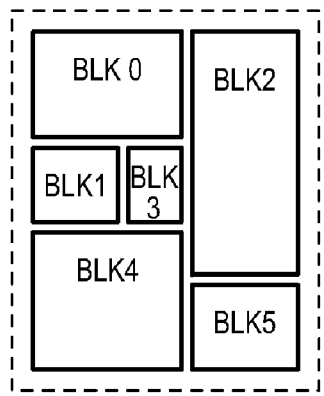
FIGS. 57(a) and 57(b) show a conventional integrated circuit (IC) having a block disable function.

FIG. 57(a) shows an IC with six blocks (BLK0 to BLK5) that can each perform a particular function. Such blocks can be custom designed blocks or existing designs in the form of circuit intellectual property (IP).

Figure 57B:
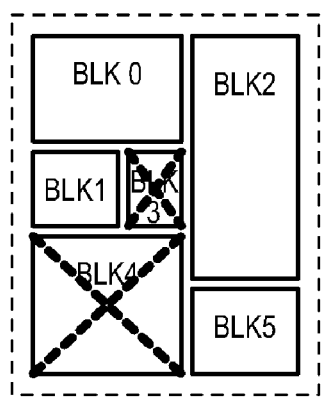

FIG. 57(b) shows the same IC as FIG. 57(a), but with blocks BLK3 and BLK4 disabled. For example, these particular blocks may not be needed in an application and so are placed in a low power mode to minimize power consumption for the IC. Different blocks can be disabled based in different applications of the same IC.

Figure 58A:
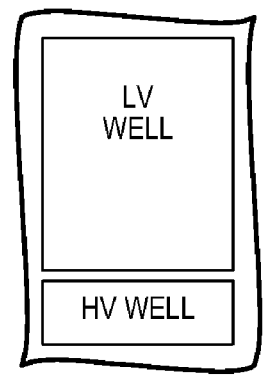
FIGS. 58(a) to 58(c) show a method of forming a block of an IC like that of FIGS. 57(a) and 57(b).
Figure 58B:
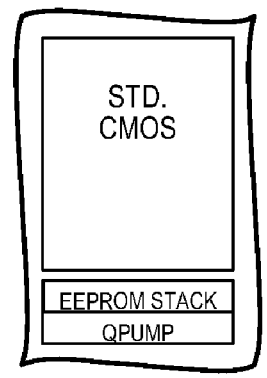
Figure 58C:
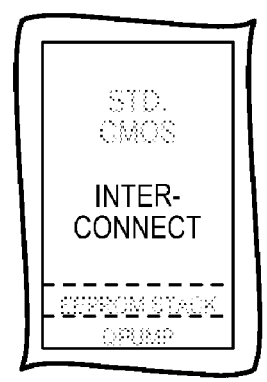

FIGS. 58(a) to 58(c) show manufacturing steps that can be included in forming a conventional block, like those shown in FIGS. 57(a) and 57(b). Such a block can include a logic section as well as nonvolatile section formed by an EEPROM (e.g., flash EEPROM).

FIG. 58(a) shows the formation of low voltage regions (LV) and high voltage regions (HV). Low voltage regions can contain logic circuits. High voltage regions can be needed to accommodate the relatively high voltages needed to program or erase the EEPROM cells. As but a few examples, a high voltage region can include high voltage wells, implants, and oxide.

FIG. 58(b) shows the formation of gate layer structures. Standard CMOS devices (STD. CMOS) can be formed in the low voltage region. Specialized EEPROM devices can be included in the high voltage region. For example, EEPROM cells can be formed with an EEPROM stack gate structure (EEPROM STACK) that may require additional process steps over those of standard CMOS. In addition, a charge pump (QPUMP) can be included to generate high voltages needed for program and erase.

FIG. 58(c) shows the formation of an interconnect (INTERCONNECT) over the gate layer. Such an interconnect can include one or more patterned conductive layers that provide signal paths between various sections of the block and other blocks (not shown) of the same IC.

Figure 59:
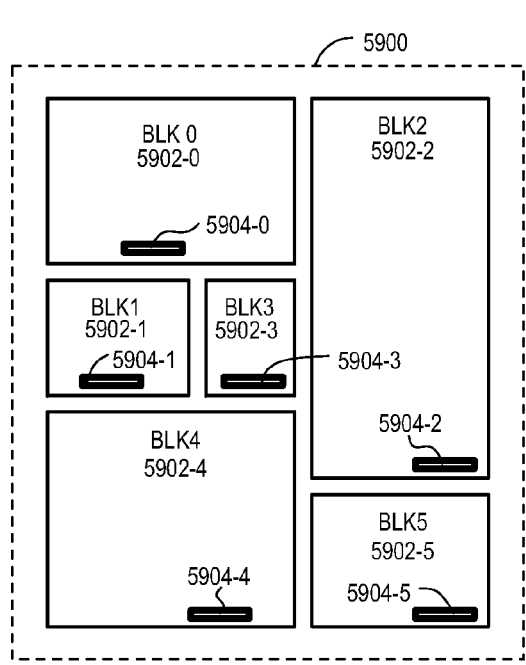
FIG. 59 is a block diagram of an IC according to an embodiment.

Referring to FIG. 59, an IC 5900 according to an embodiment is shown in a block diagram. An IC 5900 may include blocks like those of FIGS. 58(a) and 58(b), shown as 5902-0 to 5902-5. However unlike FIGS. 57(a) to 58(c), blocks (5902-0 to 5902-5) may be disabled according to data stored in PMC memory structures (5904-0 to 5904-5).

While FIG. 59 shows a PMC memory structure (5904-0 to 5904-5) for every block (5902-0 to 5902-5), it is understood that in alternate embodiments there may be fewer PMC memory structures than blocks. In some arrangements there may be only one PMC structure for the IC, with different portions of the PMC memory structure dictating the control of different blocks.

Figure 60A:
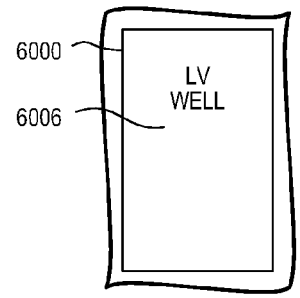
FIGS. 60(a) to 60(c) show a method of forming a block that may be disabled according to an embodiment.
Figure 60B:
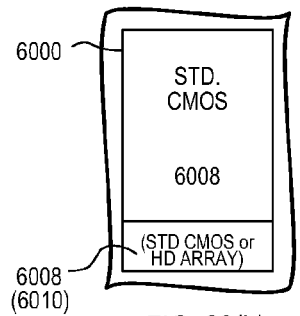
Figure 60C:
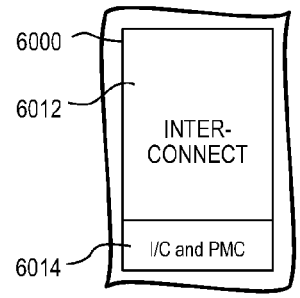

Referring to FIGS. 60(a) to 60(c), manufacturing steps that can be included in forming a block of an IC are shown in series of diagrams. Such blocks can include a logic (or other) section as well as a PMC memory section.

FIG. 60(a) shows the formation of low voltage wells 6006 in a block 6000. Low voltage wells 6006 may accommodate both a logic section as well as a PMC section. A PMC section can include logic circuits and access devices/circuitry for enabling PMC data states to be sensed and output.

FIG. 60(b) shows the formation of gate layer structures. Standard CMOS devices 6008 can be formed in the low voltage well region. Standard CMOS can also be used to form access devices for PMC memory cells and/or decoding circuitry and the like needed to access PMC memory cells. Alternatively, particularly for PMC memory array region, a gate layer can include a high density gate arrangement 6010 that may be more compact and have different capabilities than standard CMOS devices 6008.

FIG. 60(c) shows the formation of an interconnect (I/C) region 6012 and a PMC memory structure 6014 over the gate layer shown in FIG. 60(b). An interconnect region 6012 may connect various sections of block 6000 to one another. A PMC memory structure 6014 may include interconnect structures as well as PMC elements. In the embodiment shown, PMC elements may be formed over a substrate and not in (or on) a substrate. PMC elements can be integrated within, be formed over, or be formed under all or a selected layers that make up the interconnect structures.

Figure 61:
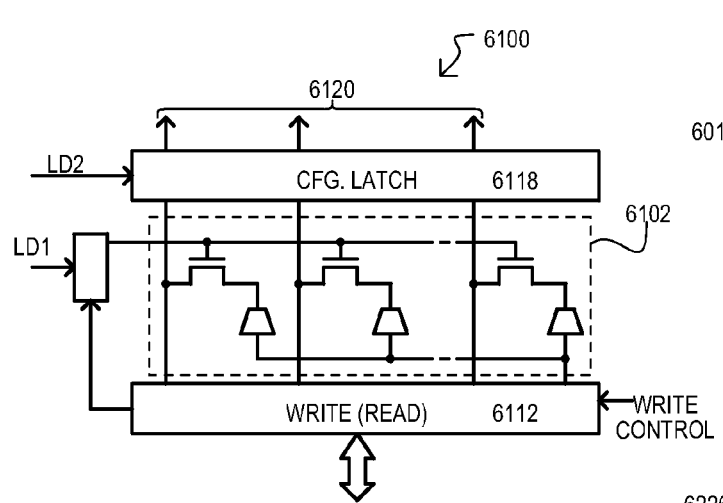
FIG. 61 is a block schematic diagram showing a PMC block according to an embodiment.

Referring to FIG. 61, a PMC block 6100 that may be included in embodiments is shown in a block schematic diagram. Configuration data may be written into PMC memory cells 6102 by operation of an access circuit 6112. An access circuit 6112 may also include a read circuit to allow reading of stored configuration data via a data input/output (I/O) 6116.

In response to a condition (e.g., power up, reset, receiving a particular command, etc.), a signal LD1 can be activated and configuration data stored by PMC cells can be loaded into a latch or register 6118. Such a latch/register 6118 can be connected to block control inputs of a block. In the example shown, a second signal LD2 can apply latched configuration data as block control inputs 6120.

FIG. 61 is but one example of a possible PMC block. Other blocks can include different array configuration, multiple row arrays, or incorporate PMC devices into a volatile latch type circuit, as but a few examples.

Figure 62:
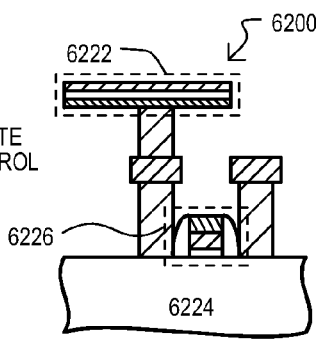
FIG. 62 is a side cross sectional view of a memory device that may be included in the embodiments.

Referring to FIG. 62, a PMC storage cell 6200 that may be included in embodiments is shown in a side cross sectional view. PMC storage cell 6200 may include a PMC element 6222 formed over a substrate 6224 containing an access device 6226, which in this particular embodiment may be a MOS type transistor.

Figure 63:
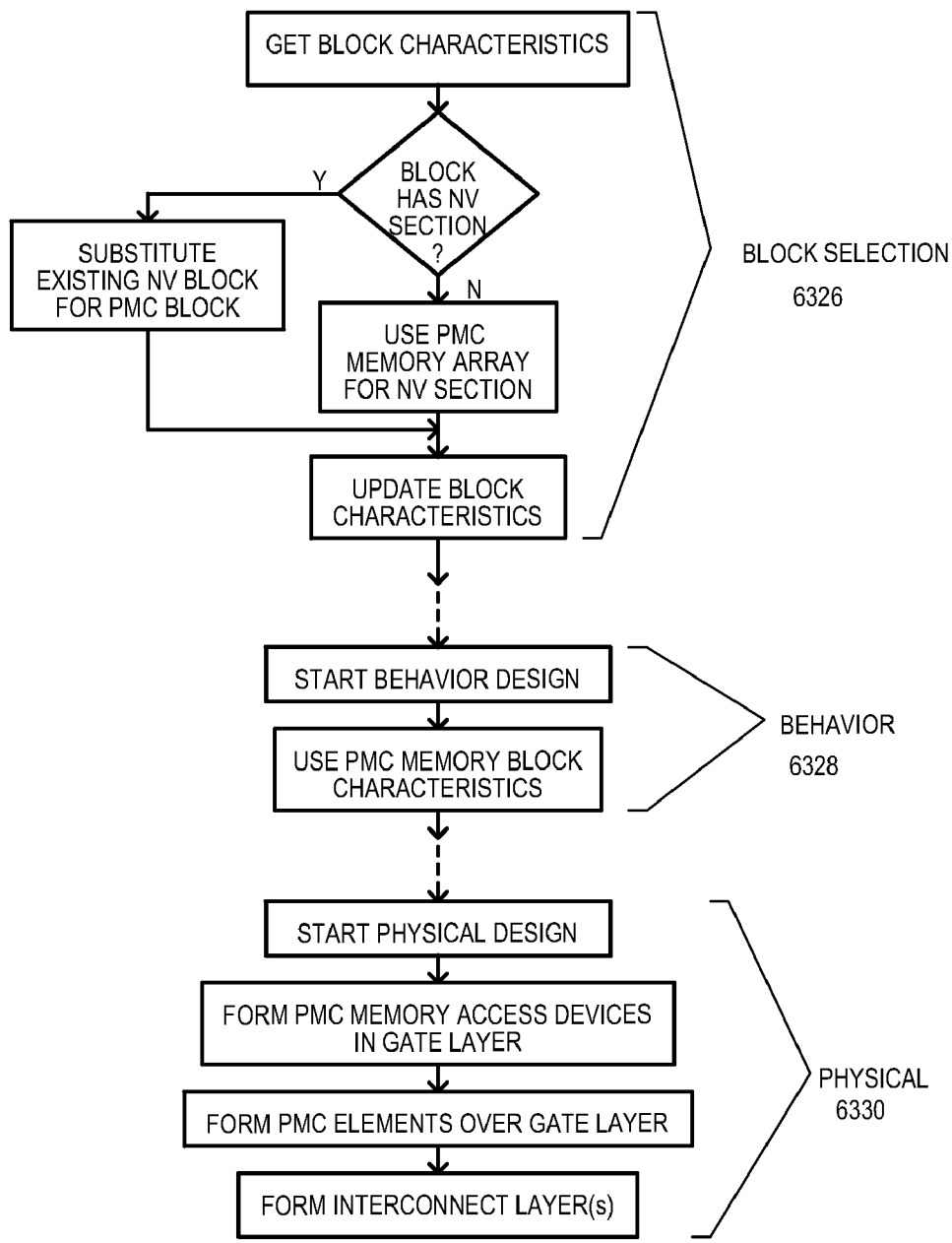
FIG. 63 is a flow diagram showing a method according to an embodiment.

Referring to FIG. 63, a method for creating a block based IC like those shown herein and equivalents is shown in a flow diagram 6300.

It is noted that while FIG. 63 shows three different method sections BLOCK SELECTION 6326, BEHAVIOR 6328, and PHYSICAL 6330, other embodiments can include any one, or all of these sections, as well as portions of such sections.

In a BLOCK SELECTION section 6326, the characteristics of a circuit block to be incorporated into a larger IC may be examined. If such a block already includes a nonvolatile (NV) section, then such a section can be substituted with a PMC block. Such a PMC block can provide at least the same amount of data as the existing NV section. If the examined circuit block does not include any existing NV components, a PMC block can be used for configuration storage for the block. This can also include adding any circuits needed to disable the block, and interfacing such circuits with the PMC block.

After the substitution or addition of a PMC block, the characteristics of the block can be updated. Such an updating can include updating area occupied by the block, current drawn by the block in various modes, signal delays introduced by the block, etc.

In a BEHAVIOR section 6328, the operation of the overall IC can be examined using characteristics for the PMC block to meet overall requirements for estimated timing, power consumption etc.

In a PHYSICAL section 6330, memory access devices can be formed in a gate layer. For example, in very particular arrangements, PMC blocks may connect PMC elements to read or write data lines (a bit line) with one or more transistors. In such cases, if such transistors are MOS type transistors, the access devices can be formed by patterning a gate layer.

PMC elements can then be formed over a gate layer. This can avoid specialized front end of line processes from being needed to implement configuration data storage (i.e., special wells, transistor fabrication steps, etc.).

An interconnect layer can then be formed. It is noted that forming PMC elements can occur at the same time an interconnect layer is formed, between particular interconnect layers, or on top of such interconnect layers.

Embodiments may provide an IC with blocks that may be disabled, where such an IC does not need specialized substrate structures for the storage or writing of nonvolatile configuration data. For example, charge pumps, dual gate devices (i.e., EEPROMs), and/or high voltage devices may not be needed for such configuration information. Thus, EEPROM-like functionality can be provided at a lower cost and/or more efficient way than conventional approaches.

Embodiments may not include specialized program/erase voltage inputs. In conventional ICs with EEPROM elements, externally applied voltages may require an input location.

Unlike conventional devices that utilize EEPROM type storage elements, embodiments may have storage elements are formed above the substrate. This may provide more substrate area than conventional approaches that dedicate area to nonvolatile memory cells.

Embodiments may also include integrated circuits that include PMCs in a programmable device that may serve as limited production device, or a prototype device for a subsequent production device. Examples of such embodiments are shown in FIGS. 64 to 72E-E.

Figure 64:
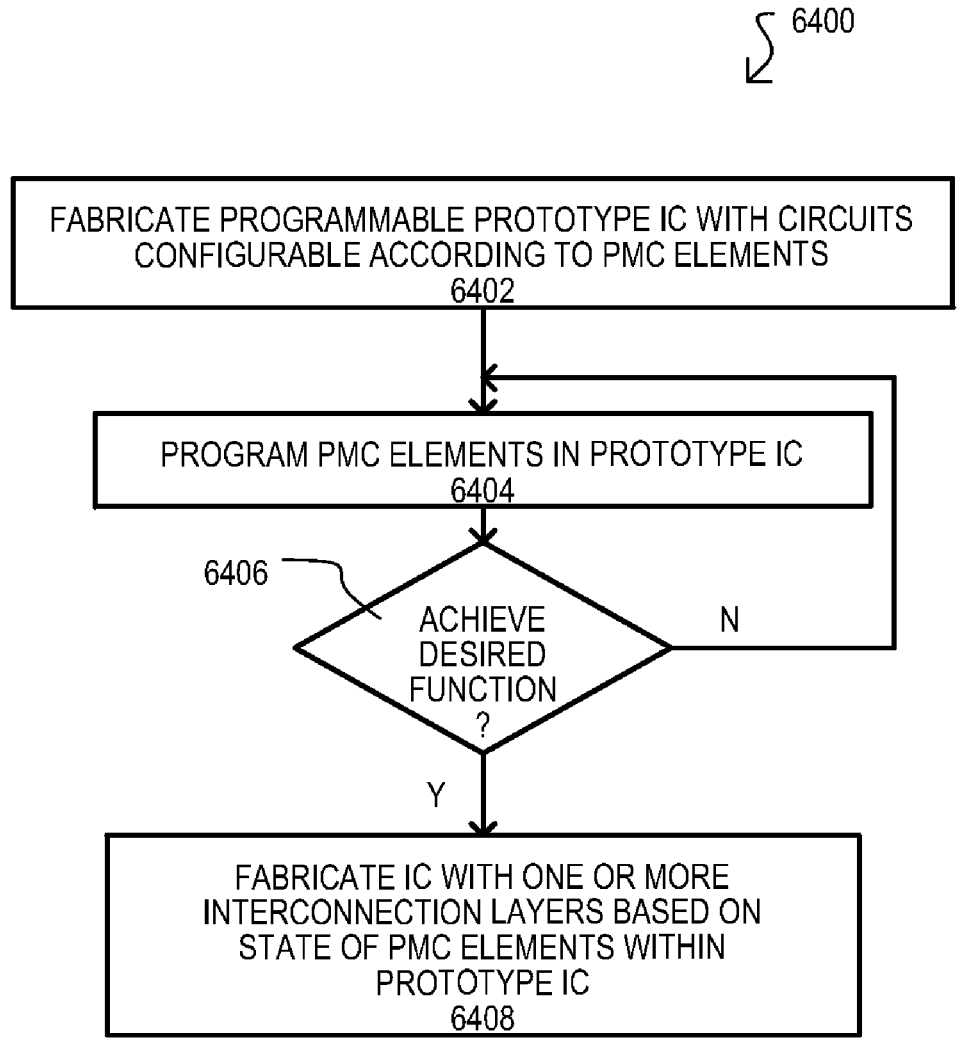
FIG. 64 is a flow diagram of another method according to an embodiment.

Referring to FIG. 64, a method 6400 according to an embodiment is shown in a flow diagram. A programmable prototype integrated circuit (IC) may be formed that includes configurable circuits (step 6402). The function of the configurable circuits can be established by programming programmable resistance elements. As but one example, programmable metallization cell (PMC) elements may be used as resistive elements. However, alternate embodiments could use different programmable resistance elements, such as phase change elements, as but one possible example.

A prototype IC may be programmed to try to achieve a desired function (step 6404). PMC elements may be programmed to low impedance values, or erased (or maintained in an unprogrammed state) to a high impedance values to enable/disable signal paths to electrically connect circuit elements in a desired configuration.

The programmed prototype IC may then be tested to determine if a desired function has been achieved (step 6406). If a desired function is not achieved (N from 6406), or a new or different function is desired, a method may return to a step 6404. That is, the prototype IC may be reprogrammed into a new configuration. This is in sharp contrast to fuse/antifuse arrangements that provide one time programmability, or via mask approaches that require new masks for each version of a device.

If a desired function is achieved (Y from 6406), one or more integrated circuits may be manufactured (step 6408). Such ICs may include interconnect layers having electrical connections based on the states of the PMC elements within the prototype IC. As but a few examples, where conductive connections are made by PMC elements in the prototype device, the IC may have "hardwired" (i.e., non-programmable connections), including but not limited to: "vias" (conductive connections between interconnect patterns, and/or "contacts" (conductive connections between an interconnect pattern and a substrate), and/or wiring connections (portions of an interconnect pattern).

Referring to FIGS. 65A to 65D, methods and devices according to embodiments are shown in a series of block schematic diagrams and a table.

FIG. 65A shows a portion of a prototype device 6500. A first circuit 6502 may be connected to a first conductive pattern 6504 by contacts (one shown as 6506). A second circuit 6508 may be connected to a second conductive pattern 6510 by contacts (one shown as 6512). A second conductive pattern 6510 may be formed over first conductive pattern 6504.

PMC elements (one shown as 6514) may be formed at locations where first conductive pattern 6504 crosses second conductive pattern 6510. While FIG. 65A shows a grid type arrangement, this is but one example of possible configuration patterns. In alternate embodiments, conductive patterns (6504 and 6510) may have patterns determined by a layout of underlying circuits, signal propagation times, etc.

A decode and program circuit 6516 may be connected to first and second conductive patterns (6502 and 6510). Decode and program circuit 6516 can selectively apply potentials and/or currents between terminals of each PMC element (e.g., 6514). This can enable each PMC element (e.g., 6514) to be separately programmed to a low impedance state, or erased to a high impedance state. Thus, electrical connections (i.e., very high or low impedance paths) may be made between first and second conductive patterns (6504 and 6510).

Alternatively, PMC cells may be connected to programming voltage/current sources via one or more programming transistors, or alternatively, may connect one pattern to another via control transistor. Such an arrangement may help protect PMC elements from "disturb" (unintended programming or erase of non-accessed PMC element) during erase and/or programming operations.

FIG. 65B shows one very particular configuration for a portion of a prototype device 6500. PMC elements have been either programmed (to a low impedance) or erased (to a very high impedance). One programmed PMC element is shown as 6514-0, and one erased (or non-programmed) PMC element is shown as 6514-1. From such symbols it is understood that FIG. 65B shows four programmed PMC elements, with the remaining PMC elements being erased.

FIG. 65C shows how a prototype device 6500 may be reprogrammed. As shown, the PMC elements of FIG. 65C have a different configuration than that of FIG. 65B. In this way, a prototype device may be reconfigured various times to optimize, revise or otherwise alter one configuration over another.

FIG. 65D shows how PMC states can be collected as configuration data. As shown, a state of each PMC element may be recorded. Thus, a configuration of prototype device 6500 performing as desired may be stored. In other arrangements, such data may only include programmed PMC elements, with non-listed PMC elements being understood as being erased, or vice versa.

Referring now to FIGS. 66A to 66E, additional methods and devices according to embodiments are shown in a series of block diagrams and tables.

Figure 66A:
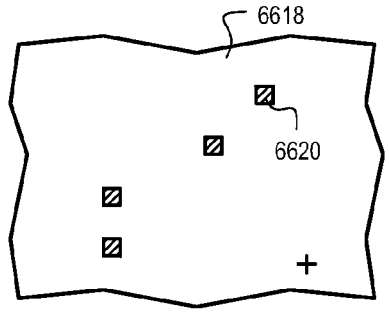
FIGS. 66A to 66E show a further method according to another embodiment.

FIG. 66A is the same as FIG. 65D, showing configuration data for a prototype IC.

Figure 66B:
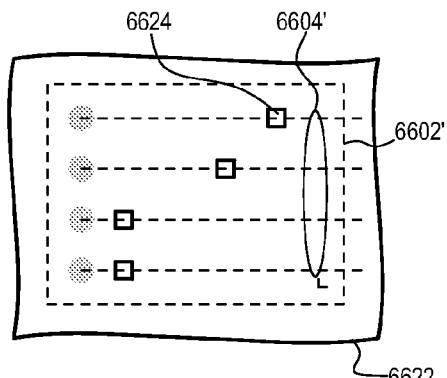

FIG. 66B shows a table of mask data that may be generated from configuration data of FIG. 66A. In the very particular example shown, a state of each programmed (i.e., low impedance) PMC element may correspond to a via within an integrated fabrication mask. It is understood that while FIG. 66B shows a PMC to via correlation, as noted above, PMC states may also correspond to contact locations and/or interconnect segments.

Figures 66C, 66D:
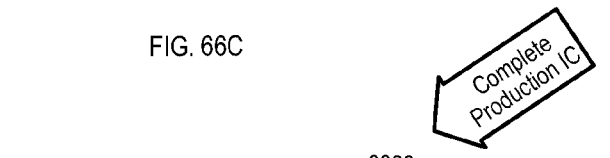

FIG. 66C shows one example of a via mask. For each enabled PMC, a mask 6618 may include a via location (one shown as 6620). As is well understood, a mask may be used to create a fabrication pattern on an integrated circuit. A mask may be in electronic form (data for creation of a mask, or a pattern for a pattern writing device (e.g., beam lithography)), and/or may be in physical form (reticle for inclusion in a patterning machine). Again, while only a via mask is shown, in other embodiments, PMC state data may be utilized to create a contact mask pattern, and/or alter an interconnection mask pattern.

FIG. 66D shows a portion of a production device that may be fabricated according to embodiments. A production device portion may include a first production circuit 6602' with a first conductive pattern 6604' connected thereto. A first production circuit 6602' and first conductive pattern 6604' may be the same as, or similar to, or at least equivalent to first circuit 6502 and first conductive pattern 6504, respectively, of prototype device portion in FIGS. 65A to 65C.

One or more insulating layers 6622 may be formed over first conductive pattern 6604'. Further, insulating layer(s) 6622 may be patterned according to mask 6618. In the particular example shown, insulating layer(s) 6622 may be patterned to create openings (one shown as 6624) that may expose parts of first conductive pattern 6604'.

Figure 66E:
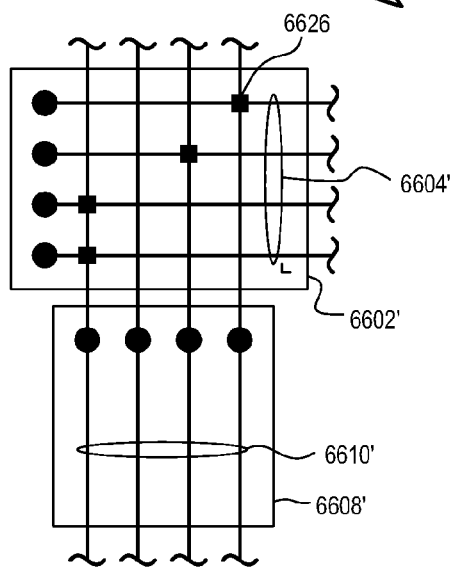

FIG. 66E shows the portion of production device as it may be completed. Conductive vias (one shown as 6626) may be formed in openings (e.g., 6624). A second conductive pattern 6610' may be formed that is connected to a second production circuit 6608'. A second conductive pattern 6610' and second production circuit 6608' may be the same as, or similar to second conductive pattern 6510 and second circuit 6508 of FIGS. 65A-65C.

It is understood that the operation of production device portion shown in FIG. 66E can follow that shown in FIG. 65C.

Figure 67:
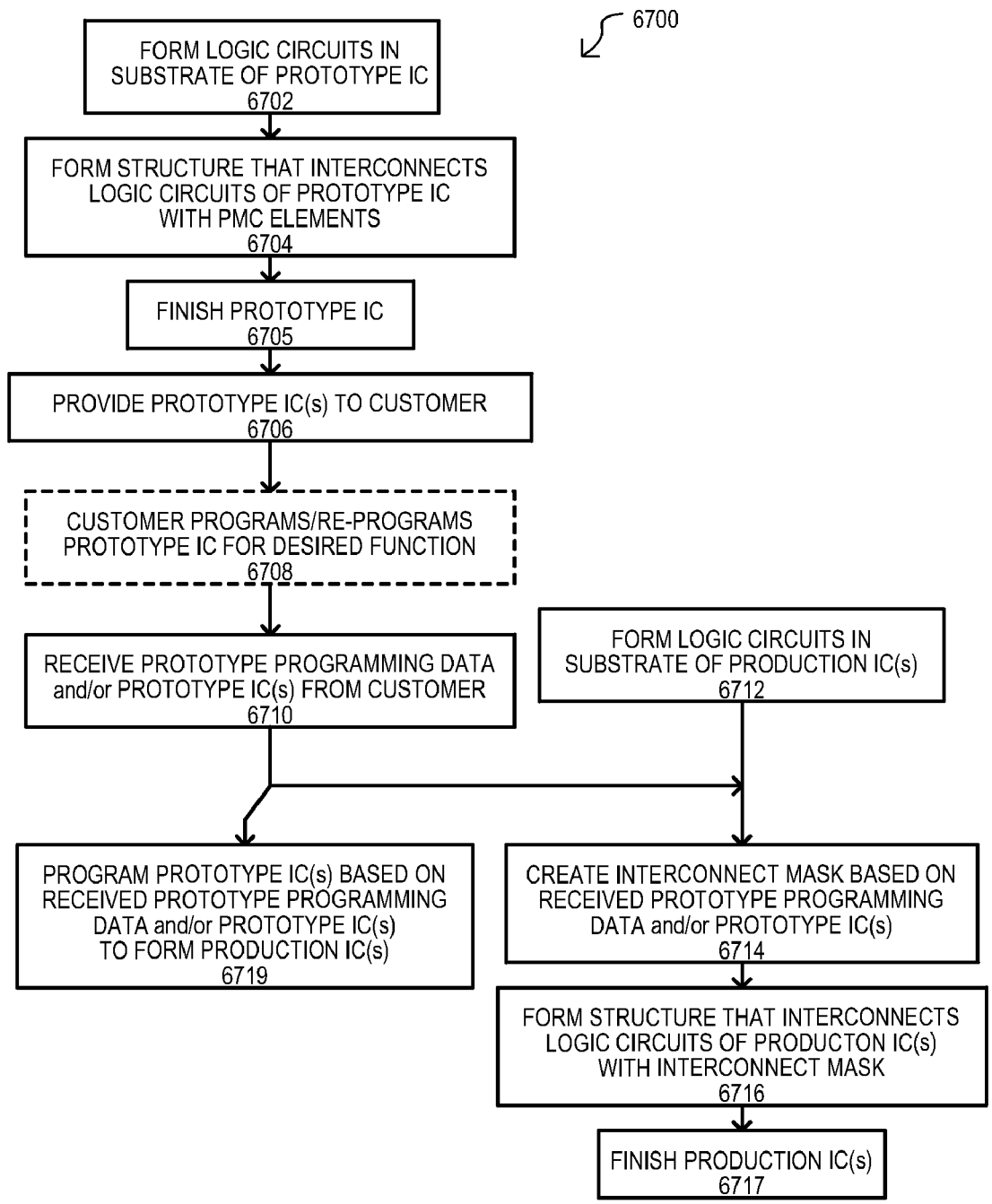
FIG. 67 is a flow diagram of a further embodiment.

Referring to FIG. 67, another method according to an embodiment is shown in a flow diagram and designated by the general reference character 6700.

FIG. 67 shows an example of a utilizing PMC based prototype in order to fabricate application specific integrated circuits (ASICs). It is understood that while FIG. 67 shows logic circuits, alternate embodiments may have different types of programmable circuits, as noted in conjunction with FIGS. 68A and 68B, below.

Logic circuits may be formed in a substrate of a prototype IC (step 6702). Such a step may include fabricating circuits with existing standard cells, or alternatively customized logic that may have functionality determined by interconnect layers. Preferably, a vertical portion of interconnect layers (i.e., via and/or contacts) may establish the functions of the IC.

An interconnect structure may then be formed over the logic circuits that includes PMC elements (step 6704). Preferably, such a step may include PMC elements disposed between interconnect layers, even more preferably at locations suitable for the formation of vias.

Subsequent processing may take place (e.g., additional back-end processing, as well as packaging) (step 6705) to produce a finished prototype IC.

Such a device may then be provided to a customer (step 6706).

A customer may then program/re-program the prototype IC to for a desired function (step 6708). Such a step may include programming selected PMC elements to a desired state. Advantageously, if needed, a prototype device may be reprogrammed multiple times to optimize a design and/or add or remove features, etc.

Programming data and/or a programmed prototype device may be received (step 6710). Programming data may be generated by a customer as a prototype device is programmed. In addition or alternatively, decoding circuits on a prototype device may be able to determine a state of each PMC element, and output such data.

A method 6700 may vary according to numbers of production devices needed and/or the application in which production devices are to be used, as but two examples. In FIG. 67, it may be desirable for large production runs to generate one or more (preferably only one) mask based on a customer configured prototype IC. An example of such an approach is shown by items 6712, 6714, 6716 and 6717.

Logic circuits may be formed in a substrate for production devices (step 6712). Such a step may include large scale fabrication of the logic circuits formed in the corresponding prototype device.

An interconnect mask may be created based on the programming data (step 6714). In the manner described above, or equivalents, a via mask, contact mask, or interconnect mask (or some combination thereof) may be generated from the programming data. Preferably, such an interconnect mask includes only one via mask.

Production devices may then be fabricated with the interconnect mask (step 6716). In particular approaches, such an arrangement may allow different devices to be created by altering but one mask. Such a feature may enable different products to be brought into production with relative ease, and low cost as compared to a product designed with conventional application specific integrated circuit (ASIC) techniques.

Subsequent processing may take place (e.g., additional back-end processing, as well as packaging) (step 6717) to produce a finished production ICs.

Alternatively, for example in the case of smaller production runs, it may be desirable to configure prototype ICs as production devices based on a customer programmed prototype IC (step 6719). It is noted that such an application may allow for the production device to be reconfigured in the field.

Referring to FIGS. 68A and 68B, one very particular example of a prototype integrated circuit layout according to an embodiment is shown in top plan views.

FIG. 68A shows a top plan view of a prototype IC. A prototype IC may include various circuits (eight shown as 6828a to 6828h), input/output (I/O) circuits (one shown as 6830), and PMC program and decode circuits (one shown 6816). Circuits (e.g., 6828a to 6828h) may provide various functions determined by PMC elements formed over a substrate. Such configurability may be within each circuit, as well as between circuits. Circuits (6828a to 6828h) may provide various functions, including but not limited to programmable logic functions, programmable analog functions (where such programmability is determined at least in part by PMC elements). In addition, one or more of circuits (6828a to 6828h) may provide a memory function. For example, such a circuit may include one or more PMC arrays for RAM or ROM like access to data. I/O circuits (e.g., 6830) may provide inputs and/or outputs to the prototype IC. As but one example, input terminals (e.g., bond pads) may be dedicated as inputs, outputs, or both (I/O). In addition or alternatively, such terminals can be programmable to function as inputs, outputs, or I/Os. PMC program/decode circuits (e.g., 6816) may allow PMC elements to be programmed (i.e., vary in impedance). It is noted that if a circuit (e.g., 6828a to 6828g) is a memory circuit, such a circuit may inherently include PMC program/decode circuits the same as, or different from those shown (e.g., 6816).

Optionally, program/decode circuits 6816 may enable the storage, input and/or output of storage data. As but one very particular example, a bit corresponding to a state of each PMC elements may be output in groups to registers. Such registers may output the configuration data in serial stream. Similarly, configuration data may be input to such registers, and then utilized to program PMC elements.

FIG. 68B shows a PMC element layer 6832, including a magnified view 6834 of such a layer. A PMC element layer 6832 may be formed over circuits shown in FIG. 68A, and provide interconnection based on PMC state. Magnified view 6834 shows how particular PMC elements may be programmed to different states. The view uses the same convention as FIG. 65B to designate programmed/erased PMC elements.

Referring to FIGS. 69A and 69B, a production integrated circuit layout according to an embodiment corresponding to the prototype IC shown in FIGS. 68A and 68B is shown in a series of top plan views.

FIG. 69A shows a top plan view of a production IC. A production IC may include the same general sections as the prototype IC, including circuits (6928a to 6928h) and I/O circuits (one shown as 6930). However, in the particular embodiment of FIG. 69A, a production circuit does not include PMC program and decode circuits like that shown in FIG. 68A. Circuits (6928a to 6928h) may provide functions determined by the physical structure of one or more interconnect layers. If any of circuits 6928a to 6928h is a PMC memory circuit, such a circuit may include program and decode circuits. As in the case of the prototype IC, such configurability may be within each circuit, as well as between such circuits. I/O circuits (e.g., 6930) may provide inputs and/or outputs to the prototype IC.

FIG. 69B shows an interconnection layer 6936, including a magnified view 6938 of such a layer. In the very particular example of FIG. 69B, interconnection layer 6936 may be a via layer. Interconnection layer 6936 may be formed over circuits shown in FIG. 69A, between two different conductive (e.g., metallization) patterns to thereby provide a particular configuration to the production IC. Each via may be correspond to a programmed (i.e., low impedance) PMC of a corresponding prototype IC. Thus, magnified view 6938 shows vias as darkened squares. Squares designated by dashed lines show potential locations of vias, not used for the particular production IC. In the example shown, via locations of magnified view 6938 can have a direct correlation to programmed PMC elements in magnified view 6834 of FIG. 68B.

Referring now to FIGS. 70A to 70D, PMC structures that may be included in a PMC device according to very particular embodiments are shown in a series of views.

Figure 70A:
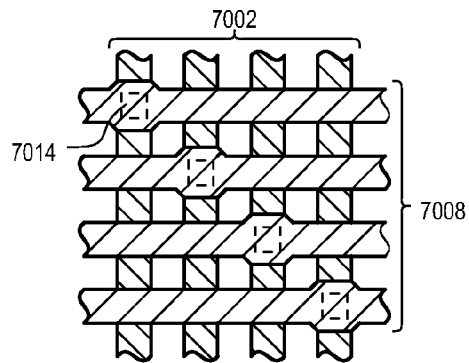
FIGS. 70A to 70D are top plan views and side cross sectional views of PMC structures that may be included in the embodiments.

FIG. 70A is top view showing a first conductive pattern 7002 formed below a second conductive pattern 7008. PMC elements (one shown as 7014) may be formed where one conductive pattern crosses over another. In very particular arrangements, a PMC element may be programmed to a high or low impedance states by forming a potential between the corresponding conductive lines of the two patterns (7002 and 7008). An arrangement like that of FIG. 70A, it is understood to create PMC elements at locations corresponding to vias in an integrated circuit.

Figure 70B:
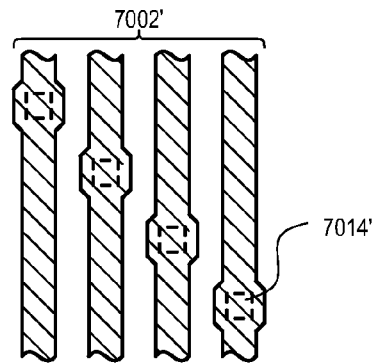

FIG. 70B is top view showing a first conductive pattern 7002' formed over a substrate. PMC elements (one shown as 7014') may be formed between lines of pattern 7002' and a semiconductor substrate. It is understood that PMC element locations in FIG. 70B may correspond to contacts in an integrated circuit.

A prototype IC may include configurations like that shown in FIG. 70A, FIG. 70B, or a combination of such arrangements.

Figure 70C:
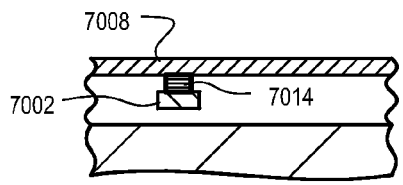

FIG. 70C is a side cross sectional view of an arrangement like that of FIG. 70A.

Figure 70D:
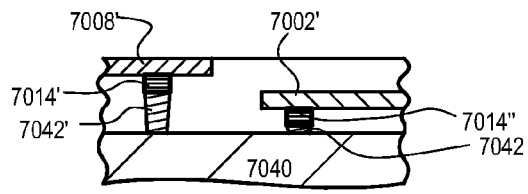

FIG. 70D is a side cross sectional view showing two possible contact structures of an arrangement like that of FIG. 70B. FIG. 70D shows one PMC element 7014" disposed between a substrate 7040 and a first conductive pattern 7002'. In the very particular example shown, a PMC element 7014" may be connected to a substrate 7040 by a contact portion 7042. FIG. 70D also shows another PMC element 7014' disposed between a substrate 7040 and a second conductive pattern 7008' formed at a higher level than first conductive pattern 7002'. PMC element 7014' may be connected to a substrate 7040 by a contact portion 7042'.

Figure 71A:
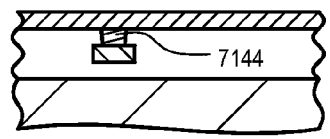
FIGS. 71A and 71B are side cross sectional views of production structures that may correspond to those of FIGS. 70A and 70B.
Figure 71B:
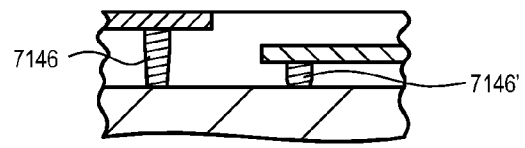

Referring to FIGS. 71A and 71B, interconnect structures of a production device according to embodiments are shown in side cross sectional views.

FIG. 71A shows a via 7144 that may be formed that can correspond to a PMC element 7014 of FIG. 70C, in a corresponding prototype device (assuming the PMC has the low resistance state).

FIG. 71B shows contacts 7146 and 7146' that may be formed that can correspond to PMC elements 7014' and 7014" (and any corresponding contact portions 7042/7042') of FIG. 70D, in a corresponding prototype device (again, assuming the PMC has the low resistance state).

Referring now to FIGS. 72A to 72D, PMC structures that may be included in a PMC device according to very particular embodiments are shown in various side cross sectional views. Unlike the arrangement of FIGS. 70A to 70D, FIGS. 72A to 72D show structures that include an access device in addition to a PMC element. As noted previously, such access devices may enable PMC elements to be isolated from write voltages, thus reducing the possibility of "disturb" conditions.

FIG. 72A is a side cross sectional view of an arrangement in which a PMC element 7214 may be connected between metallization layers 7208 and 7202. An access device 7248 may connect one terminal (e.g., anode or cathode) of a PMC element 7214 to a first programming voltage/current source (VS1) while another terminal (e.g., cathode or anode) of a PMC element 7214 may be connected to a second programming voltage/current source (VS0). Access device 7248 may be enabled to thereby place PMC 7214 between VS1 and VS0, and thus alter its resistance to a desired value.

FIGS. 72B and 72C are side cross sectional view showing two possible contact structures. FIG. 72B shows one PMC element 7214' disposed between a substrate 7240 and a conductive pattern 7208'. In the very particular example shown, a PMC element 7214' may be connected to a substrate 7240 by a contact portion 7242'. Access device 7248 may connect PMC element 7214' to a different substrate portion 7250.

FIG. 72C also shows another PMC element 7214" disposed between a substrate 7240 and a second conductive pattern 7202' formed at a lower level than conductive pattern 7208'. PMC element 7214" may be connected to a substrate 7240 by a contact portion 7242. Access device 7248 may connect PMC element 7214" to a different substrate portion 7250.

In each of FIGS. 72B and 72C, an access device 7248 may be enabled to place PMC elements 7214' between VS1 and VS0 to thereby establish a conductivity of such elements.

FIG. 72D shows a PMC element 7214''' connected from first portion 7208 of a metallization layer to a second portion 7208" of the same metallization layer. An access device 7248 may be enabled to apply a first program voltage/current source to a first terminal of PMC element 7214'". In such an operation, a second program voltage/current source may be applied to PMC element 7214'" via first metallization portion 7208.

FIG. 72E shows an arrangement in which program voltage/current sources may be connected to a PMC element 7214 by two access devices. In the example shown, a first program voltage/current source VS1 may be applied to PMC element 7214 by access device 7248, while a second voltage/current source VS0 may be applied to PMC element by access device 7248' (through contact 7224 and metallization section 7208).

Referring to FIGS. 73A-P to 73E-E interconnect structures of a production device according to embodiments are shown in a series of side cross sectional views.

FIGS. 73A-P shows a structure corresponding to a resistive element (e.g., PMC 7214) programmed to a low resistance state. A via 7344 may be formed that can correspond to a PMC element 7214 of FIG. 72A, in a corresponding prototype device.

FIGS. 73A-E shows a structure corresponding to a resistive element (e.g., PMC 7214) programmed to a high resistance state. An electrical open may exist at a circuit position corresponding to PMC 7214 h of FIG. 72A.

FIGS. 73B-P shows a contact 7346 that may be formed that can correspond to a PMC element 7214' of FIG. 72B, in a corresponding prototype device, that is programmed to a low resistance state.

FIGS. 73B-E shows a structure that can correspond to a PMC 7214' of FIG. 72B being in a high resistance state.

FIGS. 73C-P shows a contact 7346' that may be formed that can correspond to a PMC element 7214" of FIG. 72C, in a corresponding prototype device, being programmed to a low resistance state.

FIGS. 73C-E shows a structure that can correspond to a PMC 7214" of FIG. 72C being in a high resistance state.

FIGS. 73D-P shows a metallization section 7350 that may be formed that can correspond to a PMC element 7214'" of FIG. 72D, in a corresponding prototype device, being programmed to a low resistance state.

FIGS. 73D-E shows a possible structure that can correspond to a PMC 7214'" of FIG. 72D being in a high resistance state.

It is noted that a prototype IC as noted above, may also serve as a production device. For example, it may be more cost effective to utilize programmable resistance based devices as production devices for lower volume products. Similarly, initial products may be made utilizing a programmable resistance based devices, but once volume is sufficient, production may be switched to a "hard" wired solution (i.e., vias/contacts in lieu of programmable elements).

Further, while the above embodiments have described arrangements that utilize PMC elements as programmable resistance elements, as noted above, alternate embodiments could utilize other programmable resistive elements. In such other embodiments, programmable resistive elements should have an "on" (low) impedance and off (high impedance) suitable for a given application. As but one example, an on resistance could 10-20 kohms, while an off resistance could be $10^9$ ohms, or possibly as low as $10^6$ ohms. However, acceptable resistance range may vary depending upon application.

Further, in applications where a programmable resistance element integrated circuit is utilized for a production device, such programmable elements should be designed and/or selected to provide a stable resistance (after being programmed) over a desired period when operating under the intended conditions. For example, in the case of PMC elements, normal operating signal currents and voltages (those arising when the device is used in an application) should be sufficiently low so as to avoid "soft" programming/erasing of the elements (resistance being inadvertently changed from the desired configuration state).

Embodiments may differ from conventional programmable devices, such as many field programmable gate arrays (FPGAs) in that no substrate area may be needed for memory (e.g., SRAM) storage of configuration data.

In addition, unlike many FPGAs, active devices (i.e., pass-gates) may not be needed for configurability.

Unlike conventional ASIC design approaches, no synthesis may be needed for a production device (assuming prototype is working). In addition, unlike conventional ASIC approaches that use changes in lithography inside fabrication lines, a customer does not need to wait for production run for first silicon. For example, a PMC prototype device may be "quasi" first silicon, as it may vary from a production device by as little as one mask.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, inventive aspects may lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
    a plurality of memory cells each having elements with at least one solid ion conductor programmable between at least two different impedance states for at least two different data retention times, the plurality of memory cells being dividable into a plurality of portions by configuration values corresponding to each portion, each portion being separately configurable for one of the data retention times; and
    configuration registers configured to store each configuration value, each configuration register including storage locations and a write path for receiving configuration values for storage.

2. The memory device of claim 1, further including:
    a plurality of nonvolatile storage structures, each nonvolatile storage structure storing a configuration value for a portion.

3. The memory device of claim 2, wherein:
the nonvolatile storage structures are selected from the group of: fusible links, anti-fuses, and nonvolatile memory cells.

4. The memory device of claim 1, wherein:
the memory cells further include a lockable portion having memory cells programmable to store the configuration values, the lockable portion being accessible under predetermined conditions not applied to the other of the memory cells.

5. The memory device of claim 1, wherein:
the configuration values comprise configuration address values.

6. The memory device of claim 5, further including:
a plurality of address range comparators that compare a received address to the configuration address values.

7. The memory device of claim 1, further including:
an input coupled to another device that receives at least one of the configuration values.

8. The memory device of claim 1, further including:
the plurality of memory cells are physically divided into sections, each section coupled to a corresponding write circuit, the write circuit being alterable to program the elements of its section to one of the data retention times.

9. The memory device of claim 8, wherein:
each write circuit is formed in a fabrication step to program its elements to one of the data retention times.

10. A memory device comprising:
a plurality of memory cells each having elements with at least one solid ion conductor programmable between at least two different impedance states for at least two different data retention times, the plurality of memory cells being dividable into a plurality of portions by configuration values corresponding to each portion, each portion being separately configurable for one of the data retention times; and
a plurality of write circuits coupled to the memory cells, each write circuit configured to select between the data retention times in response to at least one of a plurality of configuration values.

11. The memory device of claim 10, further including:
a plurality of read circuits coupled to the memory cells, each read circuit configured to select between different data determining threshold limits in response to at least one of the configuration values.

12. A memory device comprising:
a plurality of memory cells each having elements with at least one solid ion conductor programmable between at least two different impedance states for at least two different data retention times, the plurality of memory cells being dividable into a plurality of portions by configuration values corresponding to each portion, each portion being separately configurable for one of the data retention times; and
an address translator configured to translate a first range of logical addresses into physical addresses of a first portion programmed to a first data retention time and translate a second range of logical addresses into physical addresses of a second portion programmed to a second data retention time different from the first data retention time.

13. The memory device of claim 10, further including:
the memory cells are accessed by access circuits coupled to the memory cells, the access circuits being configurable for different access operations corresponding to the data retention time of the corresponding memory cells.

14. The memory device of claim 13, wherein:
configuring the access circuits for different access operations includes altering circuit features selected from: a read threshold voltage, a read threshold current, a write voltage, a write current, a write duration, and a read duration.

15. An integrated circuit method, comprising:
forming access circuits in an integrated circuit substrate, the access circuits configurable to program corresponding memory elements comprising a solid ion conductor between at least two different data retention times; and
configuring at least two access circuits to program their corresponding memory elements to one of the data retention times with configuration information stored by the integrated circuit by writing configuration information to configuration registers on the integrated circuit.

16. The method of claim 15, wherein:
configuring at least two access circuits further includes manufacturing steps selected from the group: setting the configuration information with a fabrication mask, opening fusible links, closing anti-fuse links.

17. The method of claim 15, wherein:
configuring at least two access circuits further includes accessing a lockable group of memory elements according to predetermined access steps, programming the memory elements of the lockable group to store the configuration information; wherein
the memory elements of the lockable group are not accessible by standard write operations.

18. The method of claim 15, wherein:
forming access circuits includes forming write circuits that impart different amounts of energy on corresponding memory elements according to the data retention time to be programmed.

19. The method of claim 15, wherein:
forming access circuits includes forming read circuits that vary a current or voltage threshold according to a data retention time of corresponding memory elements.

20. The method of claim 15, wherein:
configuring at least two access circuits includes receiving configuration values from a source external to the integrated circuit.

21. The method of claim 15, wherein:
configuring at least two access circuits includes altering circuit features selected from: a read threshold voltage, a read threshold current, a write voltage, a write current, a write duration, and a read duration.

22. A method, comprising:
writing data values to different portions of a memory array with a write energy that varies according to a configuration value for each portion, the memory array including elements comprising a solid state ion conductor; and
writing data values to different portions of a memory array includes selecting a write energy based on a comparison between a received address value and a configuration value.

23. The method of claim 22, wherein:
the received address value corresponds to a physical row address of the memory array.

24. The method of claim 22, wherein:
the received address value corresponds to a physical column address of the memory array.

25. The method of claim 22, further including:
reading data values from different portions of the memory array with a read threshold current or voltage that varies according to the configuration value for each portion.

26. The method of claim 22, wherein:
writing data values to different portions of a memory array includes translating received logical addresses to physical addresses according to the configuration values.

* * * * *